US008685837B2

(12) United States Patent
Mitani

(10) Patent No.: US 8,685,837 B2
(45) Date of Patent: Apr. 1, 2014

(54) TRANSFER METHOD, METHOD FOR MANUFACTURING SEMICONDUCTOR DEVICE, AND SEMICONDUCTOR DEVICE

(75) Inventor: Masahiro Mitani, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/575,158

(22) PCT Filed: Jan. 17, 2011

(86) PCT No.: PCT/JP2011/050659
§ 371 (c)(1),
(2), (4) Date: Jul. 25, 2012

(87) PCT Pub. No.: WO2011/096265
PCT Pub. Date: Aug. 11, 2011

(65) Prior Publication Data
US 2012/0299147 A1    Nov. 29, 2012

(30) Foreign Application Priority Data

Feb. 4, 2010 (JP) .................................. 2010-023225

(51) Int. Cl.
*H01L 21/30* (2006.01)
*H01L 21/46* (2006.01)
(52) U.S. Cl.
USPC ............. 438/458; 257/E21.567; 257/E27.112
(58) Field of Classification Search
USPC .................. 257/506, 622, 783, E21.599, 623, 257/E21.567, E27.112; 438/113, 455–459
See application file for complete search history.

(56) References Cited

U.S. PATENT DOCUMENTS

| 6,184,109 | B1 * | 2/2001 | Sasaki et al. .................. 438/464 |
| 6,337,258 | B1 * | 1/2002 | Nakayoshi et al. ........... 438/464 |
| 6,506,664 | B1 | 1/2003 | Beyne et al. |
| 6,559,905 | B1 | 5/2003 | Akiyama |
| 2002/0037631 | A1 * | 3/2002 | Mimata ........................ 438/460 |
| 2002/0064032 | A1 | 5/2002 | Oohata |
| 2003/0060034 | A1 | 3/2003 | Beyne et al. |
| 2003/0073264 | A1 * | 4/2003 | Meguro et al. ................ 438/113 |
| 2003/0094619 | A1 | 5/2003 | Akiyama |
| 2003/0162463 | A1 | 8/2003 | Hayashi et al. |
| 2003/0207545 | A1 * | 11/2003 | Yasukawa ..................... 438/459 |
| 2003/0227584 | A1 | 12/2003 | Onozuka et al. |
| 2004/0061176 | A1 * | 4/2004 | Takafuji et al. ............... 257/347 |
| 2004/0201789 | A1 | 10/2004 | Akiyama |

(Continued)

FOREIGN PATENT DOCUMENTS

| JP | 11-142878 A | 5/1999 |
| JP | 2001-7340 A | 1/2001 |

(Continued)

OTHER PUBLICATIONS

Official Communication issued in International Patent Application No. PCT/JP2011/050659, mailed on Mar. 22, 2011.

*Primary Examiner* — David S Blum
(74) *Attorney, Agent, or Firm* — Keating & Bennett, LLP

(57) ABSTRACT

After depressed portions (4) have been formed in advance in that surface of a Si substrate (1) on which Si single films (8) are to be formed, that surface of the Si substrate (1) on which the Si single films are to be formed and an intermediate substrate (5) are bonded together, and elements are separated from each other by grinding the Si substrate (1) from the bottom wall side of the depressed portions (4).

18 Claims, 33 Drawing Sheets

(56) References Cited

U.S. PATENT DOCUMENTS

| | | | |
|---|---|---|---|
| 2005/0155699 A1 | 7/2005 | Hayashi et al. | |
| 2005/0158895 A1 | 7/2005 | Hayashi et al. | |
| 2005/0158896 A1 | 7/2005 | Hayashi et al. | |
| 2005/0158904 A1 | 7/2005 | Hayashi et al. | |
| 2005/0167665 A1* | 8/2005 | Onozuka et al. | 257/66 |
| 2005/0167666 A1 | 8/2005 | Onozuka et al. | |
| 2006/0035421 A1* | 2/2006 | Hasegawa | 438/155 |
| 2006/0055864 A1 | 3/2006 | Matsumura et al. | |
| 2006/0091398 A1* | 5/2006 | Yamaguchi et al. | 257/72 |
| 2006/0197260 A1* | 9/2006 | Yoshikawa et al. | 264/482 |
| 2006/0273319 A1 | 12/2006 | Dairiki et al. | |
| 2007/0048891 A1 | 3/2007 | Hayashi et al. | |
| 2007/0202639 A1* | 8/2007 | Chidambarrao et al. | 438/164 |
| 2009/0008748 A1* | 1/2009 | Mancini et al. | 257/622 |
| 2009/0111218 A1* | 4/2009 | Takyu et al. | 438/109 |
| 2010/0099221 A1* | 4/2010 | Nakamura | 438/109 |
| 2010/0112755 A1* | 5/2010 | Kurosawa et al. | 438/109 |
| 2010/0244136 A1 | 9/2010 | Takafuji et al. | |
| 2011/0062457 A1 | 3/2011 | Naito et al. | |
| 2011/0136296 A1* | 6/2011 | Koo et al. | 438/106 |
| 2011/0244656 A1 | 10/2011 | Dairiki et al. | |

FOREIGN PATENT DOCUMENTS

| | | |
|---|---|---|
| JP | 2001-015683 A | 1/2001 |
| JP | 2002-118124 A | 4/2002 |
| JP | 2002-314052 A | 10/2002 |
| JP | 2003-203886 A | 7/2003 |
| JP | 2003-289136 A | 10/2003 |
| JP | 2004-031669 A | 1/2004 |
| JP | 2004-219964 A | 8/2004 |
| JP | 2006-032435 A | 2/2006 |
| JP | 2006-053171 A | 2/2006 |
| JP | 2007-013131 A | 1/2007 |
| JP | 2008-091612 A | 4/2008 |
| JP | 2011-66056 A | 3/2011 |
| WO | 2009/084312 A1 | 7/2009 |

* cited by examiner

TRANSFER METHOD, METHOD FOR MANUFACTURING SEMICONDUCTOR DEVICE, AND SEMICONDUCTOR DEVICE

TECHNICAL FIELD

The present invention relates to a transfer method for transferring semiconductor elements such as single-crystal silicon from a semiconductor substrate to a final substrate on which the semiconductor elements are to be finally mounted, a method for manufacturing a semiconductor apparatus by using such a transfer method, and a semiconductor apparatus.

BACKGROUND ART

In recent years, displays for computers, television apparatuses, etc. have been growing in size and, at the same time, have been required to be manufactured with superhigh performance at low cost.

For manufacturing of displays with superhigh performance at low cost, it is necessary to achieve both TFTs (thin-film transistors) comparable in performance to single-crystal silicon (the word "silicon" being hereinafter abbreviated as "Si") and a reduction in manufacturing cost.

However, conventional TFT processes, such as a-Si (amorphous silicon) process and a poly-Si (polycrystalline silicon) process, are unable to give a TFT (thin-film transistor) with desired performance and, what is even worse, require giant vacuum equipment, a laser crystallization apparatus, an exposure machine, etc., thus making it difficult to even reduce manufacturing cost.

For example, (a) and (b) of FIG. 31 show a case where circuit elements such as pixels are formed on a larger-area glass substrate through an existing large-size liquid-crystal TFT process (such as the a-Si process or the poly-Si process). According to this method, as shown in (a) of FIG. 31, a Si film 202 such as an a-Si film is formed on a glass substrate 201. Further, in the case of the poly-Si process, the Si film 202 is crystallized by laser irradiation. Next, a photolithographic method is used so that as shown in (b) of FIG. 31, the Si film 202 forms into semiconductor elements at a predetermined pixel pitch.

However, this method makes it necessary to form the Si film 202 on the entire surface of the glass substrate 201 or to crystallize the entire surface of the glass substrate 201 by using a laser crystallization apparatus. Therefore, along with the increase in size of glass substrates (10th-generation size: 3.1 m×2.9 m), this method requires expensive apparatuses such as giant vacuum equipment and a laser crystallization apparatus, thus requiring huge initial investments.

Further, due to a localized level within a gap due to incompleteness of crystallinity and a defect or intra-gap localized level in the vicinity of a crystal grain boundary, a decrease in electron (or hole) mobility and an increase in S coefficient (subthreshold coefficient) occur. For this reason, there is a great deal of variation in performance among TFTs, and the resulting TFTs require a measurable amount of power.

In view of this, a method for manufacturing a high-performance, low-cost display by fabricating a plurality of elements on a small-area substrate and transferring the elements onto a large-area glass substrate so that the elements are dispersedly arranged in an array was devised.

(a) and (b) of FIG. 32 and (a) to (d) of FIG. 33 each show a method for transferring semiconductor elements onto a large-area glass substrate.

According to the method shown in (a) and (b) of FIG. 32, first, as shown in (a) of FIG. 32, semiconductor elements 205, such as Si devices or circuit elements, fabricated on a small-area Si substrate 204 through an existing IC (integrated circuit) process are diced (divided) into separate semiconductor elements 205 to form chips having their respective semiconductor elements 205. Next, as shown in (b) of FIG. 32, the chips 206 are dispersedly transferred or bonded to a large-area glass substrate 207 or the like.

The transfer is carried out by using the so-called Smart-Cut (registered trademark) method, which involves the use of hydrogen ion implantation and heat treatment, for example. Alternatively, the bonding is carried out, for example, by using die bonding.

The technique in the example shown in (a) and (b) of FIG. 32 which involves the use of the Smart-Cut method for the transfer is described, for example, in Patent Literatures 1, 2, etc. below of the inventions made by the inventor of the present application and other people.

The foregoing method is an effective method in such a case of a driver of a panel or the like where the semiconductor elements are divided into several tens to several hundreds of chips (several millimeters in size) and the chips are bonded. However, in such a case of pixel TFTs where the semiconductor elements are divided into several millions of chips (several tens of millimeters in size) and the chips are bonded, the foregoing method is unrealistic in terms of both throughput and handling.

According to the methods shown in (a) and (b) of FIG. 33 and in (c) and (d) of FIG. 33, the Smart-Cut method is used for the transfer as in the case of the method shown in (a) and (b) of FIG. 32. However, according the methods shown in (a) to (d) of FIG. 33, semiconductor elements 210 fabricated on a Si substrate 209 are bonded to a large-area glass substrate 208 without being divided into chips.

For this reason, the methods shown in (a) to (d) of FIG. 33 eliminate the need to divide the Si substrate 209 provided with the semiconductor elements 210 into a large number of chips. However, since it is necessary to separate the semiconductor elements 210 by heat treatment after having bonded the semiconductor elements 210 to the large-area glass substrate 208, all of the semiconductor elements 210 on the Si substrate 290 are inevitably transferred onto the large-area glass substrate 208.

Therefore, in such a case as that shown in (a) and (b) of FIG. 33 where the number of semiconductor elements 210 to be formed on the Si substrate 209 is large (i.e., the pitch at which the semiconductor elements 210 are to be formed is narrow), the semiconductor elements 210 cannot be transferred onto the large-area glass substrate 208 at such wide intervals such as the pixel pitch.

For the transfer of the semiconductor elements 210 at wide intervals, the semiconductor elements 210 needs to be formed on the Si substrate 209 at wide intervals corresponding to the pixel pitch, as shown in (c) and (d) of FIG. 33. In this case, however, the number of semiconductor elements 210 that can be transferred from a single Si substrate 209 is so small that the efficiency in the use of the Si substrate 209 is very low.

Further, as mentioned above, in the case of use of the Smart-Cut method for the transfer, the whole Si substrate is inevitably heated. This makes it difficult to selectively transfer only the semiconductor elements that need to be transferred.

In response to such problems as those described above, Patent Literature 3 below discloses a method for forming a plurality of semiconductor elements at small intervals on a Si substrate and then transferring the semiconductor elements onto a large-area final substrate by selectively dispersing the semiconductor elements without dividing the semiconductor elements into chips.

The transfer method described in Patent Literature 3 is described below with reference to (a) to (h) of FIG. 34.

According the method described in Patent Literature 3, first, as shown in (a) of FIG. 34, semiconductor elements 222, such as Si devices or circuit elements, are formed on a surface of a Si substrate 221.

Next, as shown in (b) of FIG. 34, that surface of the Si substrate 221 on which the semiconductor elements have been formed is bonded to a holding substrate 223 with a first adhesive tape 224 (first transfer), and after that, the back surface of the Si substrate 221 (surface opposite to the surface on which the semiconductor elements have been formed) is ground by a grinder 225 or the like so that the Si substrate 221 turns into a thin film.

Next, as shown in (c) of FIG. 34, the back surface of the Si substrate 221 is joined to a pickup substrate 226 with a second adhesive tape 227, and the first adhesive tape 224 and the holding substrate 223 are separated from each other by heating the first adhesive tape 224 via the holding substrate 223. Thus, as shown in (d) of FIG. 34, the Si substrate 221 is transferred from the holding substrate 223 to the pickup substrate 226 (second transfer).

After that, as shown in (e) of FIG. 34, a resist pattern 228 in a predetermined shape is formed on the Si substrate 221, and with the resist pattern 228 used as a mask, the Si substrate 221 is cut into separate semiconductor elements 222 in a matrix manner by sandblasting or the like.

Next, as shown in (f) of FIG. 34, of the plurality of semiconductor elements 222 separated from each other in the matrix manner, only necessary semiconductor elements 222 are selectively sucked by a vacuum chuck 229 having an array of sucking holes at the same intervals as the pixel pitch (third transfer).

After that, as shown in (g) of FIG. 34, the semiconductor elements 222 sucked by the vacuum chuck 229 are transferred onto a large-area final substrate 231 formed with a thermoplastic resin film 230, in such a way as to be buried in the thermoplastic resin film 230 (fourth transfer).

Thus, as shown in (h) of FIG. 34, some of the plurality of semiconductor elements 222 are transferred to the large-area final substrate 231.

CITATION LIST

Patent Literature 1
Japanese Patent Application Publication, Tokukai, No. 2006-032435 (Publication Date: Feb. 2, 2006)
Patent Literature 2
Japanese Patent Application Publication, Tokukai, No. 2006-053171 (Publication Date: Feb. 23, 2006)
Patent Literature 3
Japanese Patent Application Publication, Tokukai, No. 2004-219964 (Publication Date: Aug. 5, 2004)
Patent Literature 4
Japanese Patent Application Publication, Tokukai, No. 2001-7340 (Publication Date: Jan. 12, 2001)
Patent Literature 5
Japanese Patent Application Publication, Tokukai, No. 2002-314052 (Publication Date: Oct. 25, 2002)
Patent Literature 6
Japanese Patent Application Publication, Tokukai, No. 2003-289136 (Publication Date: Oct. 10, 2003)
Patent Literature 7
Japanese Patent Application Publication, Tokukai, No. 2002-118124 (Publication Date: Apr. 19, 2002)
Patent Literature 8
Japanese Patent Application Publication, Tokukaihei, No. 11-142878 (Publication Date: May 28, 1999)

SUMMARY OF INVENTION

Technical Problem

However, the technique described in Patent Literature 3 has the following problems.

First, since substantially four transfers are required by the time the plurality of semiconductor elements 222 have been selectively transferred from the Si substrate 221 to the large-area final substrate 231, poor throughput and low productively result.

Further, the repetition of transfers causes displacements to be integrated, thus making it difficult to bond the semiconductor elements 222 to the large-area final substrate 231 with a high degree of accuracy. Especially, since, in the fourth transfer to the final substrate, the semiconductor elements 222 are pressed onto the thermoplastic resin film 230, which is soft, in such a way as to be buried in the thermoplastic resin film 230, the semiconductor elements 222 are so easily movable that the transfer causes displacements to occur, with the result that the accuracy with which the semiconductor elements 222 are transferred is further reduced.

A reason for the occurrence of such displacements is that since the thermoplastic resin film 230 per se is soft to a certain degree, the way in which pressure is relieved when the semiconductor elements 222 are buried becomes uneven, with the result that the force is relieved in a direction in which it can be easily relieved.

It should be noted that such a reduction in the accuracy with which the semiconductor elements 222 are transferred causes great shifts in alignment when the semiconductor elements 222 and wires are connected in a subsequent wiring step, so that poor connection tends to take place. However, setting a large layout margin for a contact section between the semiconductor elements 222 and the wires in an attempt to prevent poor connection causes a decrease in aperture ratio and therefore is not preferable.

Further, also when the pickup (suction) is carried out by vacuum contact in the third transfer, variation in film thickness among the semiconductor elements 222 leaves gaps between some of the semiconductor elements 222 and the vacuum chuck 229 so that the semiconductor elements 222 are not successfully sucked or, even if they are sucked, the semiconductor elements 222 are rotated or displaced. That is, leakage of vacuum contact causes the semiconductor elements 222 to be sucked with displacements.

Further, since, when the semiconductor elements 222 are buried in the thermoplastic resin film 230 in the fourth transfer, those portions of the thermoplastic resin film 230 around the semiconductor elements 222 are pushed aside, the areas around the semiconductor elements 22 thus buried (edge portions) rise in the form of mountains to form protruding portions 241 as shown in (h) of FIG. 34. For this reason, in a case where the technique is applied to a liquid crystal panel, for example, the protruding portions 241 causes a disturbance in the alignment of liquid crystals, thus degrading display quality.

It should be noted that a reason why the areas around the semiconductor elements 222 rise in the form of mountains is that since the thermoplastic resin film 230 has a certain degree of high viscosity, the thermoplastic resin film 230, which has a high viscosity, is pushed aside in such a way as to rise in the form of mountains in the areas around the semiconductor elements 222.

Although each of Patent Literatures 4 to 8 discloses a method for transferring elements formed on a base substrate from the base substrate to a final substrate with two or three transfers, each of Patent Literatures 4 to 7 uses an insulating substrate such as a glass substrate or a sapphire substrate as a base substrate, forms elements on the base substrate, transfers the elements to an intermediate substrate, and further transfers the elements to a final substrate on which an adhesive has been formed.

Since the elements are formed on the insulating substrate, those films (elements) which can be formed on the insulating substrate are limited to a-Si films and poly-Si films. For this reason, none of Patent Literatures 4 to 7 transfers semiconductor elements fabricated into a single-crystal Si substrate. Therefore, none of Patent Literatures 4 to 7 can be applied to the transfer of such semiconductor elements.

Patent Literature 8 forms a Si oxidized film on a Si substrate, forms elements with element-separating grooves therebetween through a publicly-known element-forming process, sticks the elements to a glass substrate, removes the Si substrate by etching, separates the elements into individual elements by etching the Si oxidized film in the parts corresponding to the element-separating grooves, and then transfers the elements to the glass substrate with use of an adhesive resin.

Since the elements are formed on the Si oxidized film, those films (elements) which can be formed on the Si oxidized film are limited to a-Si films and poly-Si films. For this reason, Patent Literature 8 cannot transfer semiconductor thin films such as single-crystal Si films or semiconductor devices using such semiconductor thin films, either.

Therefore, only Patent Literature 3 allows single-crystal Si to be dispersedly arranged. In this case, however, the number of transfers required is four.

The present invention has been made in view of the foregoing problems, and it is an object of the present invention to provide (i) a semiconductor element transfer method that makes it possible to transfer semiconductor elements, such as single-crystal Si or semiconductor devices containing single-crystal Si, fabricated into a semiconductor substrate and to separate the elements with a single transfer, (ii) a method for manufacturing a semiconductor apparatus with a high degree of transfer accuracy by using such a transfer method, and (iii) a high-performance semiconductor apparatus.

Solution to Problem

In order to solve the foregoing problems, a method for transferring semiconductor elements is a method including: a depressed portion forming step of forming depressed portions in that surface of a semiconductor substrate on which the semiconductor elements are to be formed, and forming, on the semiconductor substrate, a plurality of island-shaped element sections, separated by the depressed portions, each of which includes at least one of the semiconductor elements; an intermediate transfer substrate bonding step of bonding together that surface of the semiconductor substrate on which the semiconductor elements are to be formed and an intermediate transfer substrate via an adhesive material layer whose adhesive force is decreased by external energy; an element-separating step of, by grinding the semiconductor substrate from a bottom wall side of the depressed portions, separating the element sections from each other, the element sections having been connected together by bottom walls of the depressed portions; a final transfer substrate joining step of joining, to a final transfer substrate, only some of the plurality of element sections adhering to the intermediate transfer substrate; and a final transfer step of, by decreasing the adhesive force of the adhesive material layer by selectively applying external energy to the adhesive material layer between the some of the element sections which have been joined to the final transfer substrate and the intermediate transfer substrate, selectively transferring the some of the element sections from the intermediate transfer substrate to the final transfer substrate.

According to the foregoing method, by forming depressed portions in advance in that surface of a semiconductor substrate on which the semiconductor elements are to be formed, bonding together that surface of the semiconductor substrate on which the semiconductor elements are to be formed and an intermediate transfer substrate, and then grinding the semiconductor substrate from a bottom wall side of the depressed portions, the semiconductor elements fabricated into the semiconductor substrate, such as single-crystal silicon thin films or semiconductor devices including single-crystal silicon thin films, can be transferred; moreover, the elements can be separated with one transfer. For this reason, according to the foregoing method, the elements can be separated without an increase in the number of transfers, and the element sections including the semiconductor elements can be transferred from the semiconductor substrate to the final transfer substrate with two transfers.

Conventionally, in the case of transfer of semiconductor elements such as single-crystal silicon thin films or semiconductor devices made of single-crystal silicon fabricated into a single-crystal silicon substrate, four transfers have been required as in the case of Patent Literature 3. Therefore, the foregoing method can make the number of transfers smaller than the conventional method does in transferring, to the final transfer substrate, semiconductor elements such as single-crystal silicon thin films or semiconductor devices made of single-crystal silicon fabricated into a single-crystal silicon substrate.

Further, a reduction in the number of transfers makes it possible to prevent displacements from being caused by repetition of transfers. Moreover, only the element sections that need to be transferred can be selectively transferred to the final transfer substrate without using vacuum contact by vacuum equipment. Therefore, the element sections can be transferred with a high degree of positioning accuracy without fear of leakage of vacuum contact or of rotation or displacement during vacuum contact.

Further, according to the foregoing method, only the element sections that need to be transferred to the final transfer substrate can be selectively transferred dispersedly to the final transfer substrate. Therefore, the element sections can be transferred to the final transfer substrate at a desired pitch, and the efficiency in the use of the semiconductor substrate can be improved. Therefore, the foregoing method can increase throughput and transfer accuracy.

Further, since the forgoing method can improve the efficiency in the use of the semiconductor substrate and make the number of transfers smaller than the conventional method does, the foregoing method can reduce the cost of manufacturing. Further, since the foregoing method does not require a special apparatus or expensive facilities, the foregoing method can hold down the cost of initial investment.

Therefore, the foregoing method realizes high-accuracy transfer with few displacements, and can achieve an improvement in yield and a reduction in cost due to shortening of the manufacturing process. Further, this also makes it possible to improve the processing capability (takt time) of the manufacturing process.

Further, use of the transfer method makes it possible to manufacture a high-performance semiconductor apparatus using semiconductor elements such as single-crystal silicon thin films or semiconductor devices made of single-crystal silicon fabricated into a single-crystal silicon substrate.

Further, in order to solve the foregoing problems, a method for transferring semiconductor elements is a method including: a depressed portion forming step of forming depressed portions in that surface of a semiconductor substrate on which the semiconductor elements are to be formed, and forming, on the semiconductor substrate, a plurality of element sections, separated by the depressed portions, each of which includes at least one of the semiconductor elements; a first intermediate transfer substrate bonding step of bonding together that surface of the semiconductor substrate on which the semiconductor elements are to be formed and a first intermediate transfer substrate via an adhesive material layer whose adhesive force is decreased by external energy; an element-separating step of, by grinding the semiconductor substrate from a bottom wall side of the depressed portions, separating the element sections from each other, the element sections having been connected together by bottom walls of the depressed portions; a second intermediate transfer substrate bonding step of bonding the plurality of element sections adhering to the first intermediate transfer substrate to a second intermediate transfer substrate via an adhesive material layer whose adhesive force is decreased by external energy; an intermediate transfer step of, by decreasing the adhesive force of the adhesive material layer by applying external energy to the adhesive material layer between the plurality of element sections and the first intermediate transfer substrate, transferring the plurality of element sections from the first intermediate transfer substrate to the second intermediate transfer substrate; a final transfer substrate joining step of joining, to a final transfer substrate, only some of the plurality of element sections adhering to the second intermediate transfer substrate; and a final transfer step of, by decreasing the adhesive force of the adhesive material layer by selectively applying external energy to the adhesive material layer between the some of the element sections which have been joined to the final transfer substrate and the second intermediate transfer substrate, selectively transferring the some of the element sections from the second intermediate transfer substrate to the final transfer substrate.

According to the foregoing method, too, by forming depressed portions in advance in that surface of a semiconductor substrate on which the semiconductor elements are to be formed, bonding together that surface of the semiconductor substrate on which the semiconductor elements are to be formed and an intermediate transfer substrate, and then grinding the semiconductor substrate from a bottom wall side of the depressed portions, the semiconductor elements, such as single-crystal silicon thin films or semiconductor devices made of single-crystal silicon fabricated into a single-crystal silicon substrate, can be transferred; moreover, the elements can be separated with one transfer. For this reason, according to the foregoing method, too, the elements can be separated without an increase in the number of transfers.

It should be noted that in this case, the element sections including the semiconductor elements can be transferred from the semiconductor substrate to the final transfer substrate with three transfers. For this reason, the foregoing method, too, can make the number of transfers smaller than does the conventional method for transferring semiconductor elements such as single-crystal silicon thin films or semiconductor devices made of single-crystal silicon fabricated into a single-crystal silicon substrate.

Further, a reduction in the number of transfers makes it possible to prevent displacements from being caused by repetition of transfers. Moreover, only the element sections that need to be transferred can be selectively transferred to the final transfer substrate without using vacuum contact by vacuum equipment. Therefore, the element sections can be transferred with a high degree of positioning accuracy without fear of leakage of vacuum contact or of rotation or displacement during vacuum contact.

Further, according to the foregoing method, as mentioned above, the element sections are transferred from the semiconductor substrate to the final transfer substrate with three transfers. Therefore, the semiconductor elements in the element sections formed on the semiconductor substrate can be transferred to the final transfer substrate in an upside-down state of the state in which the semiconductor elements are formed on the semiconductor substrate. Such an upside-down configuration makes it possible to reduce the film thickness of the interlayer insulating film at the time of formation of contact after the formation of the interlayer insulating film on a large glass board. Therefore, the distance between the transfer film and the source and drain electrodes can be shortened. This makes it unnecessary to carry out deep dry etching, makes it easy to make contact holes, and makes it possible to achieve an increase in yield.

Furthermore, according to the foregoing method, too, only the element sections that need to be transferred to the final transfer substrate can be selectively transferred dispersedly to the final transfer substrate. Therefore, the element sections can be transferred to the final transfer substrate at a desired pitch, and the efficiency in the use of the semiconductor substrate can be improved. Therefore, the foregoing method can increase throughput and transfer accuracy.

Further, since the forgoing method, too, can improve the efficiency in the use of the semiconductor substrate and make the number of transfers smaller than the conventional method does, the foregoing method can reduce the cost of manufacturing. Further, since the foregoing method does not require a special apparatus or expensive facilities, the foregoing method can hold down the cost of initial investment.

Therefore, the foregoing method realizes high-accuracy transfer with few displacements, and can achieve an improvement in yield and a reduction in cost due to shortening of the manufacturing process. Further, this makes it possible to improve the processing capability (takt time) of the manufacturing process.

Further, use of the transfer method makes it possible to manufacture a high-performance semiconductor apparatus using semiconductor elements such as single-crystal silicon thin films or semiconductor devices made of single-crystal silicon fabricated into a single-crystal silicon substrate.

Further, in order to solve the foregoing problems, a method for transferring semiconductor elements is a method including: a depressed portion forming step of forming depressed portions in that surface of a semiconductor substrate on which the semiconductor elements are to be formed, and forming, on the semiconductor substrate, a plurality of element sections, separated by the depressed portions, each of which includes at least one of the semiconductor elements; a first intermediate transfer substrate bonding step of bonding together that surface of the semiconductor substrate on which the semiconductor elements are to be formed and a first intermediate transfer substrate via an adhesive material layer whose adhesive force is decreased by external energy; an element-separating step of, by grinding the semiconductor substrate from a bottom wall side of the depressed portions, separating the element sections from each other, the element sections having been connected together by bottom walls of the depressed portions; a second intermediate transfer substrate bonding step of bonding only some of the plurality of element sections adhering to the first intermediate transfer substrate to a second intermediate transfer substrate via an adhesive material layer whose adhesive force is decreased by external energy; an intermediate transfer step of, by decreasing the adhesive force of the adhesive material layer by selectively applying external energy to the adhesive material layer between the some of the element sections and the first intermediate transfer substrate, selectively transferring the some of the element sections from the first intermediate transfer substrate to the second intermediate transfer substrate; a final transfer substrate joining step of joining, to a final transfer substrate, the some of the element sections adhering to the second intermediate transfer substrate; and a final transfer step of, by decreasing the adhesive force of the adhesive material layer by applying external energy to the adhesive material layer between the some of the element sections which have been joined to the final transfer substrate and the second intermediate transfer substrate, transferring the some of the element sections from the second intermediate transfer substrate to the final transfer substrate.

According to the foregoing method, too, by forming depressed portions in advance in that surface of a semiconductor substrate on which the semiconductor elements are to be formed, bonding together that surface of the semiconductor substrate on which the semiconductor elements are to be formed and an intermediate transfer substrate, and then grinding the semiconductor substrate from a bottom wall side of the depressed portions, the semiconductor elements, such as single-crystal silicon thin films or semiconductor devices made of single-crystal silicon fabricated into a single-crystal silicon substrate, can be transferred; moreover, the elements can be separated with one transfer. For this reason, according to the foregoing method, too, the elements can be separated without an increase in the number of transfers.

It should be noted that in this case, the element sections including the semiconductor elements can be transferred from the semiconductor substrate to the final transfer substrate with three transfers. For this reason, the foregoing method, too, can make the number of transfers smaller than does the conventional method for transferring semiconductor elements such as single-crystal silicon thin films or semiconductor devices made of single-crystal silicon fabricated into a single-crystal silicon substrate.

Further, a reduction in the number of transfers makes it possible to prevent displacements from being caused by repetition of transfers. Moreover, only the element sections that need to be transferred can be selectively transferred to the final transfer substrate without using vacuum contact by vacuum equipment. Therefore, the element sections can be transferred with a high degree of positioning accuracy without fear of leakage of vacuum contact or of rotation or displacement during vacuum contact.

Further, according to the foregoing method, as mentioned above, the element sections are transferred from the semiconductor substrate to the final transfer substrate with three transfers. Therefore, the semiconductor elements in the element sections formed on the semiconductor substrate can be transferred to the final transfer substrate in an upside-down state of the state in which the semiconductor elements are formed on the semiconductor substrate.

Moreover, according to the foregoing method, the some of the element sections can be selectively transferred to the second intermediate transfer substrate when the element sections are transferred from the first intermediate transfer substrate to the second intermediate transfer substrate. For this reason, it is possible to provide the depressed portions in the final transfer substrate and join the element sections into the depressed portions. This makes it possible to uniform the height of the surface of the final transfer substrate and the height of the back surface of each of the element sections joined into the depressed portions. Therefore, a flat TFT-side substrate free of bumps can be fabricated. Further, there does not occur a prominence of a soft resin due to the burial of semiconductor elements in the resin as would have conventionally occurred. Therefore, a disturbance in the alignment of liquid crystals due to bumps or irregularities can be alleviated. As a result, a high-contrast and high-quality liquid crystal panel with little light leakage can be obtained. Alternatively, according to foregoing method, it is possible to use a flat final transfer substrate instead of providing raised portions on or depressed portions in the final transfer substrate. This makes it possible to increase the degree of freedom of selection of the final transfer substrate and the degree of freedom of wiring layout or the like.

Furthermore, according to the foregoing method, too, only the element sections that need to be transferred to the final transfer substrate can be selectively transferred dispersedly to the final transfer substrate. Therefore, the element sections can be transferred to the final transfer substrate at a desired pitch, and the efficiency in the use of the semiconductor substrate can be improved. Therefore, the foregoing method can increase throughput and transfer accuracy.

Further, since the forgoing method, too, can improve the efficiency in the use of the semiconductor substrate and make the number of transfers smaller than the conventional method does, the foregoing method can reduce the cost of manufacturing. Further, since the foregoing method does not require a special apparatus or expensive facilities, the foregoing method can hold down the cost of initial investment.

Therefore, the foregoing method realizes high-accuracy transfer with few displacements, and can achieve an improvement in yield and a reduction in cost due to shortening of the manufacturing process. Further, this makes it possible to improve the processing capability (takt time) of the manufacturing process.

Further, use of the transfer method makes it possible to manufacture a high-performance semiconductor apparatus using semiconductor elements such as single-crystal silicon thin films or semiconductor devices made of single-crystal silicon fabricated into a single-crystal silicon substrate.

Further, in order to solve the foregoing problems, a method for transferring semiconductor elements is a method including: a depressed portion forming step of forming depressed portions in that surface of a first substrate on which the semiconductor elements are to be formed, and forming, on the first substrate, a plurality of island-shaped element sections, separated by the depressed portions, each of which includes at least one of the semiconductor elements, the first substrate being a semiconductor substrate; a substrate bonding step of bonding together that surface of the first substrate on which the semiconductor elements are to be formed and a second substrate; and an element-separating step of, by grinding the first substrate from a bottom wall side of the depressed portions, separating the element sections from each other, the element sections having been connected together by bottom walls of the depressed portions.

According to the foregoing method, by forming depressed portions in advance in that surface of a first substrate, which is a semiconductor substrate, on which the semiconductor elements are to be formed, bonding together that surface of the first substrate on which the semiconductor elements are to be formed and a second substrate, and then grinding the first substrate from a bottom wall side of the depressed portions, the semiconductor elements, such as single-crystal silicon thin films or semiconductor devices made of single-crystal silicon fabricated into a single-crystal silicon substrate, can be transferred; moreover, the elements can be separated with one transfer. For this reason, according to the foregoing method, the elements can be separated without an increase in the number of transfers. This makes it possible to make the number of transfers smaller than in the conventional case.

Further, use of the foregoing method makes it possible to reduce the number of transfers, thus making it possible to prevent displacements from being caused by repetition of transfers. Therefore, use of the foregoing method makes it possible to improve transfer accuracy and, also, to reduce manufacturing cost.

Therefore, the foregoing method realizes high-accuracy transfer with few displacements, and can achieve an improvement in yield and a reduction in cost due to shortening of the manufacturing process. Further, this also makes it possible to improve the processing capability (takt time) of the manufacturing process.

Further, use of the transfer method makes it possible to manufacture a high-performance semiconductor apparatus using semiconductor elements such as single-crystal silicon thin films or semiconductor devices made of single-crystal silicon fabricated into a single-crystal silicon substrate.

Therefore, the foregoing method makes it possible to transfer semiconductor elements such as single-crystal silicon thin films or semiconductor devices made of single-crystal silicon fabricated into a single-crystal silicon substrate, and to separate the elements from each other with one transfer, thus making it possible to provide a transfer method that is higher in throughput and transfer accuracy than a conventional one.

Further, in order to solve the foregoing problems, a method for manufacturing a semiconductor apparatus is a method for manufacturing a semiconductor apparatus by using the method for transferring semiconductor elements.

Use of the method for transferring semiconductor elements can bring about the aforementioned effects. Therefore, the foregoing method can provide a semiconductor apparatus manufacturing method capable of manufacturing a high-performance semiconductor apparatus with few displacements of semiconductor elements.

Therefore, the foregoing method realizes high-accuracy transfer, and can achieve an improvement in yield and a reduction in cost due to shortening of the manufacturing process. Further, this also makes it possible to improve the processing capability (takt time) of the manufacturing process.

Further, in order to solve the foregoing problems, a semiconductor apparatus is configured to include: an insulating substrate; depressed portions; and island patterns formed on the insulating substrate and separated by the depressed portions, the island patterns each having a semiconductor device or a single-crystal silicon thin film joined thereonto by chemical bonding, the semiconductor device including a single-crystal silicon thin film.

Further, in order to solve the foregoing problems, a semiconductor apparatus is configured to include: an insulating substrate; and depressed portions formed in the insulating substrate, the depressed portions each having a semiconductor device or a single-crystal silicon thin film joined thereto by chemical bonding, the semiconductor device including a single-crystal silicon thin film.

Each of the configurations described above makes it possible to manufacture a high-performance semiconductor apparatus using semiconductor elements such as single-crystal silicon thin films or semiconductor devices made of single-crystal silicon fabricated into a single-crystal silicon substrate.

Further, in each of the semiconductor apparatuses described above, the single-crystal silicon thin films or the semiconductor devices including single-crystal silicon thin films are joined to the insulating substrate by chemical bonding without use of an adhesive material layer. Therefore, no displacements occur. This makes it possible to provide a semiconductor apparatus in which the single-crystal silicon thin films or the semiconductor devices including single-crystal silicon thin films are joined tightly to the insulating substrate.

Advantageous Effects of Invention

As described above, by forming depressed portions in advance in that surface of a semiconductor substrate on which the semiconductor elements are to be formed, bonding together that surface of the semiconductor substrate on which the semiconductor elements are to be formed and an intermediate transfer substrate, and then grinding the semiconductor substrate from a bottom wall side of the depressed portions, the semiconductor elements, such as single-crystal silicon films or semiconductor devices made of single-crystal silicon fabricated into a single-crystal silicon substrate, can be transferred; moreover, the elements can be separated with one transfer. For this reason, according to each of the methods described above, the elements can be separated without an increase in the number of transfers, and the element sections including the semiconductor elements can be transferred from the semiconductor substrate to the final transfer substrate with two transfers. This makes it possible to make the number of transfers smaller than in the conventional case.

Further, a reduction in the number of transfers makes it possible to prevent displacements from being caused by repetition of transfers. Moreover, only the element sections that need to be transferred can be selectively transferred to the final transfer substrate without using vacuum contact by vacuum equipment. Therefore, there is no fear of leakage of vacuum contact or of rotation or displacement during vacuum contact.

Furthermore, according to each of the methods described above, the element sections that need to be transferred to the final transfer substrate are transferred to the final transfer substrate by being joined to the final transfer substrate. Therefore, there does not occur a prominence of a soft resin due to the burial of semiconductor elements in the soft resin as would have conventionally occurred. For this reason, the element sections can be transferred with a high degree of positioning accuracy.

Further, according to each of the methods described above, the element sections that need to be transferred to the final transfer substrate can be selectively transferred dispersedly to the final transfer substrate. Therefore, the element sections can be transferred to the final transfer substrate at a desired pitch, and the efficiency in the use of the semiconductor substrate can be improved. Therefore, throughput and transfer accuracy can be increased.

Further, according to each of the methods described above, the efficiency in the use of the semiconductor substrate can be improved, and the number of transfers can be made smaller than in the conventional case. Therefore, by manufacturing a semiconductor apparatus by using any one of the methods described above, the cost of manufacturing the semiconductor apparatus can be reduced. Further, since neither a special apparatus nor expensive facilities are required, the cost of initial investment can be held down.

Therefore, each of the methods and configurations described above realizes high-accuracy transfer with few displacements, and can achieve an improvement in yield and a reduction in cost due to shortening of the manufacturing process. Further, this also makes it possible to improve the processing capability (takt time) of the manufacturing process.

Further, each of the methods and configurations described above makes it possible to manufacture and provide a high-performance semiconductor apparatus using semiconductor elements such as single-crystal silicon thin films or semiconductor devices made of single-crystal silicon fabricated into a single-crystal silicon substrate.

BRIEF DESCRIPTION OF DRAWINGS

FIG. 1 is a flow chart schematically showing main steps of a method for manufacturing a semiconductor apparatus according to Embodiment 1.

FIG. 2 is a set of cross-sectional views (a) to (g) showing some steps of the method for manufacturing a semiconductor apparatus according to Embodiment 1.

FIG. 3 is a set of cross-sectional views (a) to (c) showing other steps of the method for manufacturing a semiconductor apparatus according to Embodiment 1.

FIG. 4 is a set of cross-sectional views (a) to (c) showing other steps of the method for manufacturing a semiconductor apparatus according to Embodiment 1.

FIG. 5 is a graph showing a relationship between (i) the ratio of the area of contact between a UV removable sheet and each island pattern provided on a Si substrate to the area of the bonding surface of each island pattern with an intermediate substrate and (ii) the yield after cleaning treatment.

FIG. 6 shows (a) a plan view schematically showing a main part of a TFT substrate according to Embodiment 1 and (b) a cross-sectional view schematically showing a main part of a liquid crystal panel including the TFT substrate shown in (a) of FIG. 6.

FIG. 7 shows (a) a plan view schematically showing a configuration of a main part of a TFT substrate formed in the same manner as in (a) of FIG. 6 by using the technique described in Patent Literature 3 and (b) a cross-sectional view schematically showing a configuration of a main part of a liquid crystal panel formed in the same manner as in (b) of FIG. 6 by using the TFT substrate shown in (a) of FIG. 6.

FIG. 8 is a flow chart schematically showing main steps of a method for manufacturing a semiconductor apparatus according to Embodiment 2.

FIG. 9 is a set of cross-sectional views (a) to (f) showing some steps of the method for manufacturing a semiconductor apparatus according to Embodiment 2.

FIG. 10 is a set of cross-sectional views (a) to (c) showing other steps of the method for manufacturing a semiconductor apparatus according to Embodiment 2.

FIG. 11 is a flow chart schematically showing main steps of a method for manufacturing a semiconductor apparatus according to Embodiment 3.

FIG. 12 is a set of cross-sectional views (a) to (h) showing some steps of the method for manufacturing a semiconductor apparatus according to Embodiment 3.

FIG. 13 is a set of cross-sectional views (a) to (c) showing other steps of the method for manufacturing a semiconductor apparatus according to Embodiment 3.

FIG. 14 is a flow chart schematically showing main steps of a method for manufacturing a semiconductor apparatus according to Embodiment 4.

FIG. 15 is a set of cross-sectional views (a) to (f) showing some steps of the method for manufacturing a semiconductor apparatus according to Embodiment 4.

FIG. 16 is a set of cross-sectional views (a) to (e) showing other steps of the method for manufacturing a semiconductor apparatus according to Embodiment 4.

FIG. 17 is a set of cross-sectional views (a) to (d) showing other steps of the method for manufacturing a semiconductor apparatus according to Embodiment 4.

FIG. 18 is a set of cross-sectional views (a) to (c) showing other steps of the method for manufacturing a semiconductor apparatus according to Embodiment 4.

FIG. 19 is a flow chart schematically showing main steps of a method for manufacturing a semiconductor apparatus according to Embodiment 5.

FIG. 20 is a set of cross-sectional views (a) to (c) showing some steps of the method for manufacturing a semiconductor apparatus according to Embodiment 5.

FIG. 21 is a flow chart schematically showing main steps of a method for manufacturing a semiconductor apparatus according to Embodiment 6.

FIG. 22 is a set of cross-sectional views (a) to (c) showing some steps of the method for manufacturing a semiconductor apparatus according to Embodiment 6.

FIG. 23 is a set of cross-sectional views (a) to (c) showing some steps of a method for manufacturing a semiconductor apparatus according to a modification of Embodiment 6.

FIG. 24 is a flow chart schematically showing main steps of a method for manufacturing a semiconductor apparatus according to Embodiment 7.

FIG. 25 is a set of cross-sectional views (a) to (d) showing some steps of the method for manufacturing a semiconductor apparatus according to Embodiment 7.

FIG. 26 is a flow chart schematically showing main steps of a method for manufacturing a semiconductor apparatus according to Embodiment 8.

FIG. 27 is a set of cross-sectional views (a) to (d) showing some steps of the method for manufacturing a semiconductor apparatus according to Embodiment 8.

FIG. 28 is a set of cross-sectional views (a) to (c) showing other steps of the method for manufacturing a semiconductor apparatus according to Embodiment 8.

FIG. 29 is a set of cross-sectional views (a) to (d) showing S51 and the subsequent steps in FIG. 26 in the order in which they are executed.

FIG. 30 is a cross-sectional view schematically showing a configuration of a liquid crystal panel using a semiconductor substrate according to Embodiment 8.

FIG. 31 is a set of explanatory diagrams (a) and (b) showing a method for forming circuit elements such as pixels on a large-area glass substrate in an existing large-sized liquid-crystal TFT process.

FIG. 32 is a set of explanatory diagrams (a) and (b) showing a method for transferring semiconductor elements onto a large-area glass substrate.

FIG. 33 is a set of explanatory diagrams (a) and (d) showing another method for transferring semiconductor elements onto a large-area glass substrate.

FIG. 34 is a set of cross-sectional views (a) to (h) showing steps of a transfer method described in Patent Literature 3 in the order in which they are executed.

DESCRIPTION OF EMBODIMENTS

Embodiments for implementing the invention are described below with reference to the drawings. Of course, embodiments for implementing the invention are not to be limited thereto, and the dimensions of components described in each of the embodiments, the materials for such components, the shapes of such components, the positions of such components relative to one another, etc. are not purported to limit the scope of invention exclusively thereto, unless otherwise noted in a limited way, but serve merely as illustrative examples. Further, in each of the embodiments described below, the same components are given the same names and the same reference signs, and a description thereof is omitted.

[Embodiment 1]

An embodiment of the present invention is described below with reference to FIGS. 1 through 7.

A method for manufacturing a semiconductor apparatus according to the present embodiment is a method for manufacturing a semiconductor apparatus by using a so-called device transfer technique for transferring semiconductor elements from a semiconductor substrate serving as a base substrate to a final substrate (final transfer substrate, mounting substrate) on which the semiconductor elements are to be finally mounted.

The semiconductor substrate may be a substrate (semiconductor wafer) made of a semiconductor material, such as a Si substrate, an SOI (Silicon On Insulator) substrate, a GaN substrate, or a GaAs substrate, for example, or may be a substrate obtained by forming a semiconductor film made of a crystal of Si, GaN, GaAs, or the like on an insulating substrate such as a sapphire substrate.

Further, examples of the final substrate include insulating substrates such as a glass substrate, a plastic substrate, and a film bonded to a support substrate. As the final substrate, a flexible substrate such as a glass substrate having resin such as polyimide applied onto an entire surface thereof or an SUS (Steel Use Stainless) substrate may be used.

Further, examples of the semiconductor elements include semiconductor thin films (single films), semiconductor devices, circuit elements, etc. Examples of the semiconductor devices include light-emitting elements, liquid crystal control elements, photoelectric exchange elements, piezoelectric elements, TFT (thin-film transistor) elements, thin-film diode elements, resistor elements, switching elements, micro-magnetic elements, micro-optical elements, etc.

<<Method for Manufacturing a Semiconductor Apparatus>>

A method for manufacturing a semiconductor apparatus according to the present embodiment is described below with reference to FIG. 1 through (a) to (c) of FIG. 4.

Figure 1:
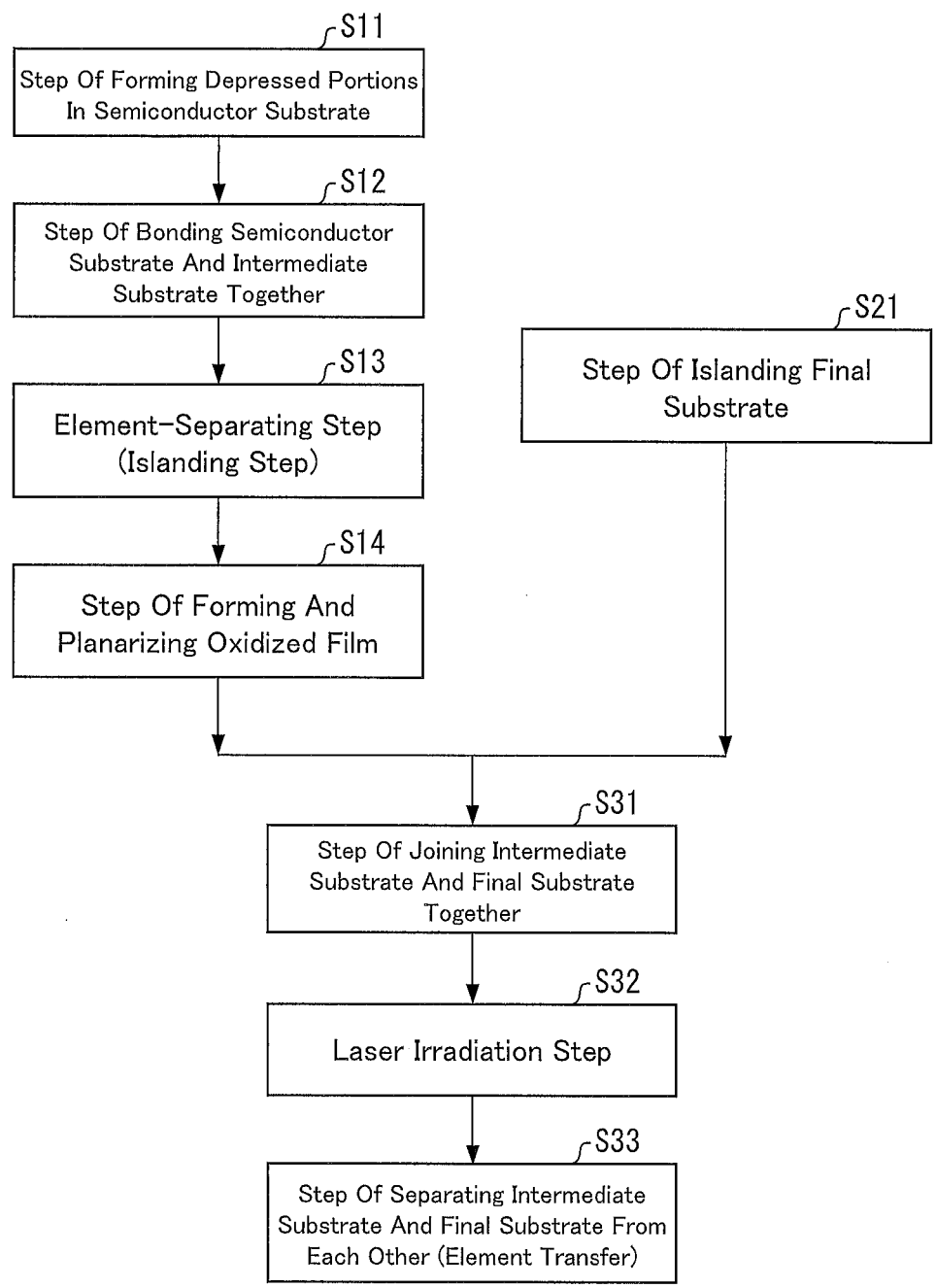
FIG. 1
Figure 2:
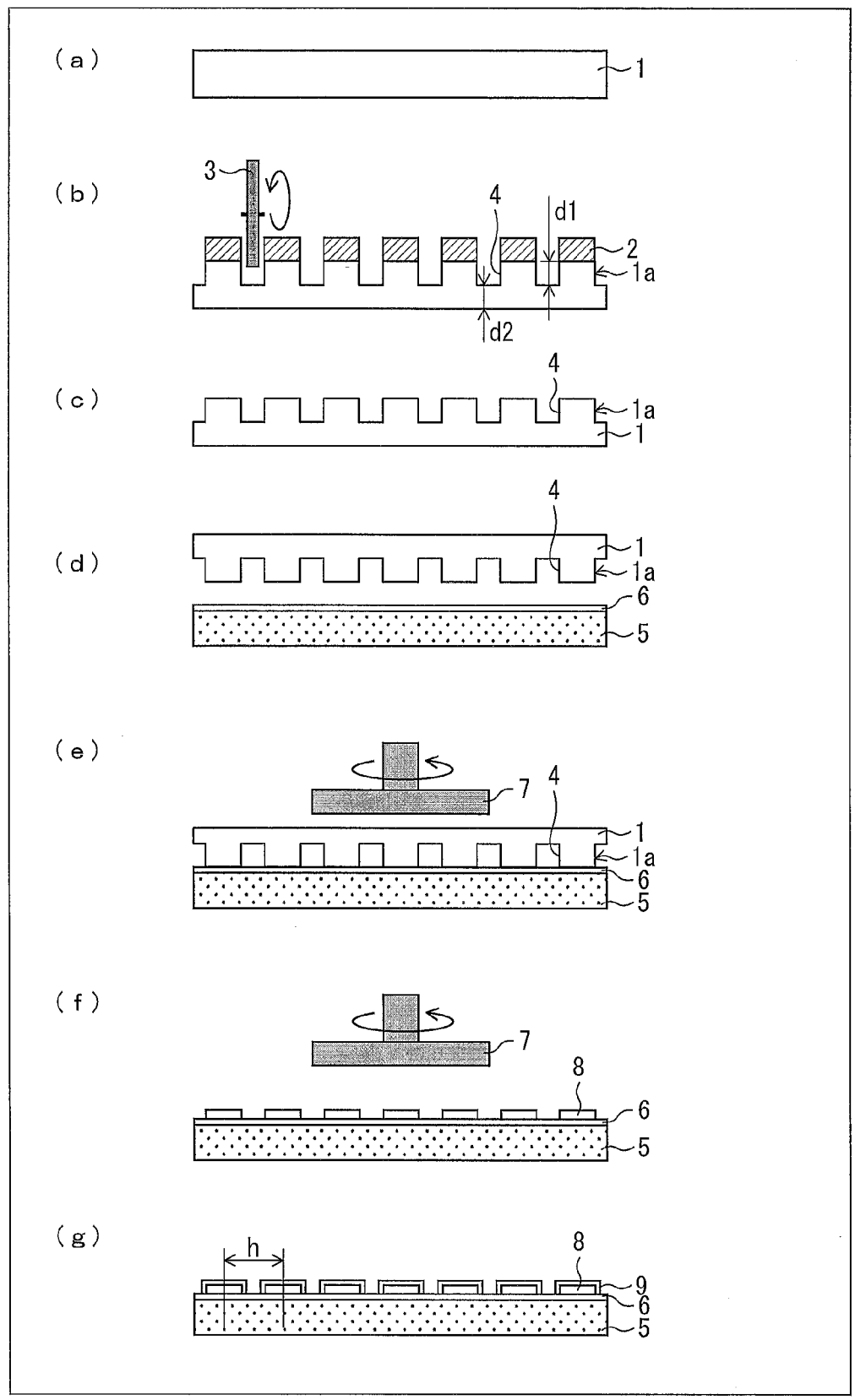
FIG. 2
Figure 3:
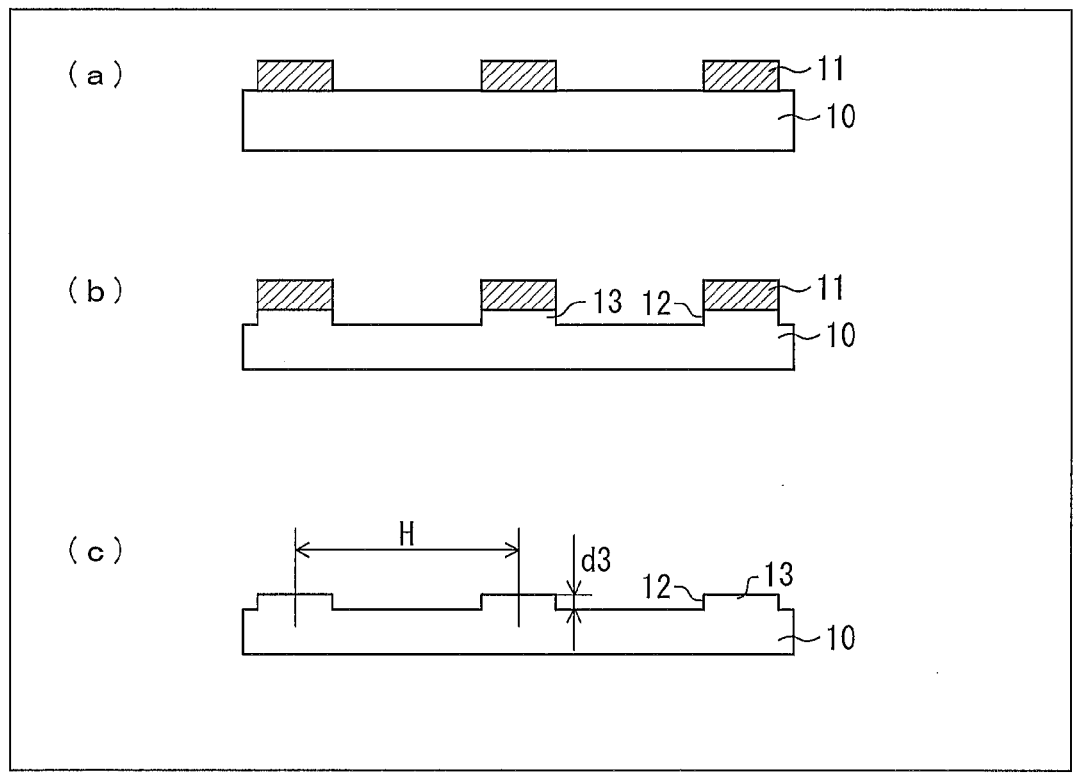
FIG. 3

FIG. 1 is a flow chart schematically showing main steps of a method for manufacturing a semiconductor apparatus according to the present embodiment. Further, FIG. 2 is a set of cross-sectional views (a) to (g) showing steps from S11 to S14 of FIG. 1 in the order in which they are executed. FIG. 3 is a set of cross-sectional views (a) to (c) showing steps in S21 of FIG. 1 in the order in which they are executed. FIG. 4 is a set of cross-sectional views (a) to (c) showing steps from S31 to S33 of FIG. 1 in the order in which they are executed.

First, the flow of a method for transferring a semiconductor element and a method for manufacturing a semiconductor apparatus according to the present embodiment is schematically described with reference to FIG. 1.

In the present embodiment, first, semiconductor elements are transferred from a semiconductor substrate serving as a base substrate to an intermediate substrate (intermediate transfer substrate) serving as a temporary transfer substrate (intermediate transfer step, first transfer step). After that, from the intermediate substrate to which the semiconductor elements have been transferred, the semiconductor elements are transferred to a final substrate (final transfer step, second transfer step).

For this purpose, as shown in FIG. 1, the step of forming depressed portions in the semiconductor substrate (S11) is executed first as a preprocess for transferring the semiconductor elements from the semiconductor substrate to the intermediate substrate. After that, the step of bonding the semiconductor substrate and the intermediate substrate together (S12) and the element-separating (islanding) step (S13) are executed, whereby the semiconductor elements are transferred from the semiconductor substrate to the intermediate substrate. Next, as a preprocess for transferring the semiconductor elements from the intermediate substrate to the final substrate, the step of forming an oxidized film on the intermediate substrate and planarizing the intermediate substrate (S14) is executed.

Meanwhile, as a preprocess for transferring the semiconductor elements from the intermediate substrate to the final substrate, the step of islanding the final substrate (S21) is executed.

After that, the step of joining the intermediate substrate and the final substrate together (S31), the laser irradiation step (S32), and the step of separating the intermediate substrate and the final substrate from each other (S33) are executed, whereby the transfer of the semiconductor elements from the intermediate substrate to the final substrate (element transfer) is completed.

Thus, a semiconductor apparatus is manufactured with the semiconductor elements selectively transferred dispersedly to the final substrate. Further, in a case where the semiconductor elements are semiconductor thin films such as single-crystal Si thin films, a semiconductor apparatus in which semiconductor devices composed of the semiconductor thin films have been dispersedly arranged can be manufactured by executing a common semiconductor device manufacturing process such as a TFT manufacturing process as needed on the final substrate.

Next, the flow of the method for manufacturing a semiconductor apparatus is described in more detail with reference to (a) to (g) of FIG. 2 through (a) to (c) of FIG. 4.

The following description is given by taking, as an example, a case where the semiconductor substrate serving as the base substrate is a Si substrate made of single-crystal Si and the semiconductor elements to be transferred (transferred layer) are single-crystal Si thin films (Si single films). However, the present embodiment is not to be limited to such an example.

<Step of Forming Depressed Portions in the Semiconductor Substrate (S11)>

As shown in (a) of FIG. 2, first, a Si substrate 1 is prepared as the semiconductor substrate.

Next, as shown in (b) of FIG. 2, the Si substrate 1 is coated with approximately several micrometers of resist 2 for surface protection. After that, in order that single-film patterns 1a (element patterns) each composed of a Si single film is formed on a surface of the Si substrate 1 as island-shaped element sections (protruding portions, island patterns) each having a desired transfer area, depressed portions 4 (slits) are formed in the resist 2 and the Si substrate 1 by carrying out half-cut dicing in a matrix manner with a blade 3 or the like. It should be noted that the depressed portions 4 (slits) may be formed by using photolithography and etching instead of half-cut dicing.

It should be noted here that the size (two-dimensional size, area) of each individual single-film patterns 1a separated by the depressed portions 4, i.e., of each island pattern (each element section) can be the size of a pixel transistor of approximately 50×50 μm.

The Si substrate 1 is not to be particularly limited in thickness. For example, a commercially available Si substrate usually has a thickness of approximately 625 to 725 μm. The depth d1 of each of the depressed portions 4 that are formed in the Si substrate 1 varies depending on the method of forming the slits and the thickness of the Si substrate 1. For example, the depth d1 is approximately 50 μm to 300 μm in a case where the slits are formed in a Si substrate having a thickness of 625 μm by half-cut dicing. Alternatively, the depth d1 is approximately 10 μm to 200 μm in a case where the slits are formed in a Si substrate having a thickness of 625 μm by etching.

That is, in a case where the depressed portions 4 are formed by half-cut dicing, the depth d1 of each of the depressed portions 4 is preferably in the range of approximately 10% to 50% or, more preferably, approximately 20% to 40% of the film thickness of the Si substrate 1 in view of substrate strength and the amount of time required to grind the back surface in S13 to be described later. Further, for the same reason as those stated above, the thickness d2 of the bottom part (bottom wall) of each of the depressed portions 4, i.e., of a connection part of the Si substrate 1 is preferably in the range of approximately 90% to 50% or, more preferably, approximately 80% to 60% of the film thickness of the Si substrate 1.

Alternatively, in a case where the depressed portions 4 are formed by etching, the depth d1 of each of the depressed portions 4 is preferably in the range of approximately 2% to 30% of the film thickness of the Si substrate 1 in view of substrate strength and the amount of time required for etching in S13 to be described later. Further, for the same reason as those stated above, the thickness d2 of the bottom part (bottom wall) of each of the depressed portions 4, i.e., of a connection part of the Si substrate 1 is preferably in the range of approximately 98% to 70% of the film thickness of the Si substrate 1.

In the case of half-cut dicing, the width of each of the depressed portions 4 is determined by the thickness of cutting means such as the blade 3 that is used for the half-cut dicing. In the case of etching, the width of each of the depressed portions 4 is determined by an aspect ratio of an etching method (there is a trade-off between the width of each of the depressed portions 4 and the slit depth). Therefore, an etching method having a high aspect ratio is desirable. For example, the slit width required to form a slit having a depth of 200 μm is 4 μm.

Next, as shown in (c) of FIG. 2, the resist 2 is removed by ashing or the like, whereby the Si substrate 1 is fabricated which has a pattern (concatenation of semiconductor elements) in which the single-film patterns 1a (semiconductor elements) each composed of a Si thin film, separated (islanded) from each other by the depressed portions 4, have been connected by the bottom part (bottom wall) of each of the depressed portions 4.

<Step of Bonding the Semiconductor Substrate and the Intermediate Substrate Together (S12)>

Next, as shown in (d) of FIG. 2, the Si substrate 1 is bonded onto an intermediate substrate 5 on which an adhesive material layer 6 has been stacked (applied or laminated), so that the surface of the Si substrate 1 on which the single-film patterns have been formed and the surface of the intermediate substrate 5 on which the adhesive material layer 6 has been stacked face each other.

As the intermediate substrate 5, an insulating substrate can be used, although this does not imply any limitation. Further, as the adhesive material layer 6, a resin, a sheet, of the like whose adhesive force is decreased by applying external energy can be used.

Examples of the external energy include, but are not to be limited to, light energy, heat energy, etc.

As the adhesive material layer 6 whose adhesive force is decreased by light energy, a resin or a sheet that becomes removable by decreasing in adhesive force upon UV light (ultraviolet radiation) irradiation (laser light) can be used, for example.

Alternatively, as the adhesive material layer 6 that whose adhesive force is decreased by heat energy, a resin or a sheet that becomes removable by decreasing in adhesive force upon heat treatment can be used, for example.

Examples of the adhesive material layer 6 that can be removed by heat treatment include wax and the like that decrease in adhesive force upon receiving heat, such as: "Revalpha (registered trademark)", manufactured by Nitto Denko Corporation; and "Apiezon (registered trademark) Wax", manufactured by Apiezon Products Limited, which decreases in adhesive force by foaming upon heating.

Further, in a case where a resin or a sheet that becomes removable by decreasing in adhesive force upon heat treatment is used as the adhesive material layer 6, the adhesive material layer 6 may be one which includes a photothermal conversion layer and which decreases in adhesive force by absorbing light and converting it into heat.

The adhesive material layer 6 is not to be particularly limited, as long as its adhesive force can be selectively (locally) decreased by selectively (locally) applying the external energy.

Among these materials, an adhesive material whose adhesive force is decreased by irradiation with light such as ultraviolet radiation or by heat treatment has the advantages of being easily available, being easy to control in a case where light energy or heat energy is used as the external energy, and not requiring special facilities or the like. For this reason, it is preferable to use, as the adhesive material layer 6, an adhesive material layer made of an adhesive material whose adhesive force is decreased by irradiation with light such as UV light (ultraviolet radiation) or an adhesive material whose adhesive force is decreased by heat treatment.

It should be noted that the present embodiment explains an example where a UV removable sheet is used as the adhesive material layer 6. In the case of use of a UV removable sheet, it is desirable that the intermediate substrate 5 be an insulating transparent substrate that transmits UV light.

Further, the following description is given by taking, as an example, a case where a UV removable sheet has been laminated on the entire surface of the intermediate substrate 5. However, the present embodiment is not to be limited to such an example. It should be noted that a preferred area of the adhesive material layer 6 on the intermediate substrate 5 will be described later.

<Element-Separating (Islanding) Step (S13)>

Next, as shown in (e) of FIG. 2, by using a grinder 7 that is commonly used for an IC process, back surface grinding is carried out from the back surface of the Si substrate 1 (i.e., the surface opposite to the surface of the Si substrate 1 on which the single-film patterns have been formed).

Thus, as shown in (f) of FIG. 2, the single-film patterns 1a connected together are separated (element-separated) into individual Si single films 8 (Si elements, semiconductor elements) constituted by the individual single-film patterns 1a.

<Step of Forming and Planarizing an Oxidized Film and (S14)>

After that, as shown (g) of FIG. 2, the Si single films 8 thus separated from each other are subjected to CVD (chemical vapor deposition) to be each formed with an oxidized film 9 (planarized oxidized film) approximately 30 to 100 nm thick such as a silicon dioxide ($SiO_2$) film (hereinafter referred to as "TEOS film") made of TEOS (orthosilicic ethyl; $Si(OC_2H_5)_4$).

It should be noted that if the planarization of the surface of the oxidized film 9 is insufficient, a sufficient junction may not be achieved in the after-mentioned step of joining the intermediate substrate 5 and a final substrate 10 with van der Waals' force (S31).

For this reason, after an oxidized film 9 has been formed as described above, the surface of the oxidized film 9 is planarized by CMP (Chemical Mechanical Polishing) or the like.

Thus, the intermediate substrate 5 is fabricated on which the plurality of Si single films 8 (semiconductor elements) have been arranged at a predetermined pitch h.

It should be noted that the oxidized film 9 is not to be limited to a TEOS film, but may be a thermally-oxidized film, a SiO2 film, a phosphor silicate glass (PSG) film, a boron phosphor silicate glass (BPSG) film, or the like.

<Step of Islanding the Final Substrate (S21)>

In S21, first, as shown in (a) of FIG. 3, a resist is stacked on the final substrate 10 and patterned by photolithography, whereby a resist pattern 11 is formed on the final substrate 10.

It should be noted that as the final substrate 10, a substrate larger in area than the Si substrate 1 is used. As mentioned above, a usable example of the final substrate 10 is, but is not limited to, an insulating substrate such as a glass substrate.

Next, as shown in (b) of FIG. 3, by etching the final substrate 10 with the resist pattern 11 as a mask, a matrix of depressed portions 12 (slits) is formed in the final substrate 10.

It should be noted that the etching employed can be dry etching that involves the use of a fluorine gas such as $CF_4$, $SF_6$, or $NF_3$ or a chlorine gas such as $Cl_2$, HCl, or $BCl_3$. Further, the dry etching may be combined with a gas such as $CF_4$, $CHF_3$, $C_2F_6$, $H_2$, or $O_2$. Further, the dry etching may be replaced by wet etching that involves the use of HF, BHF, fluoro-nitric acid, KOH, SLA etchant, or the like. Alternatively, in order to form deeper depressed portions 12 (slits), Deep-RIE, Bosch process etching, or the like may be used. Deep-RIE is carried out by using high-density plasma such as inductively-coupled plasma (ICP)-RIE or ECR (Electron Cycrotron Resonance)-RIE using microwaves, with a sample at a low temperature. Meanwhile, Bosch process etching is carried out by alternately carrying out etching and lateral protection by etching. The etching condition needs only be appropriately selected according to the type of the final substrate 10 used, and as such, is not to be particularly limited.

Next, as shown in (c) of FIG. 3, the resist pattern 11 is removed by ashing or the like, whereby the final substrate 10 is fabricated on which as a receptor pattern to be joined to the Si single films 8, raised portions 13 (island patterns, elevated portions) separated from each other in a matrix manner by the depressed portions 12 have been formed at a predetermined pitch H.

By thus forming the raised portions 13 on the final substrate 10, only those ones of the Si single films 8 which face the raised portions 13 can be brought into contact with the raised portion 13 (i.e., the final substrate 10) by the difference of elevation on the surface of the final substrate 10 when the intermediate substrate 5 and the final substrate 10 are joined so that the Si single films 8 and the raised portions 13 face each other in S31 to be described later. For this reason, the final substrate 10 needs only be provided with the raised portions 13 as a receptor pattern for providing the difference of elevation.

Therefore, the height (depth of each of the depressed portions 12) d3 of each of the raised portions 13 needs only be appropriately set according to the use or the like of the semiconductor apparatus to be finally formed, and as such, is not to be particularly limited. However, in order that other elements that should not be joined to the final substrate 10 are not joined to the final substrate 10 by mistake, it is preferable that the height d3 of each of the raised portions 13 be 1 μm or greater. Further, in order to prevent breaking of wires and the like due to the bumps, it is preferable that the height d3 of each of the raised portions 13 be 5 μm or less.

Further, in consideration of the margins of junction with the Si single films 8, it is preferable that the raised portions 13 be formed to be a size larger than the Si single films 8 transferred onto the intermediate substrate 5. By thus forming the raised portions 13, the contact between the raised portions 13 and the Si single films 8 is secured even if there is a slight displacement when the raised portions 13 and the Si single films 8 are joined to each other in S31, so that the raised portions 13 and the Si single films 8 can be surely attached to each other.

Further, it is preferable that the pitch H be an integral multiple of the pitch h. In the present embodiment, for example, the pitch H is formed to be three times as great as the pitch h. Further, in a case where the final substrate 10 is used as a display panel in a display device, it is preferable that the pitch H correspond to the pixel pitch. That is, it is desirable that the resist pattern 11 be formed so that these conditions are satisfied.

Thus, some of the plurality of single-film patterns 1a formed on the Si substrate 1 can be selectively transferred.

Further, since the pitch H is an integral multiple of the pitch h as mentioned above, even in a case where there is a change in the pitch H (layout of the final substrate 10) (e.g., even in a case where the pitch H changes from being twice as great as to being four times as great as the pitch h), it is only necessary to change only the pitch H (layout of the final substrate 10) while keeping intact the pitch h (layout) at which the single-film patterns 1a are formed on the Si substrate 1. Thus, the single-film patterns 1a to be transferred can be efficiently arranged dispersedly in correspondence with the positions on the final substrate 10 to which they are transferred.

Further, in a case where the pitch H corresponds to the pixel pitch as mentioned above, the final substrate 10 can be easily manufactured on which semiconductor elements have been formed at the pixel pitch.

<Step of Joining the Intermediate Substrate and the Final Substrate Together (S31)>

Figure 4:
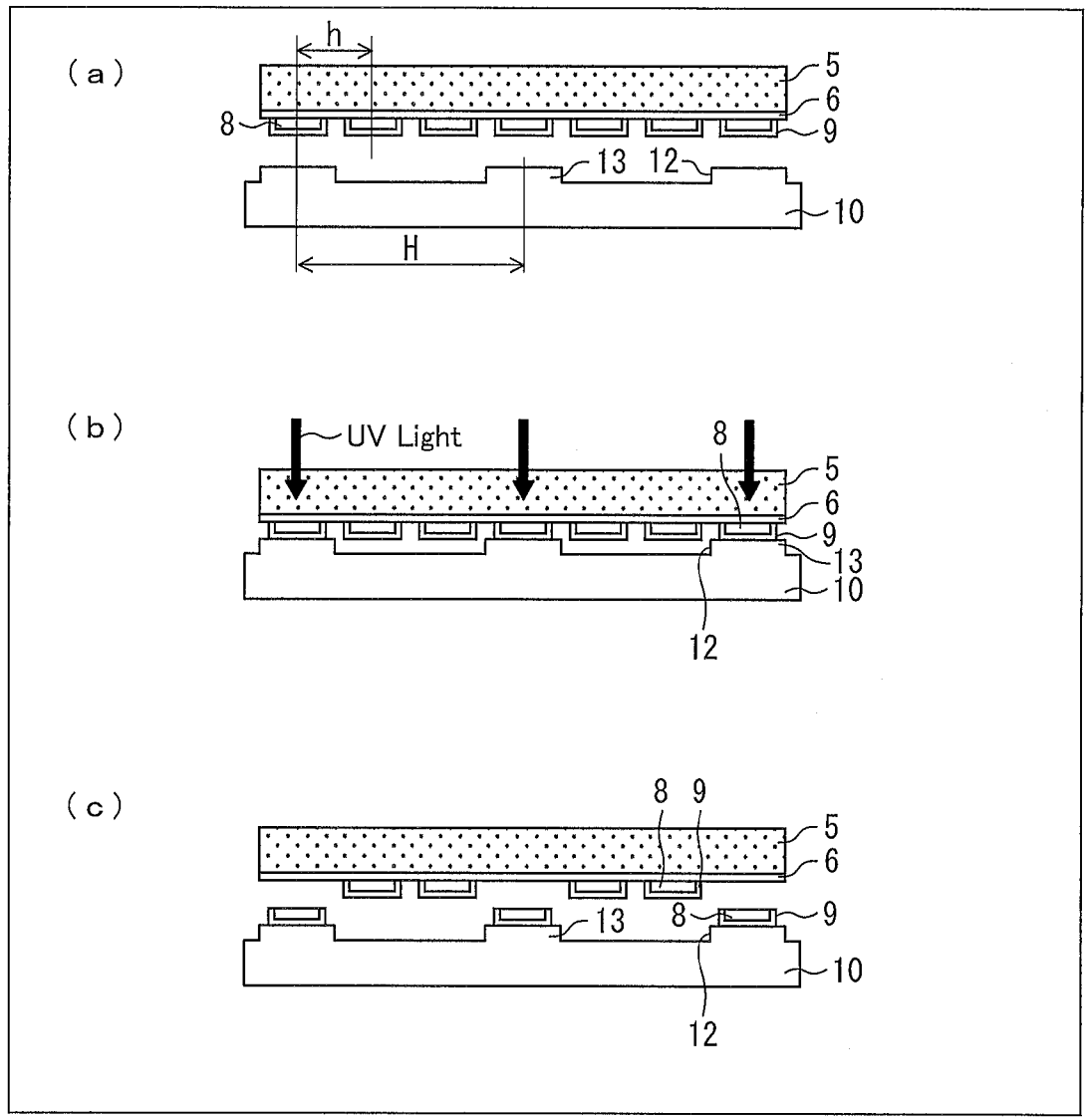
FIG. 4

Next, as shown in (a) of FIG. 4, the intermediate substrate 5 to which the Si single films 8 have been transferred as described above and the final substrate 10 on which the raised portions 13 have been formed are joined together.

It should be noted that in the present embodiment, the intermediate substrate 5 and the final substrate 10 are joined together by covalent bonding without an adhesive material.

For this purpose, first, the joint surfaces of the intermediate substrate 5 and the final substrate 10 to each other are surface-treated (hydrophilically treated). It should be noted that the surface treatment can be carried out by using a surface treatment method that is commonly used in the Smart-Cut method. That is, the joint surfaces of the intermediate substrate 5 and the final substrate 10 to each other are plasma-treated or chemical-treated so as to be hydrophilized.

It should be noted here that the plasma treatment can be carried out by using Ar (argon) plasma, atmospheric pressure plasma, or the like. Alternatively, the hydrophilic treatment may be carried out by carrying out, for several minutes, chemical treatment such as ozone aqueous cleaning or SC1 cleaning with a mixed solution of oxygenated water and ammonia water.

Next, the intermediate substrate 5 and the final substrate 10 thus surface-treated are made to face each other and brought into contact with each other.

When, at this point in time, the Si single films 8 and the raised portions 13 are aligned so as to face each other, only those ones of the Si single film 8 which face the raised portions 13 make contact with the raised portions 13 (i.e., the final substrate 10), since the raised portions 13 have been formed at a pitch that is an integral multiple (three times in (a) of FIG. 4) of the pitch h between the Si single films 8. In other words, Si single films 8 (two Si single films 8 in (a) of FIG. 4) located between each of the raised portions 13 and a raised portion 13 adjacent to that raised portion 13 do not make contact with the final substrate 10.

The raised portions 13 and the Si single films 8, which have been surface-treated (hydrophilically treated), spontaneously adhere to (join) each other with van der Waals' force by bringing them into contact with each other and pressing them with a slight force. Moreover, by carrying out preannealing at 200° C. for approximately two hours after that, the dehydration reaction proceeds and a covalent bond is formed, so that the junction between the final substrate 10 and the Si single films 8 on the intermediate substrate 5 is made tighter. Thus, only those ones of the Si single films 8 on the intermediate substrate 5 which face the raised portions 13 on the final substrate 10 are selectively joined to the final substrate 10.

<Laser Irradiation Step (S32)>

After that, as shown in (b) of FIG. 4, the Si single films 8 to be transferred (more strictly, the adhesive material layer 6 between the Si single films 8 to be transferred and the intermediate substrate 5) are selectively irradiated with UV light from the back surface of the intermediate substrate 5 (i.e., the surface opposite to the transfer surfaces (holding surfaces) of the Si single films 8). Irradiation conditions vary depending on the resin material constituting the UV removable sheet of the adhesive material layer 6, but for example, the irradiation can be carried out at an irradiation intensity of 50 mW/cm$^2$ or higher for an irradiation time of 60 s or longer.

<Step of Separating the Intermediate Substrate and the Final Substrate from Each Other (S33)>

Since the adhesive force of the UV removable sheet in positions corresponding to the Si single films 8 irradiated with the UV light is decreased by the UV light, the Si single films 8 irradiated with the UV light are separated from the intermediate substrate 5 and transferred to the final substrate 10 as shown in (c) of FIG. 4 by vertically pulling the intermediate substrate 5 and the final substrate 10 away from each other.

Meanwhile, the Si single films 8 not irradiated with the UV light are kept inseparable from the intermediate substrate 5.

According to the present embodiment, by executing a common semiconductor device manufacturing process such as a TFT manufacturing process as needed after S33, a semiconductor apparatus can be manufactured in which semiconductor devices including part of the transferred Si single films 8 have been dispersedly arranged.

Further, at this point in time, by using an insulating substrate such as a glass substrate as the final substrate 10 and forming TFT elements including part of the transferred Si single films 8 through a common TFT manufacturing process, high-performance TFT elements can be dispersedly arranged on the insulating substrate such as the glass substrate.

Further, by executing an LDC process with use of the TFT elements thus dispersedly arranged, a high-performance liquid crystal panel can be obtained with high display quality.

<<TFT Substrate and a Method for Manufacturing a Liquid Crystal Panel>>

A case where a TFT substrate (active-matrix substrate) having TFT elements including part of the transferred Si single films and a liquid crystal panel including the TFT substrate are manufactured as semiconductor apparatuses according to the present embodiment is described below with reference to (a) and (b) of FIG. 6 and (a) and (b) of FIG. 7.

Figure 6:
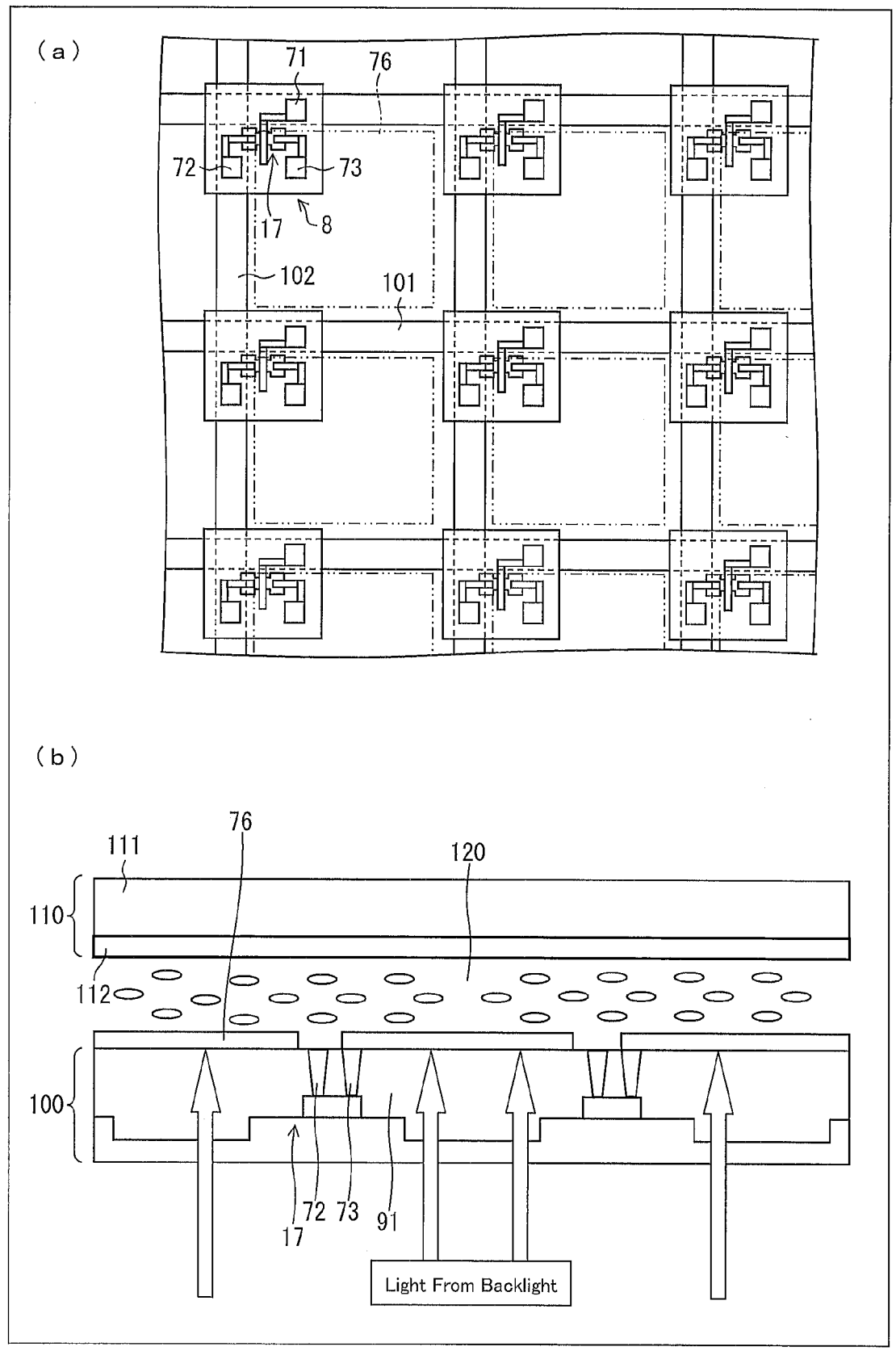
FIG. 6

(a) of FIG. 6 is a plan view schematically showing a configuration of a main part of a TFT substrate according to the present embodiment, and (b) of FIG. 6 is a cross-sectional view schematically showing a main part of a liquid crystal panel including the TFT substrate shown in (a) of FIG. 6.

Figure 7:
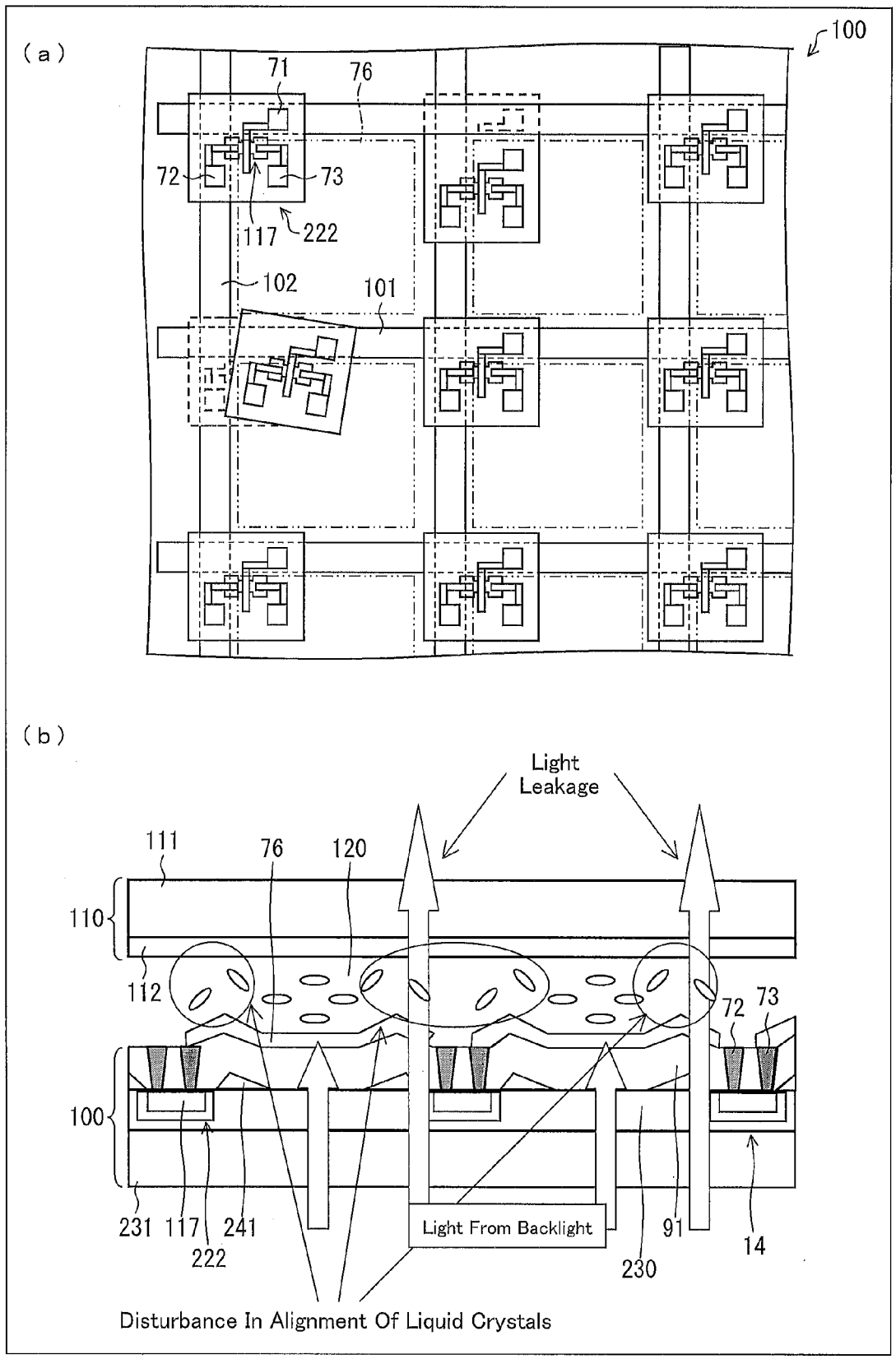
FIG. 7

Further, (a) of FIG. 7 is a plan view schematically showing a configuration of a main part of a TFT substrate formed in the same manner as in (a) of FIG. 6 by using the technique described in Patent Literature 3, and (b) of FIG. 7 is a cross-sectional view schematically showing a configuration of a main part of a liquid crystal panel formed in the same manner as in (b) of FIG. 6 by using the TFT substrate shown in (a) of FIG. 6.

As described above, according to the present embodiment, by executing a common TFT manufacturing process after S33, TFT elements 17 including part of the transferred Si single films 8 are formed as shown in (a) and (b) of FIG. 6.

In the TFT manufacturing process, the Si single films 8 transferred at the pixel pitch are patterned into the island shapes of the TFT elements 17 by photolithography and etching. Then, as shown in (a) of FIG. 6, gate electrodes 71 to be each connected to a gate wire 101, source electrodes 72 to be each connected to a source wire 102, drain electrodes 73, and the like are formed.

Furthermore, as shown in (a) and (b) of FIG. 6, by forming the wires such as the gate wires 101 and the source wires 102, an insulating film 91 such as an interlayer insulating film, pixel electrodes 76 to be connected to the drain electrodes 73, an alignment film (not illustrated), and the like, a main part of a TFT substrate 100 (active-matrix substrate) using the final substrate 10 is completed.

Further, while the TFT substrate 100 is thus formed, a counter substrate 110 is formed as shown in (b) of FIG. 6 by forming a transparent electrode 112, a black matrix (not illustrated), a color filter (not illustrated), and the like on an insulating substrate 111.

Moreover, by forming a polarizing plate (not illustrated) or the like as needed outside of a liquid crystal cell that is obtained by bonding the counter substrate 110 and the TFT substrate 100 together via a liquid crystal layer 120 as shown in (b) of FIG. 6, a liquid crystal panel can be manufactured in which the TFT elements 17 are switching elements.

As shown in (a) of FIG. 6, the gate wires 101 and the source wires 102 are formed in such a matrix manner as to be orthogonal to each other. Further, the regions surrounded by the gate wires 101 and the source wires 102 are pixel regions each provided with a pixel electrode 76 as shown (a) and (b) of FIG. 6. Further, as shown (a) and (b) of FIG. 6, the TFT elements 17 are dispersedly arranged in a matrix manner at the predetermined pixel pitch in correspondence with the respective pixel regions.

Figure 34:
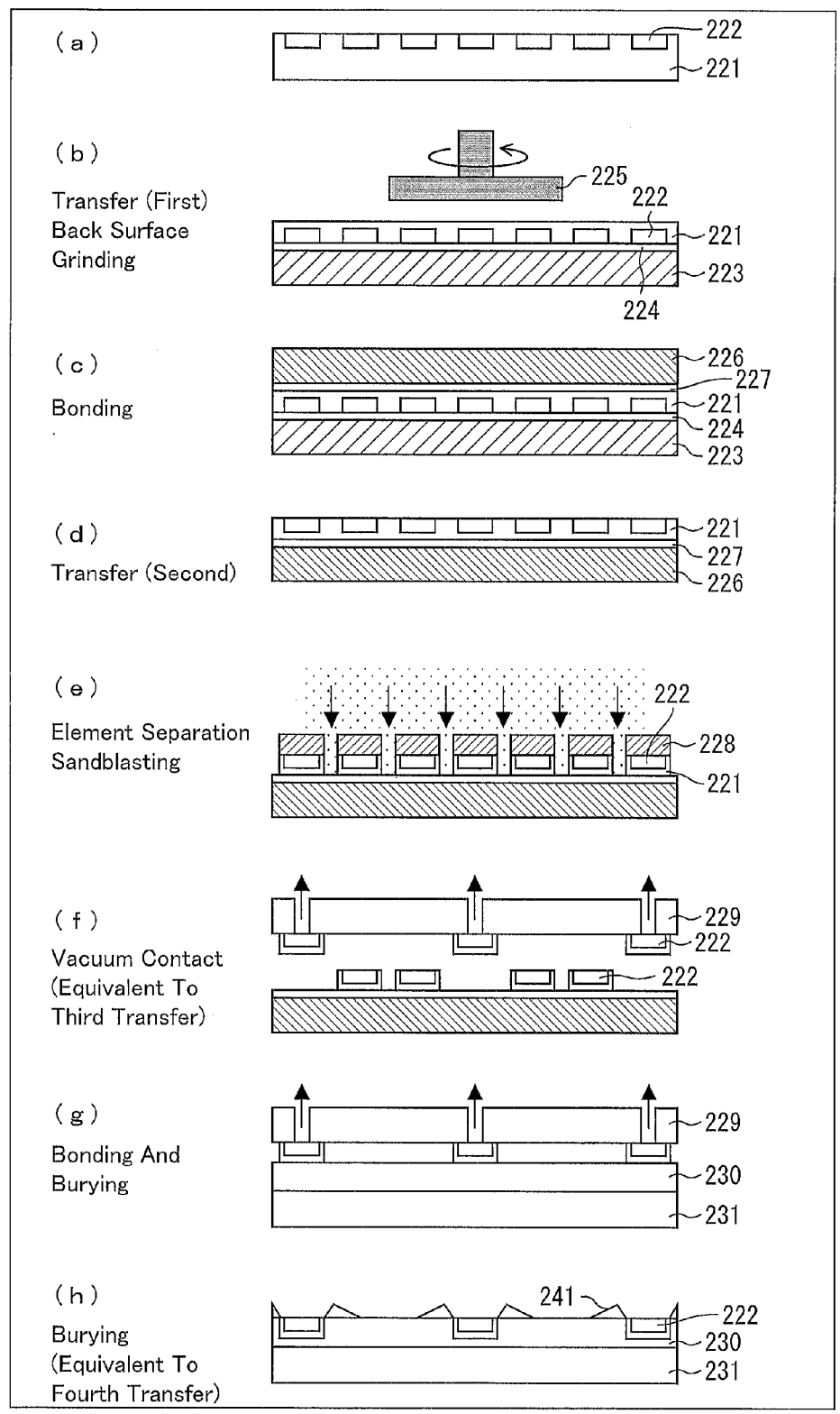
FIG. 34

As shown in (a) to (h) of FIG. 34, the technique described in Patent Literature 3, which picks up the semiconductor elements 222 by vacuum contact for selective transfer, has such a problem that gaps between the semiconductor elements 222 and the vacuum chuck prevent the semiconductor elements 222 from being sucked or cause the semiconductor elements 222 to be rotated, for example, to be displaced from the sucking positions.

Further, according to Patent Literature 3, as shown in (a) and (b) of FIG. 7, the semiconductor elements 222 are buried in the soft thermoplastic resin film 230; therefore, the semiconductor elements 222 are easily movable, with the result that the accuracy with which the semiconductor elements 222 are transferred is low.

For this reason, in a case where the TFT substrate 100 is formed in the same manner as in (a) and (b) of FIG. 6 by using the technique described in Patent Literature 3, great shifts in alignment are caused when the TFT elements 117 and the wires are connected in a wiring step subsequent to the transfer step, so that poor connection tends to take place as shown in (a) of FIG. 7.

See the example shown in (a) of FIG. 7. Since the TFT element 117 in the center of the upper row has been shifted downward from the right position indicated by a dotted line, there is poor connection between the gate wire 101 and the gate electrode 71. Further, since the TFT element 117 in the left of the middle row has been shifted obliquely from the right position indicated by a dotted line, there is poor connection between the source wire 102 and the source electrode 72.

It should be noted that setting a large layout margin for a contact section between the semiconductor elements and the wires in an attempt to prevent poor connection causes a decrease in aperture ratio.

On the other hand, according to the present embodiment, by carrying out selective transfer, for example, by combining the UV removable sheet and UV irradiation as mentioned above, the semiconductor elements formed by the Si single films 8, which are single crystals, can be picked up with a high degree of accuracy and selectively transferred dispersedly onto the final substrate 10 composed of a large-area insulating substrate such as a glass substrate.

Further, in the present embodiment, as described above, when semiconductor elements such as the Si single films 8 or semiconductor devices including the Si single films 8 are transferred to the final substrate 10, the semiconductor elements 222 are not buried in the soft thermoplastic resin film 230 as shown in (b) of FIG. 7, but are joined to the final substrate 10 by covalent bonding, and can therefore be transferred with a high degree of positioning accuracy.

For this reason, the TFT substrate 100 manufactured by using the transfer method according to the present embodiment does not suffer from poor connection as shown in (a) of FIG. 6, and as such, is high in reliability.

<<Effects>>

The transfer method makes it possible to transfer the Si single films 8 from the Si substrate 1 to the final substrate 10 with two transfers. Therefore, the present embodiment makes it possible to reduce the number of transfers as compared with the conventional technique. Accordingly, the present embodiment also makes it possible to increase throughput and element-bonding accuracy, thus making it possible to improve yield and reduce cost.

Further, according to the present embodiment, by executing a common semiconductor device manufacturing process such as a TFT manufacturing process as needed after S33, a semiconductor apparatus can be manufactured in which semiconductor devices including the Si single films 8 have been dispersedly arranged.

Further, at this point in time, by using an insulating substrate such as a glass substrate as the final substrate 10 and forming TFTs having the Si single films 8 as semiconductor layers through a common TFT manufacturing process, high-performance TFTs composed of the Si single films 8 can be dispersedly arranged on the insulating substrate such as the glass substrate.

In the case of use of the Smart-Cut method for the transfer of semiconductor elements, implantation of ions into a single-crystal Si substrate for cleavage and removal of an unwanted part of the single-crystal Si substrate in the ion-implanted layer cause appearance of a lattice defect due to the ion implantation, appearance of an unpaired electron due to link cleavage between Si atoms, etc. in the transistor channel of the single-crystal Si substrate from which the unwanted part has been removed, thus causing a crystallinity-impaired region (damaged region) to appear. Moreover, the defect of having electric charges present in such a damaged region causes deterioration of the characteristics of the single-crystal Si transistor, thus inviting an increase in S coefficient (blunting of a subthreshold slope).

However, since the present embodiment does not use the Smart-Cut method, the present embodiment does not suffer from such a problem.

Figure 31:
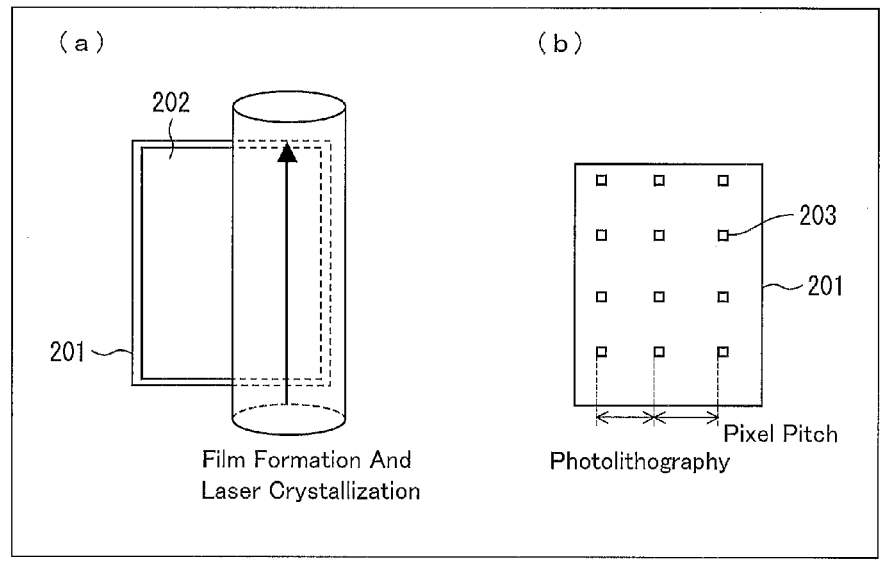
FIG. 31
Figure 32:
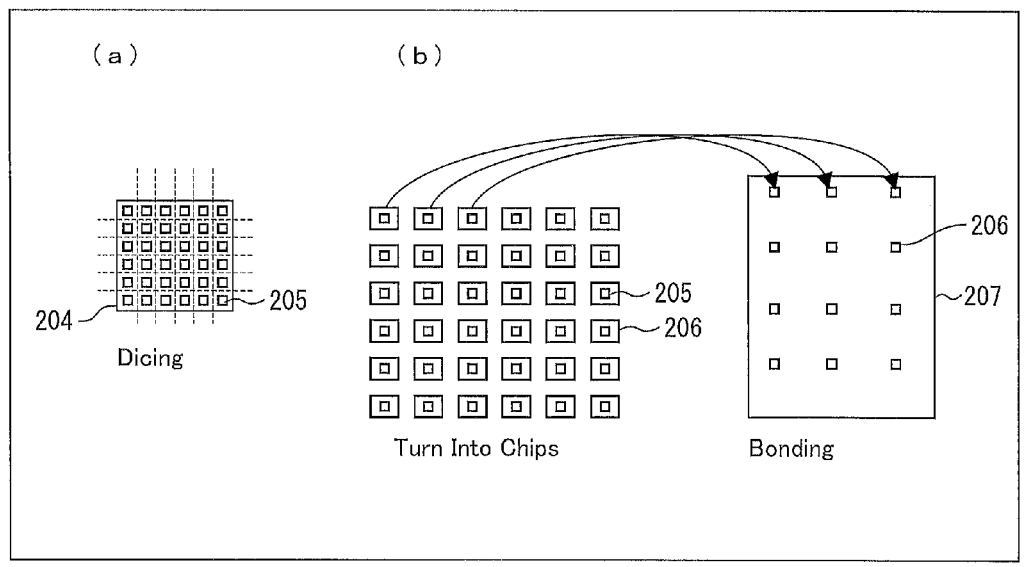
FIG. 32
Figure 33:
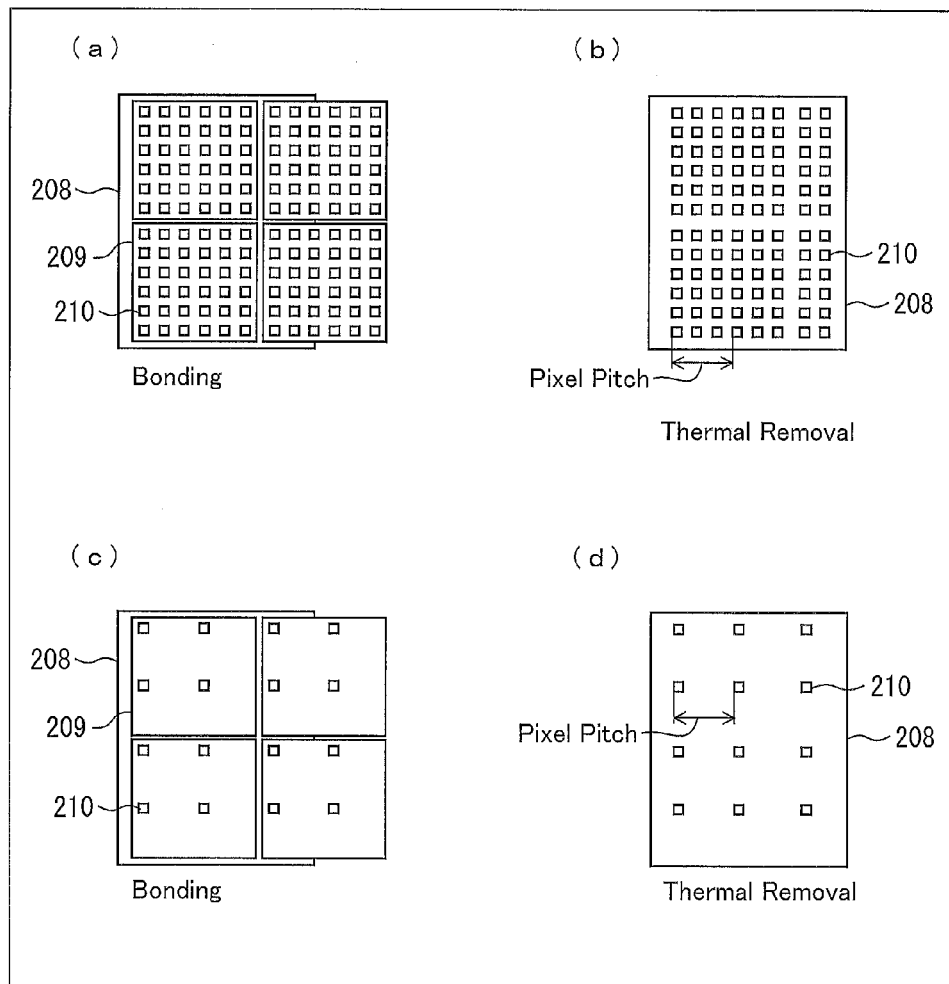
FIG. 33

Further, unlike in the case of a-Si and poly-Si using the conventional techniques shown in (a) and (b) of FIG. 31, the present embodiment does not suffer from a decrease in electron (or hole) mobility or an increase in S coefficient due to a localized level within a gap due to incompleteness of crystallinity and a defect or intra-gap localized level in the vicinity of a crystal grain boundary.

Furthermore, according to the present embodiment, as mentioned above, by first forming the depressed portions 4 in the Si substrate 1 and then grinding the back surface of the Si substrate 1, the elements can be separated from each other without an increase in the number of transfers. Moreover, the combination of the UV removable sheet and the removal of the UV removable sheet by UV light irradiation makes it possible to selectively transfer the TFTs composed of the Si single films 8 onto a large-area panel substrate (final substrate 10) in a high-throughput manner.

Further, according to the present embodiment, as compared with the conventional technique of burying semiconductor elements in a soft resin, the semiconductor elements can be transferred to the final substrate 10 with a high degree of positioning accuracy.

For this reason, the above method makes it possible to manufacture high-performance display panels with low S coefficients at low cost.

<<Configuration of a Semiconductor Apparatus>>

A configuration of a semiconductor apparatus according to the present embodiment is described below with reference to (c) of FIG. 4.

As shown in (c) of FIG. 4, a semiconductor apparatus according to the present embodiment is configured such that the raised portions 13 (island patterns) separated into an array by the depressed portions 12 have been formed on the final substrate 10 composed of an insulating substrate such as a glass substrate and that semiconductor elements such as the Si single films 8 or semiconductor devices including the Si single films 8 have been joined onto the raised portions 13 by covalent bonding via the oxidized films 9 covering the surfaces of the Si single films 8.

Therefore, the present embodiment makes it possible to provide a semiconductor apparatus in which semiconductor elements have been fixed firmly onto an insulating substrate by covalent bonding and in which high-accuracy semiconductor elements have been dispersedly arranged on a large-area insulating substrate.

<<Area of the Adhesive Material Layer>>

A preferred area of the adhesive material layer 6 on the intermediate substrate 5 is described below.

The present embodiment has been described above by taking, as an example, a case where the UV removable sheet has been laminated as the adhesive material layer 6 on the entire surface of the intermediate substrate 5. However, the present embodiment is not to be limited to such an example.

Figure 5:
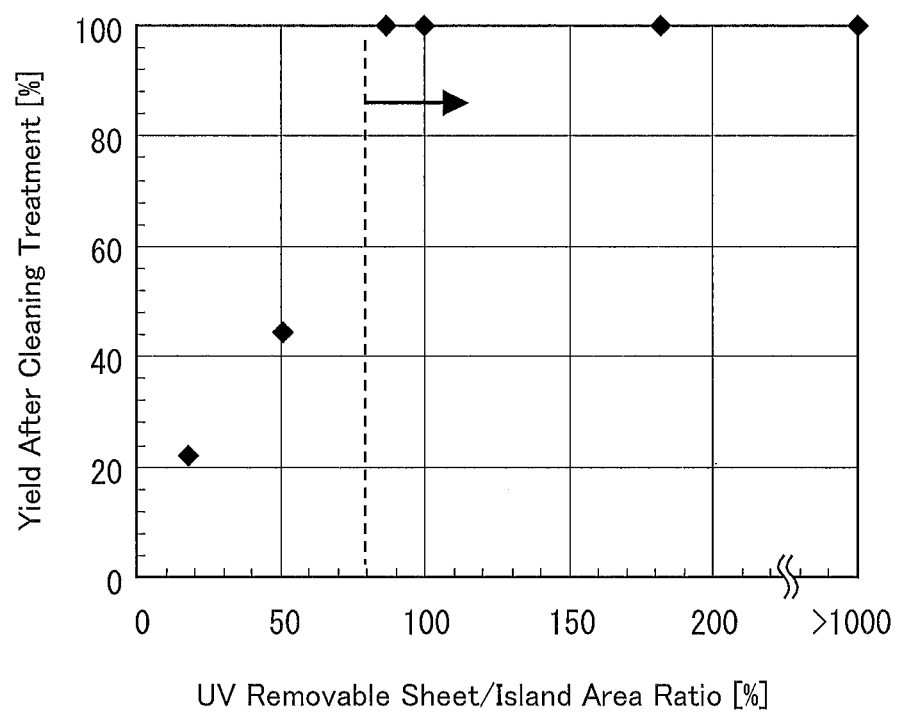
FIG. 5

FIG. 5 is a graph showing a relationship between (i) the ratio of the area of contact between the UV removable sheet and each single-film pattern 1a (each island pattern) separated by the depressed portions 4 in the Si substrate 1 to the area of the bonding surface of each single-film pattern 1a with the intermediate substrate 5 (such a ratio being hereinafter referred to as "UV removable sheet/island area ratio") and (ii) the yield after cleaning treatment.

As shown in FIG. 5, in a case where the UV removable sheet/island area ratio is lower than 80%, lack of adhesive force causes the semiconductor elements to be removed by cleaning treatment in S31, with the result that the yield rapidly declines. For this reason, it is preferable that the UV removable sheet/island area ratio be equal to or higher than 80%.

Therefore, it is preferable that the adhesive material layer 6 on the intermediate substrate 5 be applied or laminated onto at least 80% of the area of each single-film pattern 1a separated by the depressed portions 4.

<<Modification>>

The present embodiment has been described by taking, as an example, a case where the depressed portions 4 (slits) are formed in the resist 2 and the Si substrate 1 by half-cut dicing in S11 as shown in (b) of FIG. 2.

However, the present embodiment is not to be limited to such an example. As mentioned above, a similar matrix pattern may be formed by forming the depressed portions 4 (slits) in the resist 2 and the Si substrate 1 by using photolithography and etching instead of half-cut dicing.

The etching used may be normal dry etching that involves the use of a fluorine gas or a chlorine gas or wet etching that involves the use of HF, BHF, fluoro-nitric acid, KOH, SLA etchant, or the like. However, in order to form deeper slits, it is desirable to use Deep-RIE, Bosch process etching, or the like. Use of such an etching method makes it possible to form slits with a high aspect ratio of 50 to 100. For example, a slit having a width of 1 μm and a depth of 50 μm can be formed.

Further, the present embodiment has been described above by taking, as an example, a case where the semiconductor substrate serving as the base substrate is a Si substrate made of single-crystal Si, where the semiconductor elements are Si single films constituting the semiconductor substrate, and where each single-film pattern 1a separated by the depressed portions 4 is a Si single film. However, the present embodiment is not to be limited to such an example.

As mentioned above, each of the semiconductor elements may be either a semiconductor device including a Si single film constituting the semiconductor substrate or part thereof. That is, each single-film pattern 1a separated by the depressed portions 4 may include either a semiconductor device including a Si single film constituting the semiconductor substrate or part thereof.

Alternatively, in a case where the semiconductor substrate is an SOI substrate, each of the semiconductor elements may be a Si single film and a Si oxidized film constituting the SOI substrate, a semiconductor device including the Si single film and the Si oxidized film, or part thereof.

Alternatively, in a case where the semiconductor substrate is a GaAs substrate or a substrate obtained by forming a GaAs film on a sapphire substrate, each of the semiconductor elements may be a single-crystal GaAs film, or may be either a semiconductor device including a single-crystal GaN film or part thereof. Alternatively, in a case where the semiconductor substrate is a GaN substrate or a substrate obtained by forming a GaN film on a sapphire substrate, each of the semiconductor elements may be a single-crystal GaN film, or may be either a semiconductor device including a single-crystal GaN film or part thereof. In such a case where each of the semiconductor elements is either a single-crystal film constituting a GaAs substrate or a GaN substrate or at least part of a semiconductor device including such a single-crystal film, light-emitting elements such as light-emitting diodes (LED) can be dispersedly arranged on the final substrate 10.

Further, the present embodiment has been described above by taking, as an example, a case where each single-film pattern 1a separated by the depressed portions 4 includes one semiconductor element. However, the number of semiconductor elements that are included in each single-film pattern 1a is not to be limited to one. Further, in a case where each of the semiconductor element is a semiconductor device or part thereof and each single-film pattern 1a includes a plurality of semiconductor elements, the types of the semiconductor elements that are included in each single-film pattern 1a may be the same or different from each other.

[Embodiment 2]

Another embodiment of the present invention is described below with reference to FIG. 8 through (a) to (c) of FIG. 10.

Figure 8:
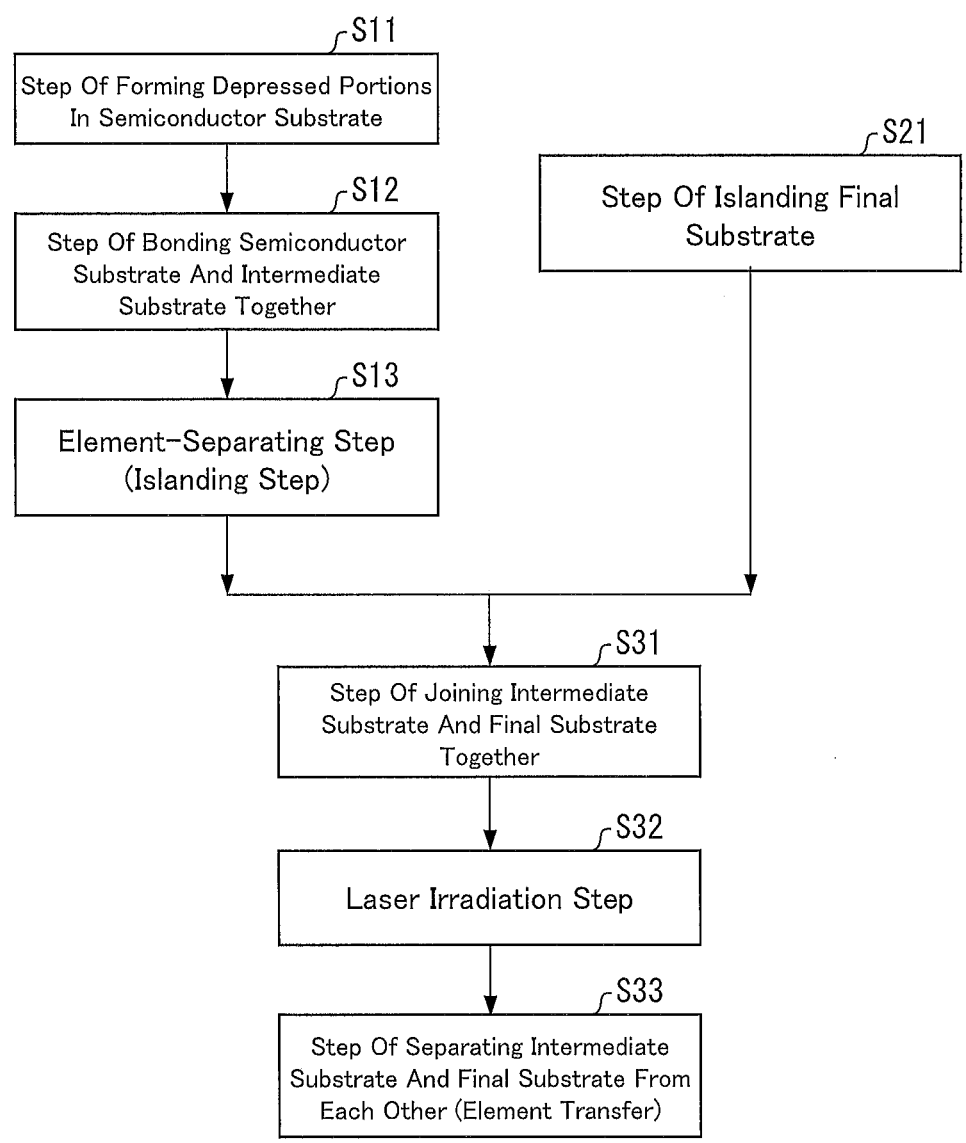
FIG. 8
Figure 9:
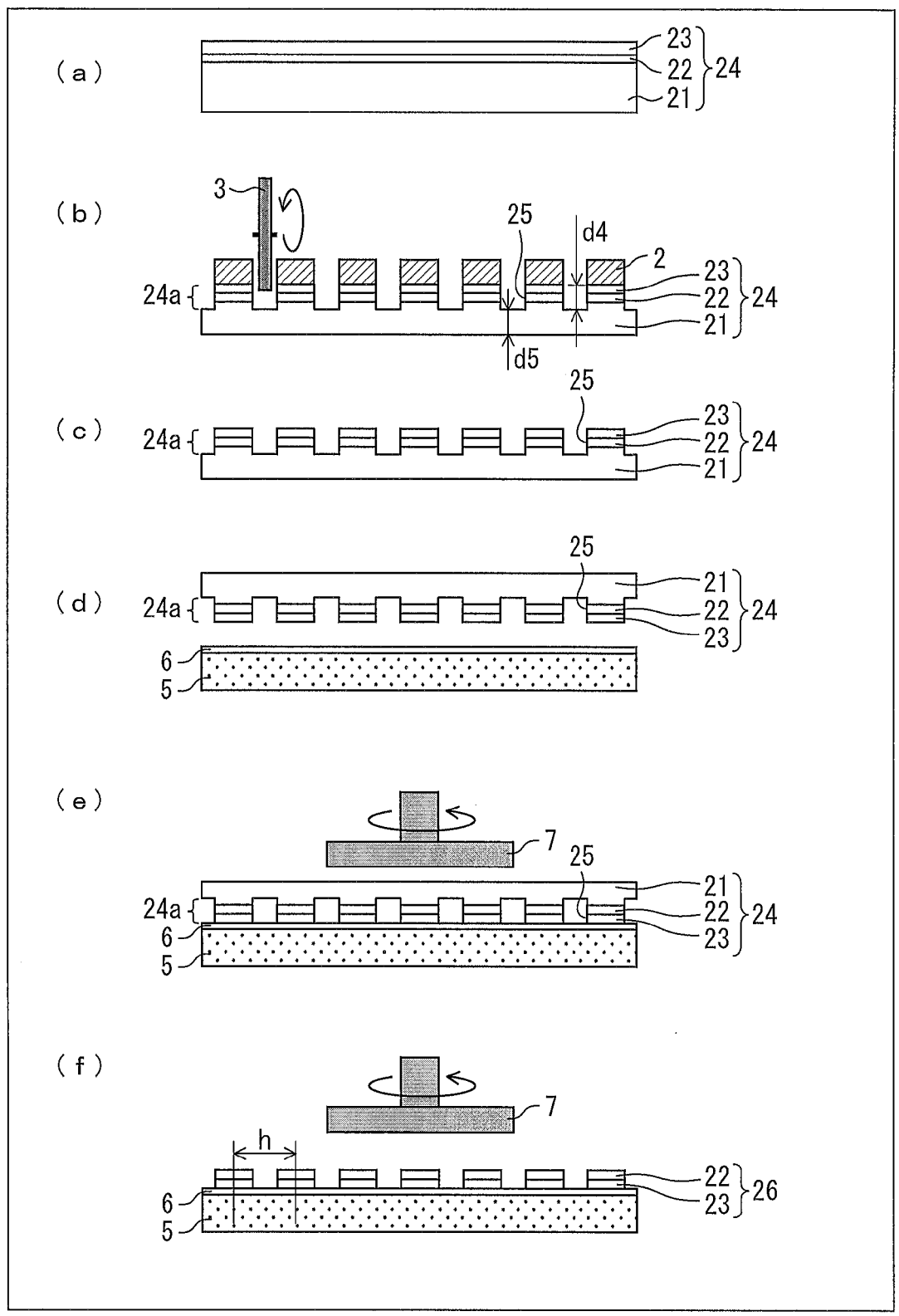
FIG. 9

FIG. 8 is a flow chart schematically showing main steps of a method for manufacturing a semiconductor apparatus according to the present embodiment. Further, FIG. 9 is a set of cross-sectional views (a) to (f) showing steps from S11 to S13 of FIG. 8 in the order in which they are executed. FIG. 10 is a set of cross-sectional views (a) to (c) showing steps from S31 to S33 of FIG. 8 in the order in which they are executed. The steps shown in S21 of FIG. 8 are identical to the steps shown in S21 of FIG. 1, and the cross-sectional views showing the steps in S21 in the order in which they are executed are identical to (a) to (c) of FIG. 3. Therefore, the steps shown in S21 of FIG. 8 in the order in which they are executed are omitted from the illustrations.

<<Method for Manufacturing a Semiconductor Apparatus>>

First, a method for manufacturing a semiconductor apparatus according to the present embodiment is described below.

First, the flow of a method for transferring a semiconductor element and a method for manufacturing a semiconductor apparatus according to the present embodiment is schematically described with reference to FIG. 8.

The present embodiment differs from Embodiment 1 in that the present embodiment uses an SOI (Silicon on Insulator) substrate as the semiconductor substrate and, as shown in FIG. 8, does not execute the oxidized film forming and planarizing step (S14) shown in FIG. 1. Further, since the present embodiment uses an SOI substrate as the semiconductor substrate and does not execute the oxidized film forming and planarizing step (S14), the present embodiment gives a final semiconductor apparatus different in configuration from that which is given by Embodiment 1. However, the basic process flow of the manufacturing steps of the present embodiment is the same as that of Embodiment 1.

Next, the flow of the method for manufacturing a semiconductor apparatus is described in more detail with reference to (a) to (f) of FIG. 9 through (a) to (c) of FIG. 10.

<Step of Forming Depressed Portions in the Semiconductor Substrate (S11)>

As mentioned above, the present embodiment uses an SOI substrate as the semiconductor substrate. Therefore, in the present embodiment, as shown in (a) of FIG. 9, first, an SOI substrate 24 is prepared as the semiconductor substrate.

The SOI substrate 24 has a three-layer structure. That is, the SOI substrate 24 includes: a Si substrate 21; a BOX layer 22 (silicon oxidized film layer), formed on the Si substrate 21, which is a buried oxide film; and a Si film 23, formed on the BOX layer 22, which serves as a surface Si layer (thin-film Si layer).

The SOI substrate 24 can be fabricated, for example, by a SIMOX (Separation by Implanted Oxygen) or the like for implanting a high concentration of oxygen ions into the Si substrate 21 (single-crystal Si wafer) at the same time as high-temperature annealing treatment and forming the BOX layer 22, which is a buried silicon oxidized film layer, at a predetermined depth from the surface to form an active layer (Si active layer) that is closer to the surface than the BOX layer 22. Of course, a commercially available SOI substrate may be used as the SOI substrate 24.

Next, as shown in (b) of FIG. 9, the SOI substrate 24 is coated with approximately several micrometers of resist 2 for surface protection. After that, in order that island-shaped patterns 24a (protruding portions, island patterns) each having a desired transfer area are formed as element sections, depressed portions 25 (slits) are formed in the resist 2 and each layer (i.e., the Si film 23, the BOX layer 22, and the Si substrate 21) of the SOI substrate 24 by carrying out half-cut dicing with a blade 3 or the like.

It should be noted that the size (area) of each individual element pattern 24a separated by the depressed portions 25 can be of the same size as a single-film pattern 1a (element pattern) of Embodiment 1. Further, the thickness of the SOI substrate 24, the depth d4 of each of the depressed portions 24 that are formed in the SOI substrate 24, and the thickens d5 of the bottom part (bottom wall, i.e., a connection part of the Si substrate 21) of each of the depressed portions 25 can be set according to the method of forming the depressed portions 25 and the thickness of the Si substrate 1, as in the case of the depth d1 and the thickness d2 in the Si substrate 1 and the depressed portions 4 of Embodiment 1.

Next, as shown in (c) of FIG. 9, the resist 2 is removed by ashing or the like, whereby the SOI substrate 24 is fabricated which has a pattern (concatenation of semiconductor elements) in which the element patterns 24a (semiconductor elements) element-separated (islanded) from each other by the depressed portions 25 have been connected by the bottom part (bottom wall) of each of the depressed portions 25.

<Step of Bonding the Semiconductor Substrate and the Intermediate Substrate Together (S12)>

Next, as shown in (d) of FIG. 9, the SOI substrate 24 is bonded onto an intermediate substrate 5 on which an adhesive material layer 6 has been stacked (applied or laminated), so that the surface of the SOI substrate 24 on which the element patterns have been formed and the surface of the intermediate substrate 5 on which the adhesive material layer 6 has been stacked face each other.

In the present embodiment, too, an insulating substrate can be used as the intermediate substrate 5, although this does not imply any limitation.

Further, in the present embodiment, too, it is preferable that the adhesive material layer 6 on the intermediate substrate 5 be applied or laminated onto at least 80% of the area of each element pattern 24a (each island pattern) separated by the depressed portions 25.

It should be noted that the present embodiment also uses a UV removable sheet as the adhesive material layer 6. For this reason, it is desirable that the intermediate substrate 5 be an insulating transparent substrate that transmits UV light.

<Element-Separating (Islanding) Step (S13)>

Next, as shown in (e) of FIG. 9, by using a grinder 7 as in Embodiment 1, back surface grinding is carried out from the back surface of the SOI substrate 24 (i.e., the surface opposite to the surface of the SOI substrate 24 on which the element patterns have been formed).

Thus, as shown in (f) of FIG. 9, the element patterns 24a connected together (concatenation of semiconductor elements) are separated (element-separated) into individual semiconductor elements 26 (laminates of the Si film 23 and the BOX layer 22) composed of the individual element patterns 24a. Since the present embodiment uses the SOI substrate 24 as the semiconductor substrate, the BOX layer 22, which is an oxidized film, functions as a grinding stopper during the back surface grinding. This gives the Si layer 23 a uniform thickness all over the intermediate substrate, thus making it possible to fabricate TFTs that vary little in characteristic. Further, since the BOX layer functions as a grinding stopper, the Si layer 23, which is ultrathin, can be formed uniformly on the intermediate substrate, while it is difficult to form such an ultrathin Si layer 23 in Embodiment 1.

In a case where the surface flatness of the BOX layer 22 exposed by the processes described in (e) and (f) of FIG. 9 is insufficient for the subsequent bonding, the surface of the BOX layer 22 may be further planarized by carrying out CMP treatment thereafter.

<Step of Islanding the Final Substrate (S21)>

As mentioned above, the steps shown in S21 of FIG. 8 are identical to the steps shown in S21 of FIG. 1, and the cross-sectional views showing the steps in S21 in the order in which they are executed are identical to (a) to (c) of FIG. 3.

Therefore, in the present embodiment, the final substrate 10 on which the raised portions 13 islanded in a matrix manner by the depressed portions 12 are formed at the predetermined pitch H is fabricated in the same manner as in Embodiment 1, except that the raised portions 13 serve as receptor patterns to be joined to the semiconductor elements 26 and that in consideration of the margins of junction with the semiconductor elements 26, the raised portions 13 are formed to be a size larger than the semiconductor element 26 transferred onto the intermediate substrate 5. Therefore, in the present embodiment, a detailed description of S21 is omitted.

<Step of Joining the Intermediate Substrate and the Final Substrate Together (S31) to the Step of Separating the Intermediate Substrate and the Final Substrate from Each Other (S33)>

Figure 10:
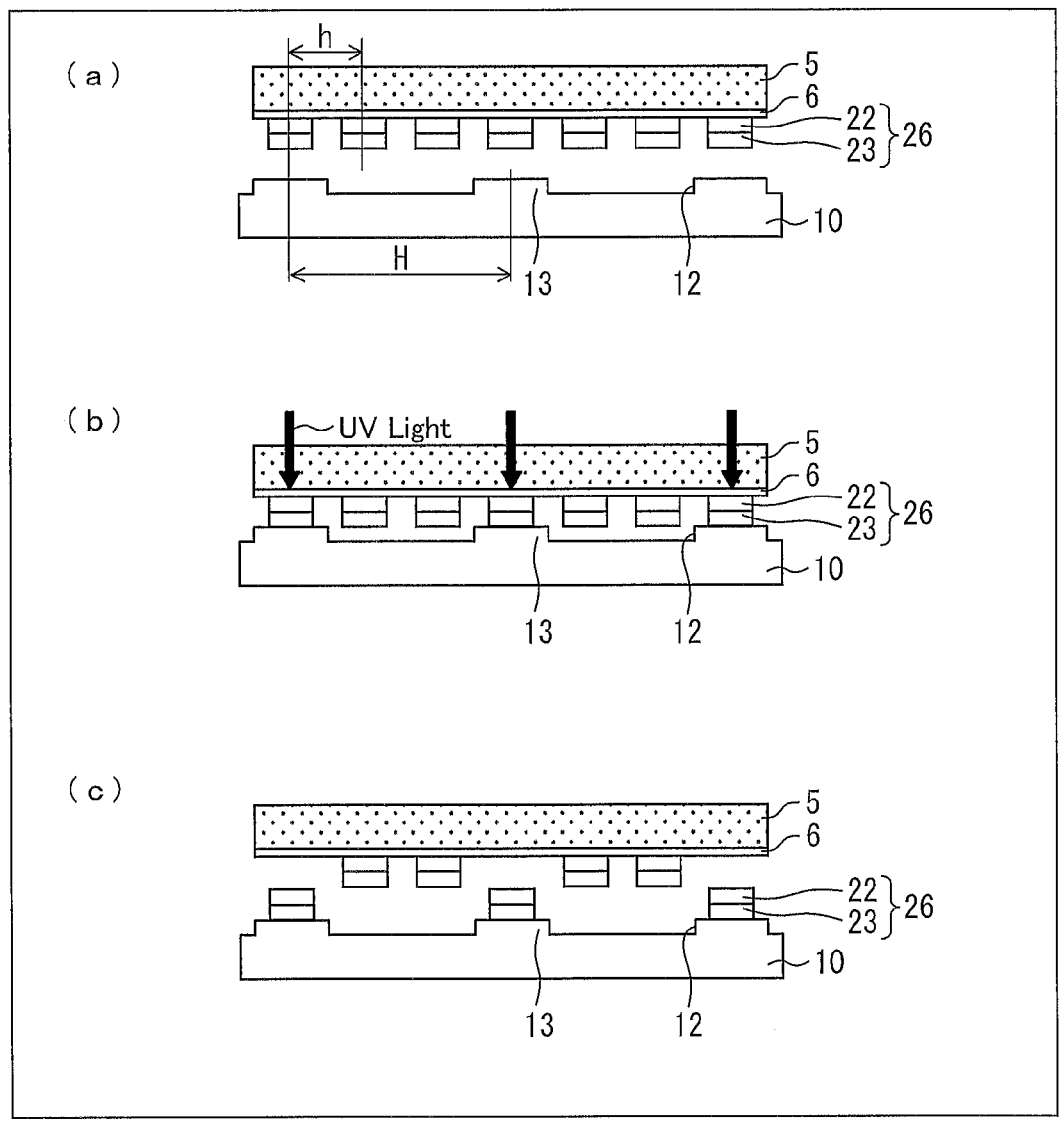
FIG. 10

As shown in (a) to (c) of FIG. 10, the steps shown in S31 to S33 of FIG. 8 are identical to the steps shown in S31 to S33 of FIG. 1, except that the semiconductor elements 26, instead of the Si single films 8, have been transferred to the intermediate substrate 5 and that the semiconductor elements 26 are selectively transferred from the intermediate substrate 5 to the final substrate 10.

That is, according to the present embodiment, first, as shown in (a) of FIG. 10, after the intermediate substrate 5 and the final substrate 10 have been surface-treated (hydrophilically treated) in the same manner as in Embodiment 1, they are joined together and subjected to preannealing in the same manner as in Embodiment 1. The preannealing causes the intermediate substrate 5 and the final substrate 10 to be tightly joined together at the bonding interface. After that, as shown in (b) of FIG. 10, only the semiconductor elements 26 that need to be transferred are selectively irradiated with UV light from the back surface of the intermediate substrate 5 in the same manner as in Embodiment 1, and as shown in (c) of FIG. 10, the intermediate substrate 5 and the final substrate 10 are vertically pulled away from each other, whereby the semiconductor elements 26 can be selectively transferred from the intermediate substrate 5 to the final substrate 10.

<<Effects>>

The transfer method makes it possible to transfer the semiconductor elements 26 including the Si film 23, which is a Si single film, from the SOI substrate 24 to the final substrate 10 with two transfers. Therefore, the present embodiment also makes it possible to reduce the number of transfers as compared with the conventional technique in transferring semiconductor elements using Si single films to a final substrate. Accordingly, the present embodiment also makes it possible to increase throughput and element-bonding accuracy, thus making it possible to improve yield and reduce cost.

Further, according to the present embodiment, too, by executing a common semiconductor device manufacturing process such as a TFT manufacturing process as needed after S33, a semiconductor apparatus can be manufactured in which high-performance semiconductor devices including the Si film 23 have been dispersedly arranged.

Further, as mentioned above, the present embodiment uses the SOI substrate 24 as the semiconductor substrate. Therefore, during the back surface grinding in S13, the BOX layer 22, which is an oxidized layer, functions as a grinding stopper. For this reason, there occur no variations in the grinding of the Si substrate 21, so that variations in the thickness of the semiconductor elements 26 can be eliminated.

Therefore, use of the semiconductor elements 26 as TFTs makes it possible to fabricate a display panel in which variations in the characteristics of the TFTs are smaller.

Further, since the BOX layer 22, which is an oxidized layer, has been formed in advance as mentioned above, the present embodiment makes it unnecessary to form an oxidized film after grinding as in S14 of Embodiment 1. For this reason, the present embodiment can further reduce the number of steps.

<<Configuration of a Semiconductor Apparatus>>

According to the present embodiment, the manufacturing method makes it possible to obtain a semiconductor apparatus in which as shown in (c) of FIG. 10, the raised portions 13 (island patterns) separated into an array by the depressed portions 12 have been formed on the final substrate 10 composed of an insulating substrate such as a glass substrate and semiconductor elements such as the semiconductor elements 26 or semiconductor devices including the semiconductor elements 26 have been joined onto the raised portions 13 by covalent bonding.

In other words, according to the present embodiment, a semiconductor apparatus can be obtained in which as shown in (c) of FIG. 10, the raised portions 13 (island patterns) separated into an array by the depressed portions 12 have been formed on the final substrate 10 composed of an insulating substrate such as a glass substrate and semiconductor elements such as the Si film 23, which is a Si single film, or semiconductor devices including the Si film 23 have been joined onto the raised portions 13 by covalent bonding or the like via the BOX layer 22, which is an oxidized film.

<<Modification>>

The present embodiment, too, has been described by taking, as an example, a case where the depressed portions 25 (slits) are formed in the resist 2 and each layer (i.e., the Si film 23, the BOX layer 22, the Si substrate 21) of the SOI substrate 24 by half-cut dicing in S11 as shown in (b) of FIG. 9.

However, the present embodiment is not to be limited to such an example. As in the descriptions in Embodiment 1, a similar matrix pattern may be formed by forming the depressed portions 25 (slits) in the resist 2 and each layer of the SOI substrate 24 by using photolithography and etching instead of half-cut dicing. That is, the etching used may be normal dry etching or wet etching. However, in order to form deeper slits, it is desirable to use Deep-RIE, Bosch process etching, or the like.

[Embodiment 3]

Another embodiment of the present invention is described below with reference to FIG. 11 through (a) to (c) of FIG. 13.

Figure 11:
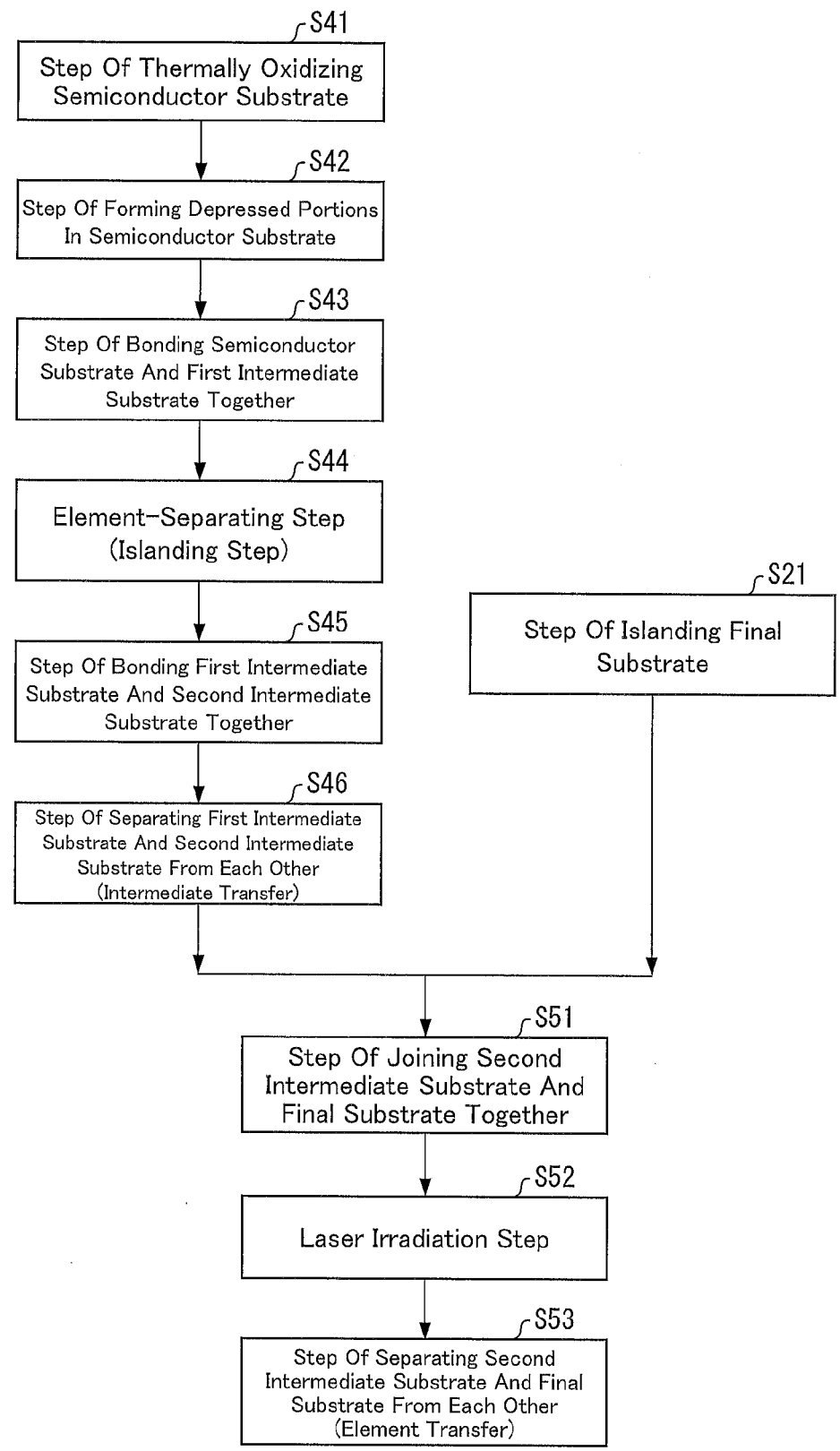
FIG. 11
Figure 12:
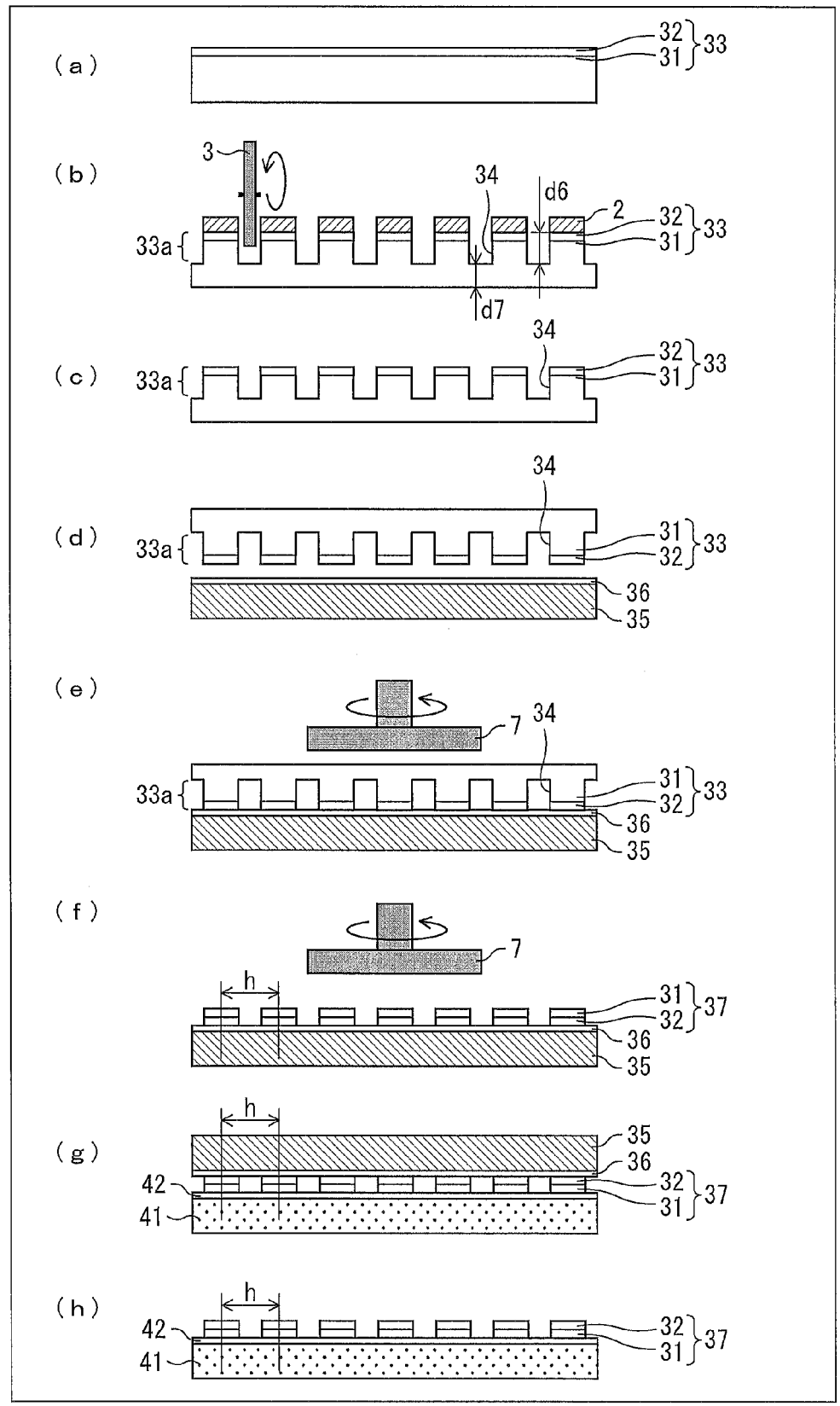
FIG. 12

FIG. 11 is a flow chart schematically showing main steps of a method for manufacturing a semiconductor apparatus according to the present embodiment. Further, FIG. 12 is a set of cross-sectional views (a) to (h) showing steps from S41 to S46 of FIG. 11 in the order in which they are executed. FIG. 13 is a set of cross-sectional views (a) to (c) showing steps from S51 to S53 of FIG. 11 in the order in which they are executed. The steps shown in S21 of FIG. 11 are identical to the steps shown in S21 of FIG. 1, and the cross-sectional views showing the steps in S21 in the order in which they are executed are identical to (a) to (c) of FIG. 3. Therefore, the steps shown in S21 of FIG. 11 in the order in which they are executed are omitted from the illustrations.

<<Method for Manufacturing a Semiconductor Apparatus>>

First, a method for manufacturing a semiconductor apparatus according to the present embodiment is described below.

First, the flow of a method for transferring a semiconductor element and a method for manufacturing a semiconductor apparatus according to the present embodiment is schematically described with reference to FIG. 11.

In the present embodiment, first, semiconductor elements are transferred from a semiconductor substrate serving as a base substrate to a first intermediate substrate (first intermediate transfer substrate) (first intermediate transfer step, first transfer step). After that, the semiconductor elements are transferred from the first intermediate substrate to a second intermediate substrate (second intermediate transfer substrate) (second intermediate transfer step, second transfer step). After that, the semiconductor elements are transferred from the second intermediate substrate to a final substrate (final transfer step, third transfer step).

Further, the present embodiment is described by taking, as an example, a case where a Si substrate with an oxidized film is used as the semiconductor substrate serving as the base substrate, the Si substrate being obtained by forming a Si oxidized film on a Si substrate, and the semiconductor elements to be transferred (transferred layer) are single-crystal Si thin films and Si oxidized films.

For this reason, as shown in FIG. 11, first, the step of thermally oxidizing the semiconductor substrate (S41) is executed in order to form an oxidized layer on a surface of the semiconductor substrate. Next, as a preprocess for transferring the semiconductor elements from the semiconductor substrate to the first intermediate substrate, the step of forming depressed portions in the semiconductor substrate (S42) is executed. After that, the step of bonding the semiconductor substrate and the first intermediate substrate together (S43) and the step of separating (islanding) the elements by back surface grinding (S44) are executed. Thus, the semiconductor elements are transferred from the semiconductor substrate to the first intermediate substrate. After that, the step of bonding the first intermediate substrate and the second intermediate substrate together (S45) and the step of separating the first intermediate substrate and the second intermediate substrate from each other (S46) are executed. Thus, the semiconductor elements are transferred from the first intermediate substrate to the second intermediate substrate.

Meanwhile, as a preprocess for transferring the semiconductor elements from the intermediate substrate to the final substrate, the step of islanding the final substrate (S21) is executed.

After that, the step of joining the second intermediate substrate and the final substrate together (S51), the laser irradiation step (S52), and the step of separating the second intermediate substrate and the final substrate from each other (S53) are executed, whereby the transfer of the semiconductor elements from the second intermediate substrate to the final substrate (element transfer) is completed.

Thus, a semiconductor apparatus is manufactured with the semiconductor elements selectively transferred dispersedly to the final substrate. Further, a semiconductor apparatus in which semiconductor devices have been dispersedly arranged can be manufactured by executing a common semiconductor device manufacturing process such as a TFT manufacturing process as needed on the final substrate.

Next, the flow of the method for manufacturing a semiconductor apparatus is described in more detail with reference to (a) to (h) of FIG. 12 through (a) to (c) of FIG. 13.

<Step of Thermally Oxidizing the Semiconductor Substrate (S41)>

As mentioned above, the Si substrate with an oxidized film is used as the semiconductor substrate in the present embodiment. For this reason, in the present embodiment, first, as shown in (a) of FIG. 12, by thermally oxidizing a surface of a Si substrate 31, for example, at 900 to 1000° C. for approximately one to three hours, a thermally oxidized film 32 approximately 50 to 100 nm thick is formed on the surface of the Si substrate 31. Thus, a Si substrate 33 with an oxidized film is prepared which has a two-layer structure in which the thermally oxidized film 32 composed of a silicon oxidized film has been formed on the Si substrate 31.

It should be noted that the thermally oxidization can be carried out by using a vertical furnace or a horizontal furnace. Further, in a case where a substrate other than a Si substrate is used, an oxidized film may be formed by CVD or the like.

<Step of Forming Depressed Portions in the Semiconductor Substrate (S42)>

Next, as shown in (b) of FIG. 12, the Si substrate 33 with an oxidized film is coated with approximately several micrometers of resist 2 for surface protection. After that, in order that island-shaped patterns 33a (protruding portions, island patterns) each having a desired transfer area are obtained as element sections, depressed portions 34 (slits) are formed in the resist 2 and each layer (i.e., the thermally oxidized film 32 and the Si substrate 31) of the Si substrate 33 with an oxidized film by carrying out half-cut dicing with a blade 3 or the like.

It should be noted that the size (two-dimensional size, area) of each individual element pattern 33a separated by the depressed portions 34 can be of the same size as a single-film pattern 1a (element pattern) of Embodiment 1. Further, the thickness of the Si substrate 33 with an oxidized film, the depth d6 of each of the depressed portions 34 that are formed in the Si substrate 33 with an oxidized film, and the thickens d7 of the bottom part (bottom wall, i.e., a connection part of the Si substrate 31) of each of the depressed portions 34 can be set according to the method of forming the depressed portions 34 and the thickness of the Si substrate 1, as in the case of the depth d1 and the thickness d2 in the Si substrate 1 and the depressed portions 4 of Embodiment 1.

Next, as shown in (c) of FIG. 12, the resist 2 is removed by ashing or the like, whereby the Si substrate 33 with an oxidized film is fabricated which has a pattern (concatenation of semiconductor elements) in which the semiconductor elements separated (islanded) from each other by the depressed portions 34 have been connected by the bottom part (bottom wall) of each of the depressed portions 34.

<Step of Bonding the Semiconductor Substrate and the First Intermediate Substrate Together (S43)>

Next, as shown in (d) of FIG. 12, the Si substrate 33 with an oxidized film is bonded onto a first intermediate substrate 35 (first intermediate transfer substrate) on which an adhesive material layer 36 has been stacked (applied or laminated), so that the surface of the Si substrate 33 with an oxidized film on which the element patterns have been formed and the surface of the first intermediate substrate 35 on which the adhesive material layer 36 has been stacked face each other.

In the present embodiment, an insulating substrate can be used as the first intermediate substrate 35, although this does not imply any limitation.

Further, as the adhesive material layer 36, a resin, a sheet, or the like that becomes removable by decreasing in adhesive force when external force is applied, e.g., upon UV light (ultraviolet radiation) irradiation or heat treatment can be used, as in S12.

Note, however, that in the present embodiment, as mentioned above, the elements are transferred from the first intermediate substrate 35 to a second intermediate substrate 41 (see (g) of FIG. 12) (S45) after the element-separating step (S44). For this reason, it is preferable that the first intermediate substrate 35 and the second intermediate substrate 41 be provided with adhesive material layers different in removing means (type of external energy for decreasing the adhesive force) from each other.

In other words, it is preferable the adhesive material layer 36 (first adhesive material layer) that is used for bonding semiconductor elements 37 (see (g) of FIG. 12) composed of the element patterns 33a to the first intermediate substrate 35 be removed from the semiconductor elements 37 in a method different from an adhesive material layer 42 (see (g) of FIG. 12, second adhesive material layer) that is used for bonding the semiconductor elements 37 to the second intermediate substrate 41.

By thus using, as the adhesive material layer 36 and the adhesive material layer 42, adhesive material layers different in removing means from each other, the adhesive material layer 36 can be removed without a decrease in adhesive force of the adhesive material layer 42 when external force that satisfies the conditions for removal of the adhesive material layer 36 is applied to the adhesive material layer 36 in S46. This makes it possible to cause the semiconductor elements 37 to be stably transferred from the first intermediate substrate 35 to the second intermediate substrate 41.

Therefore, in a case where the adhesive material layer 42 that is used for bonding the semiconductor elements 37 to the second intermediate substrate 41 to be bonded to the final substrate 10 is a UV removable sheet as in Embodiments 1 and 2, for example, it is preferable that the adhesive material layer 36 be a resin or a sheet that can be removed by heat treatment, for example.

Further, it should be noted here that the adhesive force of the adhesive material layer 36 after the application of heat to the adhesive material layer 36 (i.e., after a decrease in adhesive force) is made lower than the adhesive force of the adhesive material layer 42. This makes it possible to transfer the semiconductor elements 37 from the first intermediate substrate 35 to the second intermediate substrate 41.

It should be noted that the present embodiment is described below by taking, as an example, a case where the adhesive material layer 36 is a thermally removable sheet and the adhesive material layer 42 is a UV removable sheet. However, the present embodiment is not to be limited to such an example, and it is needless to say that the adhesive material layer 36 may be a UV removable sheet and the adhesive material layer 42 may be a thermally removable sheet. Further, in the present embodiment, too, it is desirable that the intermediate substrate to be provided with a UV removable sheet as an adhesive material layer be an insulating transparent substrate that transmits UV light.

Further, in the present embodiment is also described by taking, as an example, a case where the adhesive material layer 36 and the adhesive material layer 42 have been laminated on the entire surfaces of the intermediate substrates, respectively. However, the present embodiment is not to be limited to such an example.

However, in the present embodiment, too, it is preferable that the adhesive material layer 42 on the second intermediate substrate 41 to be joined to the final substrate 10 be applied or laminated onto at least 80% of the bonding surface of each of the semiconductor elements 37 composed of the respective element patterns 33a.

This can give sufficient adhesion to prevent the semiconductor elements 37 from being removed and falling off from the second intermediate substrate 41 before the final transfer or, in particular, during the cleaning treatment in S51. This makes it possible to suppress a decrease in yield.

Further, as for the adhesive material layer 36 on the first intermediate substrate 35, it is preferable that the adhesive material layer 36 be applied or laminated onto at least 80% of the area of the bonding surface of each element pattern 33a, in order that sufficient adhesive force is secured.

<Element-Separating (Islanding) Step (S44)>

Next, as shown in (e) of FIG. 12, by using a grinder 7 as in Embodiment 1, back surface grinding is carried out from the back surface of the Si substrate 33 with an oxidized film (i.e., the surface opposite to the surface of the Si substrate 33 with an oxidized film on which the element patterns have been formed).

Thus, as shown in (f) of FIG. 12, the element patterns 33a connected together (concatenation of semiconductor elements) shown in (e) of FIG. 9 are separated (element-separated) into individual semiconductor elements 37 (laminates of a Si layer constituting the Si substrate 31 and a thermally oxidized film 32) composed of the individual element patterns 33a.

Thus, the first intermediate substrate 35 is fabricated on which a plurality of semiconductor elements 37 have been arranged at a predetermined pitch h.

<Step of Bonding the First Intermediate Substrate and the Second Intermediate Substrate Together (S45)>

Next, as shown in (g) of FIG. 12, the first intermediate substrate 35 is bonded onto the second intermediate substrate 41 on which the adhesive material layer 42 has been stacked (applied or laminated), so that the semiconductor elements 37 attached to the first intermediate substrate 35 by the adhesive material layer 36 and the surface of the second intermediate substrate 41 on which the adhesive material layer 42 has been stacked face each other.

<Step of Separating the First Intermediate Substrate and the Second Intermediate Substrate from Each Other (S46)>

After that, the adhesive force of the adhesive material layer 36 is decreased by heat-treating the adhesive material layer 36 between the semiconductor elements 37 and the first intermediate substrate 35. It should be noted that in a case where the adhesive material layer 36 is a thermally removable sheet as described above, the adhesive material layer 36 may include a photothermal conversion layer as mentioned above.

The heat treatment can be carried out by irradiating the adhesive material layer 36, for example, with laser light from the back surface of the first intermediate substrate 35 (i.e., the surface opposite to the transfer surfaces (holding surfaces) of the semiconductor elements 37).

Usable examples of lasers that are used for irradiation with the laser light include, but are not to be limited to, a YAG laser, an excimer laser, etc.

Further, the irradiation conditions (such as irradiation intensity and irradiation time) need only be appropriately set according to the type of the adhesive material layer 36 so that the conditions for removal of the adhesive material layer 36 are satisfied, and are not to be particularly limited.

Further, in the present embodiment, the semiconductor elements 37 are directly moved from the first intermediate substrate 35 to the second intermediate substrate 41. Therefore, in such a case as that described above where the adhesive material layer 36 is a thermally removable sheet and the adhesive material layer 42 is a UV removable sheet, it is not always necessary to carry out local heating. For this reason, the heat treatment may be carried out by using heating means such as an oven, a hot plate, or a heating furnace. For example, in a case where the thermally removable sheet is a Revalpha, the thermally removable sheet can be easily removed with slight force by heating it on a hot plate at 160° C. for approximately ten minutes, albeit depending on the specifications of the Revalpha.

After that, the first intermediate substrate 35 and the second intermediate substrate 41 are vertically pulled away from each other, whereby as shown in (h) of FIG. 12, the semiconductor elements 37 are transferred from the first intermediate substrate 35 to the second intermediate substrate 41.

<Step of Islanding the Final Substrate (S21)>

As mentioned above, the steps shown in S21 of FIG. 11 are identical to the steps shown in S21 of FIG. 1, and the cross-sectional views showing the steps in S21 in the order in which they are executed are identical to (a) to (c) of FIG. 3.

Therefore, in the present embodiment, the final substrate 10 in which the raised portions 13 islanded in a matrix manner by the depressed portions 12 are formed at the predetermined pitch H is fabricated in the same manner as in Embodiment 1, except that the raised portions 13 serve as receptor patterns to be bonded to the semiconductor elements 37 and that in consideration of the margins of junction with the semiconductor elements 37, the raised portions 13 are formed to be a size larger than the semiconductor element 37 transferred onto the second intermediate substrate 41. Therefore, in the present embodiment, too, a detailed description of S21 is omitted.

<Step of Joining the Second Intermediate Substrate and the Final Substrate Together (S51) to the Step of Separating the Second Intermediate Substrate and the Final Substrate from Each Other (S53)>

Figure 13:
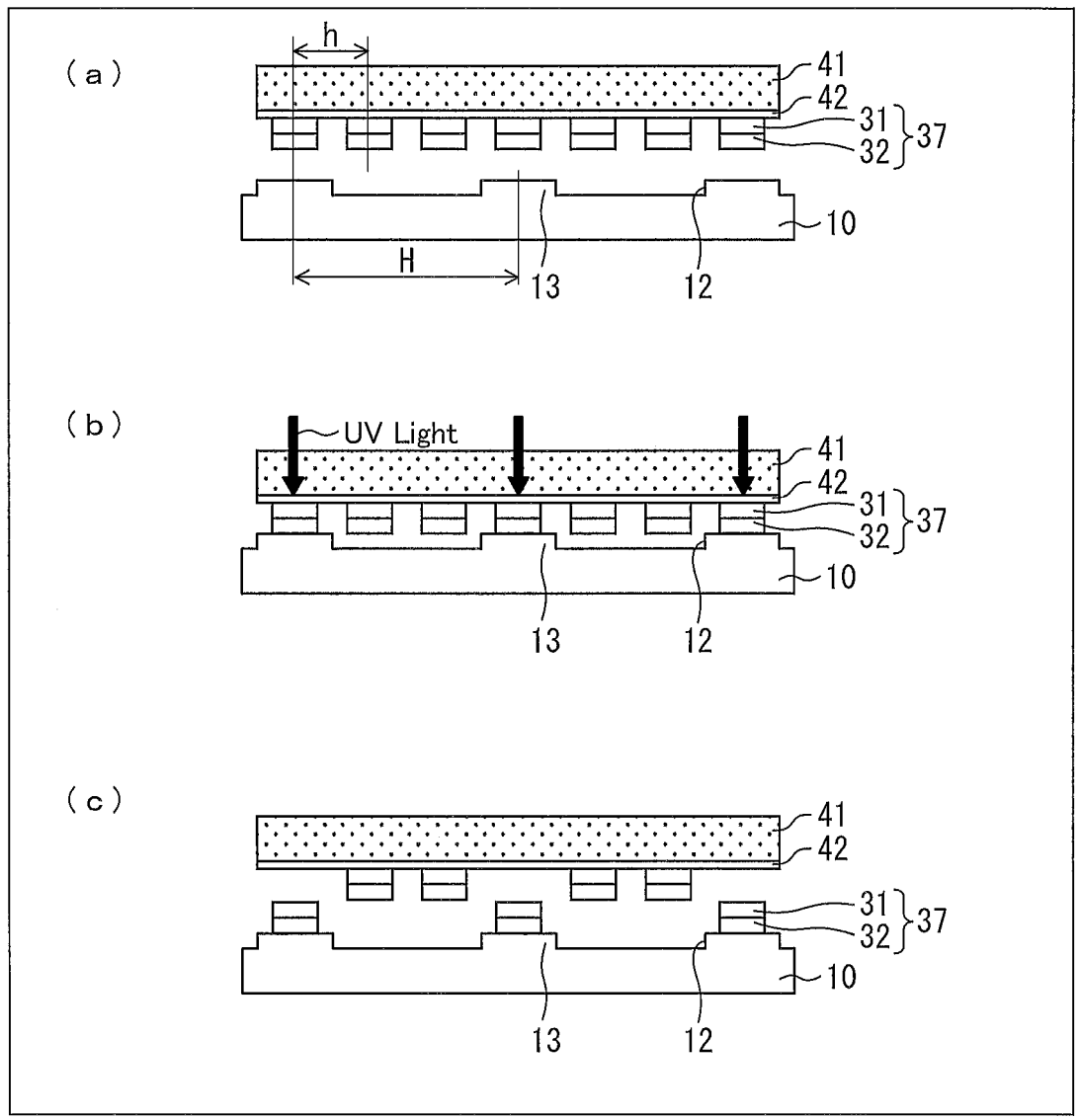
FIG. 13

As shown in (a) to (c) of FIG. 13, the steps shown in S51 to S53 of FIG. 11 are identical to the steps shown in S31 to S33 of FIG. 1, except that the semiconductor elements 37 are selectively transferred from the second intermediate substrate 41 to the final substrate 10 by joining, to the final substrate 10, the second intermediate substrate 41 on which the semiconductor elements 37 have been transferred.

That is, according to the present embodiment, first, as shown in (a) of FIG. 13, after the second intermediate substrate 41 and the final substrate 10 have been surface-treated (hydrophilically treated) in the same manner as in Embodiment 1, they are bonded to each other and subjected to pre-annealing in the same manner as in Embodiment 1. The preannealing causes the second intermediate substrate 41 and the final substrate 10 to be tightly joined together at the bonding interface. After that, as shown in (b) of FIG. 13, only the semiconductor elements 37 to be transferred are selectively irradiated with UV light from the back surface of the second intermediate substrate 41 in the same manner as in Embodiment 1, and as shown in (c) of FIG. 13, the second intermediate substrate 41 and the final substrate 10 are vertically pulled away from each other, whereby the semiconductor elements 37 can be selectively transferred from the second intermediate substrate 41 to the final substrate 10.

<<Effects>>

The transfer method makes it possible to transfer the semiconductor elements 37 from the Si substrate 33 with an oxidized film to the final substrate 10 with three transfers. Therefore, the present embodiment also makes it possible to reduce the number of transfers as compared with the conventional technique in transferring semiconductor elements using Si single films to a final substrate. Accordingly, the present embodiment also makes it possible to increase throughput and element-bonding accuracy, thus making it possible to improve yield and reduce cost.

Further, according to the present embodiment, too, by executing a common semiconductor device manufacturing process such as a TFT manufacturing process as needed after S33, a semiconductor apparatus can be manufactured in which high-performance semiconductor devices each including a Si layer constituting the Si substrate 31 have been dispersedly arranged.

Further, since the thermally oxidized film 32 has been formed in advance as mentioned above, the present embodiment makes it unnecessary to form an oxidized film after grinding as in S14 of Embodiment 1. Moreover, since the thermally oxidized film has a flat surface and, therefore, can be more easily joined to the final substrate.

<<Configuration of a Semiconductor Apparatus>>

According to the present embodiment, the manufacturing method makes it possible to obtain a semiconductor apparatus in which as shown in (c) of FIG. 13, the raised portions 13 (island patterns) separated into an array by the depressed portions 12 have been formed on the final substrate 10 composed of an insulating substrate such as a glass substrate and semiconductor elements such as the semiconductor elements 37 or semiconductor devices including the semiconductor elements 37 have been joined onto the raised portions 13 by covalent bonding.

In other words, according to the present embodiment, a semiconductor apparatus can be obtained in which as shown in (c) of FIG. 13, the raised portions 13 (island patterns) separated into an array by the depressed portions 12 have been formed on the final substrate 10 composed of an insulating substrate such as a glass substrate and semiconductor elements such as Si films composed of part of the Si substrate 31 or semiconductor devices including the Si films have been joined onto the raised portions 13 by covalent bonding or the like via the thermally oxidized film 32 (Si oxidized film) stacked on the Si films.

<<Modification>>

The present embodiment, too, has been described by taking, as an example, a case where the depressed portions 34 (slits) are formed in the resist 2 and each layer (i.e., the thermally oxidized film 32 and the Si substrate 31) of the Si substrate 33 with an oxidized film by half-cut dicing in S11 as shown in (b) of FIG. 12.

However, the present embodiment is not to be limited to such an example. As in the descriptions in Embodiment 1, a similar matrix pattern may be formed by forming the depressed portions 34 (slits) in the resist 2 and each layer of the Si substrate 33 with an oxidized film by using photolithography and etching instead of half-cut dicing. That is, the etching used may be normal dry etching or wet etching. However, in order to form deeper slits, it is desirable to use Deep-RIE, Bosch process etching, or the like.

[Embodiment 4]

Another embodiment of the present invention is described below with reference to FIG. 14 through (a) to (c) of FIG. 18.

In the present embodiment, a case is described where the semiconductor substrate serving as the base substrate is a Si substrate with an oxidized film, the Si substrate being obtained by forming a thermally oxidized film on a surface of a Si substrate, and semiconductor devices are formed as semiconductor elements on the semiconductor substrate by using a process that is commonly used for IC.

However, the process that is used in the present embodiment is an example of a common IC process, and the present embodiment is not to be limited to such a process. Further, in the present embodiment, too, the final substrate is an insulating substrate, but the present embodiment is not to be limited to this.

Figure 14:
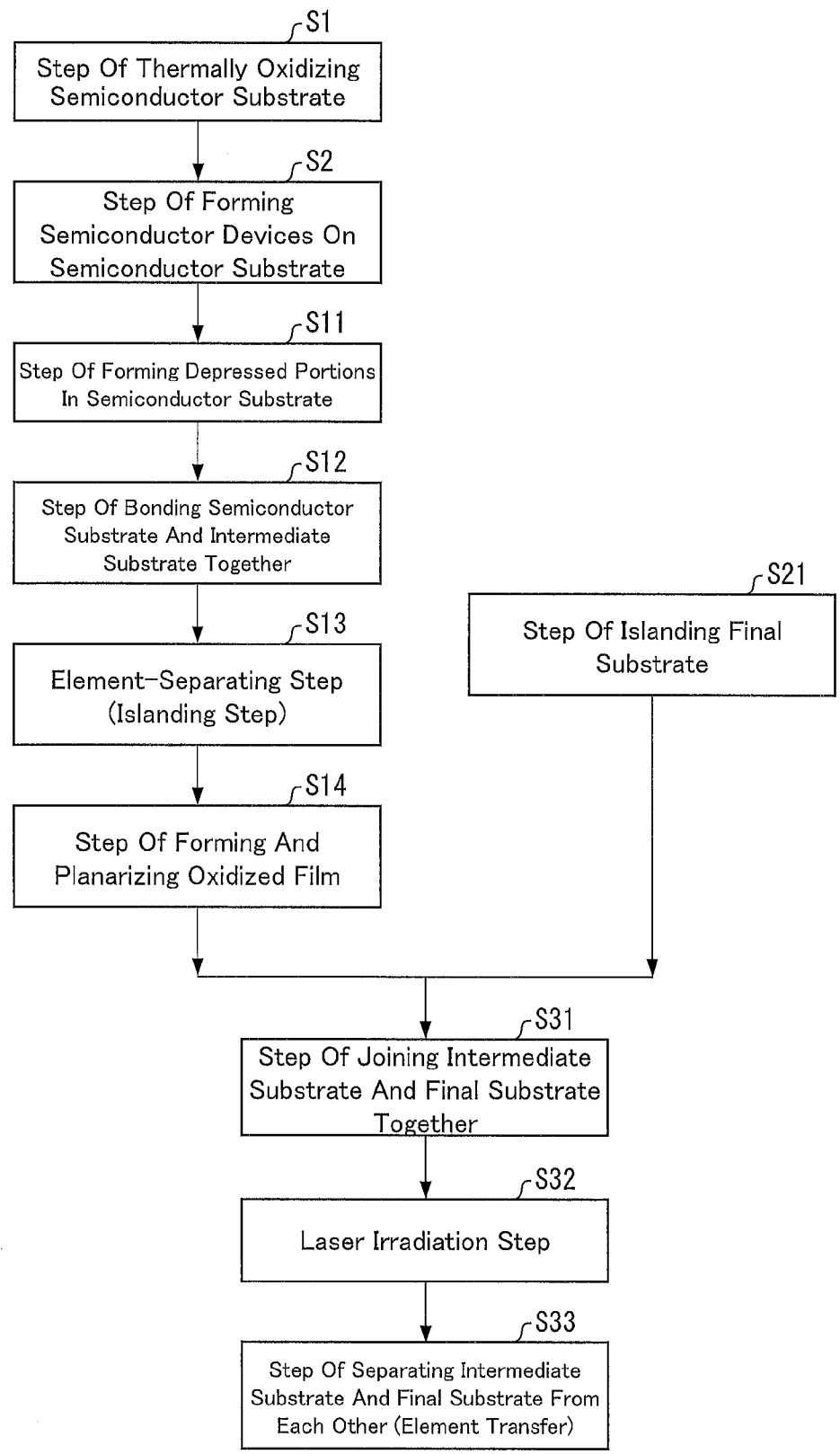
FIG. 14
Figure 17:
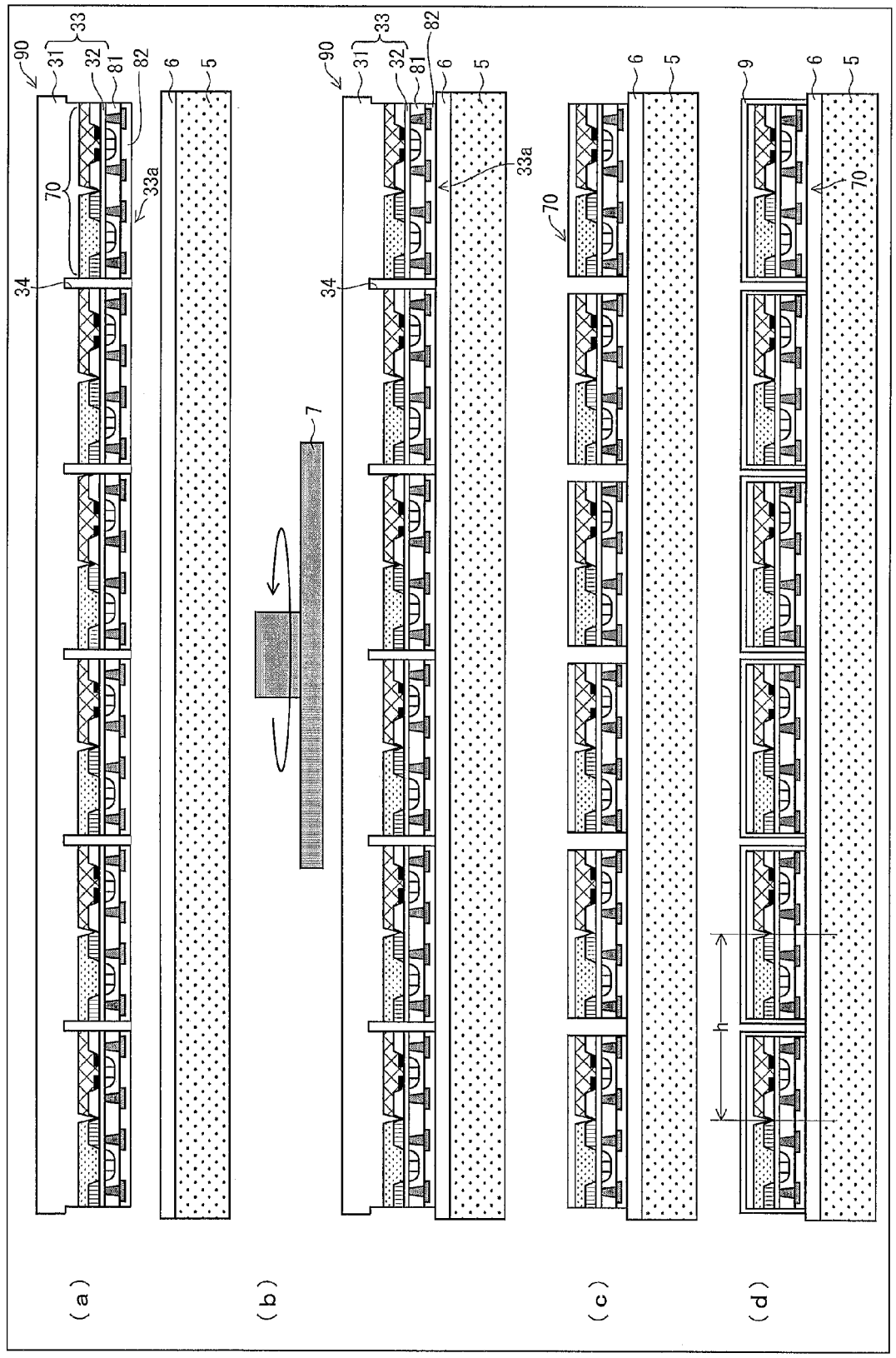
FIG. 17

FIG. 14 is a flow chart schematically showing main steps of a method for manufacturing a semiconductor apparatus according to the present embodiment. Further, (a) to (f) of FIG. 15 through (a) to (d) of FIG. 17 are cross-sectional views showing steps from S1 to S14 of FIG. 14 in the order in which they are executed. FIG. 18 is a set of cross-sectional views (a) to (c) showing steps from S31 to S33 of FIG. 14 in the order in which they are executed. The steps shown in S21 of FIG. 14 are identical to the steps shown in S21 of FIG. 1, and the cross-sectional views showing the steps in S21 in the order in which they are executed are identical to (a) to (c) of FIG. 3. Therefore, the steps shown in S21 of FIG. 14 in the order in which they are executed are omitted from the illustrations.

<<Method for Manufacturing a Semiconductor Apparatus>>

First, a method for manufacturing a semiconductor apparatus according to the present embodiment is described below.

First, the flow of a method for transferring a semiconductor element and a method for manufacturing a semiconductor apparatus according to the present embodiment is schematically described with reference to FIG. 14.

The present embodiment differs from Embodiment 1 in that as shown in FIG. 14, the step of thermally oxidizing a semiconductor substrate (S1) and the step of forming semiconductor devices on the semiconductor substrate (S2) are executed in this order prior to the step of forming depressed portions in the semiconductor substrate (S11).

Next, the flow of the method for manufacturing a semiconductor apparatus is described in more detail with reference to (a) to (f) of FIG. 15 through (a) to (d) of FIG. 17.

<Step of Thermally Oxidizing the Semiconductor Substrate (S1)>

Figure 15:
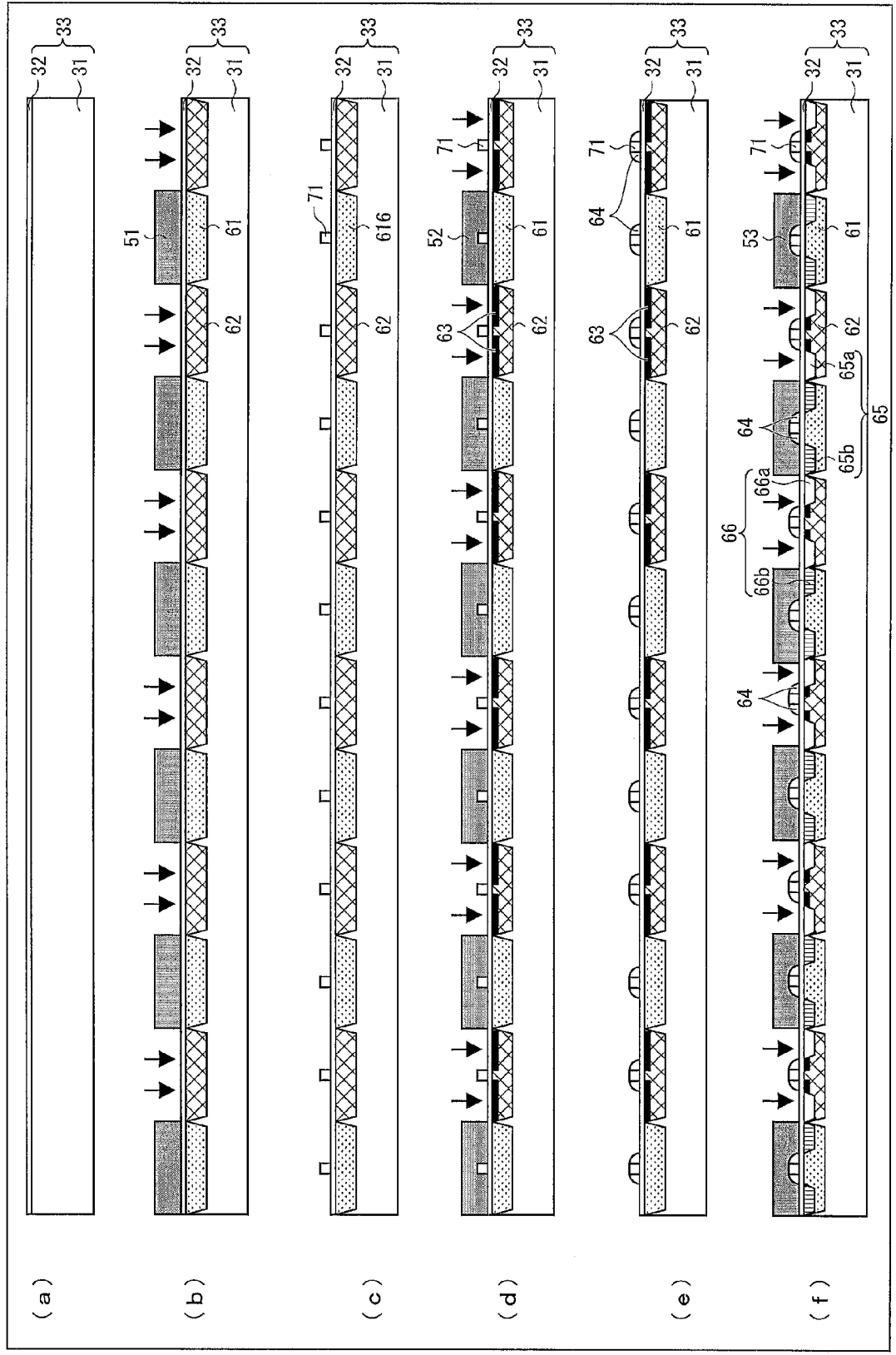
FIG. 15

As shown in (a) of FIG. 15, the step shown in 51 of FIG. 14 is identical to S41 shown in (a) of FIG. 12.

In the present embodiment, as in Embodiment 3, the semiconductor substrate used is a Si substrate with an oxidized film. For this reason, in the present embodiment, too, first, as shown in (a) of FIG. 15, a thermally oxidized film 32 approximately 50 to 100 nm in thickness is formed on a surface of a Si substrate 31 by thermally oxidizing the surface of the Si substrate 31 in the same manner as in Embodiment 3. Thus, a Si substrate 33 with an oxidized film is prepared which has a two-layer structure in which the thermally oxidized film 32 composed of a silicon oxidized film has been formed on the Si substrate 31. It should be noted, of course, that in the present embodiment, too, in a case where a substrate other than a Si substrate is used, an oxidized film may be formed by CVD or the like.

<Step of Forming Semiconductor Apparatuses on the Semiconductor Substrate (S2)>

Next, as shown in (b) of FIG. 15, a resist pattern 51 is formed by photolithography in a predetermined region on the thermally oxidized film 32. After that, by using the resist pattern 51 as a mask, boron-implanted p-type well regions 62 (hereinafter referred to as "p-wells") are formed on the Si substrate 31. Further, although not illustrated, phosphor-implanted n-type well regions 61 (hereinafter referred to as "n-wells") are formed in a similar manner.

Then, although not illustrated, by using the LOCOS (Local Oxidation of Silicon) oxidation method that is used in a common IC process, the n-wells 61 and the p-wells 62 are element-separated.

After that, in order to adjust the threshold voltage of each of the N-channel MOS (Metal Oxide Semiconductor) transistors (NMOS) and P-channel MOS transistor (PMOS), ions are implanted in each channel region within the n-wells 61 and the p-wells 62 by using the resist as a mask as needed. For example, boron ions are implanted under implantation conditions where the implantation energy is 10 to 40 keV and the dose amount is approximately $1 \times 10^{12}$ to $1 \times 10^{13}/cm^{2}$.

Then, as shown in (c) of FIG. 15, gate electrodes 71 approximately 200 to 400 nm in thickness are formed by patterning a gate electrode material by photolithography after forming the material into a film or sputtering the material.

A possible example of the material for the gate electrodes 71 is a material obtained by forming $n^{+}$ Poly gates and $p^{+}$ Poly gates doped with high concentrations of phosphor ions or boron ions into films by CVD or a material formed by sputtering a metal such as W, Mo, or MoW.

Further, an example of an etching method for forming a pattern of the gate electrodes 71 is dry etching that involves the use of a chlorine gas such as $CCl_4$, $BCl_3$, $SiCl_4$, or $Cl_2$ or a fluorine gas such as $SF_6$, $CF_4$, or $NF_3$.

Then, as shown in (d) of FIG. 15, a resist pattern 52 is formed in such a way as to cover the gate electrodes 71 on the n-wells 61, and with the gate electrodes 71 and the resist pattern 52 as a mask, LDD (Lightly doped drain) regions 63 are formed in the NMOS by implanting low concentrations of phosphor ions. The phosphor ion implantation conditions here are set so that the implantation energy is 10 to 40 keV and the dose amount is approximately $1 \times 10^{13}$ to $1 \times 10^{14}/cm^{2}$, for example. Of course, in a case where an LDD structure is not required, the step of forming the LDD regions can be omitted.

Then, etch back is carried out after an insulating film such as a high-temperature oxidized film, approximately 200 to 600 nm in thickness, has been formed on the entire surface of the Si substrate 33 with an oxidized film. Thus, as shown in (e) of FIG. 15, side walls 64 are formed with a high degree of accuracy in a self-aligning manner on both sides of each of the gate electrodes 71. It should be noted that the length of each of the LDD regions 63 is defined by the width of each of the side walls 64.

Next, as shown in (f) of FIG. 15, a resist pattern 53 is formed in such a way as to cover the gate electrodes 71 on the n-wells 64 and the side walls 61 on both sides of each of the gate electrodes 71.

After that, by implanting high concentrations of phosphor ions with use, as a mask, of the gate electrodes 71 on the p-wells 62 and the side walls 64 on both sides of each of the gate electrodes 71 and the resist pattern 53 on the n-wells 61, a source region 65a and a drain region 66a, which are $n^{+}$ regions, are formed on each of the p-wells 62.

Further, by implanting high concentrations of boron ions with use, as a mask, of the gate electrodes 71 on the n-wells 61 and the side walls 64 on both sides of each of the gate electrodes 71 and the resist pattern (not illustrated) on the p-wells 62, a source region 65b and a drain region 66b, which are $p^{+}$ regions, are formed on each of the n-wells 61.

Specifically, for example, by implanting phosphor ions or arsenic ions into the $n^{+}$ regions under conditions where the implantation energy is 20 to 100 keV and the dose amount is approximately $1 \times 10^{15}$ to $5 \times 10^{15}/cm^{2}$, a source region 65a and a drain region 66a, which are $n^{+}$ regions, are formed on each of the p-wells 62. Further, by implanting boron ions or $BF_2$ ions into the $p^{+}$ regions under conditions where the implantation energy is 20 to 100 keV and the dose amount is approximately $1 \times 10^{15}$ to $5 \times 10^{15}/cm^{2}$, a source region 65b and a drain region 66b, which are $p^{+}$ regions, are formed on each of the n-wells 61. In the following, the source regions

65a and 65b are collectively referred to as "source regions 65" and the drain regions 66a and 66b are collectively referred to as "drain regions 66".

Figure 16:
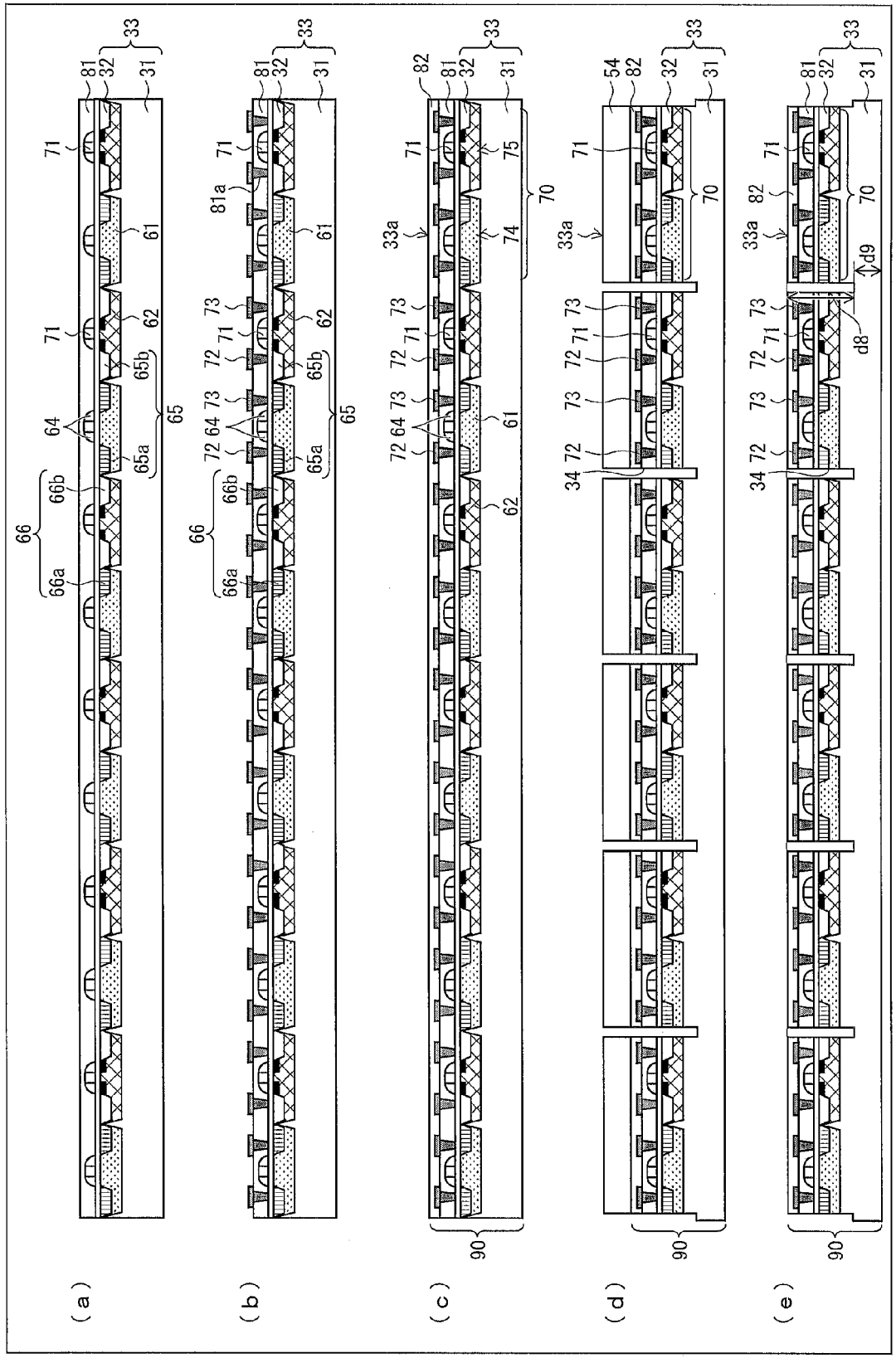
FIG. 16

Next, as shown in (a) of FIG. 16, an interlayer insulating film 81 is formed on the entire surface of the thermally oxidized film 32 by carrying out a CVD method on the Si substrate 31. The interlayer insulating film 81 used is a SiNO film approximately 50 to 200 nm in film thickness, a TEOS film approximately 200 to 600 nm in film thickness, or a laminate film thereof. After that, the impurity ions implanted in the source regions 65 and the drain regions 66 are activated by carrying out activation annealing on the Si substrate 31 at a temperature of 800 to 900° C. for approximately one to two hours.

Then, as shown in (b) of FIG. 16, contact holes 81a are formed in the interlayer insulating film 81 by photolithography and etching. The etching method employed here for forming the contact holes 81a is dry etching that involves the use of a gas such as $Cl_2$ or wet etching that involves the use of HF or the like.

Then, a metal film of Al, AlSi, or Ti, a laminate film thereof, or the like is formed on the entire surface of the interlayer insulating film 81 by sputtering, and the metal films formed on the interlayer insulating film 81 and the source and drain regions 65 and 66 are brought into contact via the contact holes 81a. After that, by photolithographic patterning, source electrodes 72 and drain electrodes 73, approximately 400 nm in thickness, connected to the source regions 65 and the drain regions 66 respectively are formed as shown in (b) of FIG. 16.

Then, as shown in (c) of FIG. 16, an interlayer insulating film 82 is formed on the entire surface of the interlayer insulating film 81 by carrying out a CVD method on the Si substrate 31. The interlayer insulating film 82 used can be a SiN film approximately 100 to 300 nm in film thickness, a TEOS film approximately 200 to 600 nm in film thickness, a laminate film thereof, or the like. Further, the SiN film thus formed may be subjected to hydrogen sinter at a temperature of 450° C. for thirty to sixty minutes.

After the interlayer insulating film 82 has been formed, the interlayer insulating film 82 is planarized by grinding a surface of the interlayer insulating film 82 by CMP. It should be noted that the back surface of the Si substrate 31 may be ground at the same time so that laser light does not scatter in the subsequent step of laser irradiation.

Thus, as a semiconductor substrate provided with semiconductor elements (semiconductor devices), a semiconductor device substrate 90 is fabricated in which element patterns 33a each including a CMOS (Complementary MOS) transistor 70 (semiconductor device) composed of a PMOS 74 and an NMOS 75 have been densely formed on the Si substrate 33 with an oxidized film.

<Step of Forming Depressed Portions in the Semiconductor Substrate (S11)>

Then, a resist pattern 54 is formed on the entire surface of the interlayer insulating film 82 in the semiconductor device substrate 90. Next, as shown in (d) of FIG. 16, in order that island-shaped patterns 33a (protruding portions, island patterns) each including a CMOS transistor and having a desired transfer area are obtained as element sections, depressed portions 34 (slits) are formed in the Si substrate 31 and each layer formed on or above the Si substrate 31 by photolithography and etching with the resist pattern 54 as a mask.

The etching for forming the depressed portions 34 may be normal dry etching that involves the use of a fluorine gas or a chlorine gas or wet etching that involves the use of HF, BHF, fluoro-nitric acid, KOH, SLA etchant, or the like. However, in order to form deeper slits, it is desirable to use Deep-RIE, Bosch process etching, or the like. Use of such an etching method makes it possible to form slits with a high aspect ratio of 50 to 100. For example, a slit having a width of 1 μm and a depth of 50 μm can be formed.

Alternatively, the depressed portions 34 (slits) may be formed by half-cut dicing with use of a dicing apparatus as in Embodiments 1 to 3, instead of photolithography and etching.

In the present embodiment, too, the size (two-dimensional size, area) of each individual element pattern 33a separated by the depressed portions 34, i.e., of each island pattern (each element section) can be the size of a pixel transistor of approximately 50×50 μm.

Further, in the present embodiment, too, the thickness of the semiconductor device substrate 90, the depth d8 of each of the depressed portions 34 that are formed in the semiconductor device substrate 90, and the thickens d9 of the bottom part (bottom wall, i.e., a connection part of the Si substrate 31) of each of the depressed portions 34 can be set according to the method of forming the depressed portions 34 and the thickness of the Si substrate 1, as in the case of the depth d1 and the thickness d2 in the Si substrate 1 and the depressed portions 4 of Embodiment 1.

Then, the resist pattern 54 on the interlayer insulating film 82 is removed by ashing the resist pattern 54 and dipping, in a separating solution, the whole of the Si substrate 33 with an oxidized film provided with the element patterns 33a each including a CMOS transistor 70, so that as shown in (e) of FIG. 16, the CMP ground surface of the interlayer insulating film 82 is exposed.

Thus, as shown in (e) of FIG. 16, the semiconductor device substrate 90 is fabricated which has a pattern in which the element patterns 33a (element sections) element-separated (islanded) by the depressed portions 34 are connected by the bottom part (bottom wall) of each of the depressed portions 34.

<Step of Bonding the Semiconductor Substrate and the Intermediate Substrate Together (S12)>

The steps shown in S12 to S14 of FIG. 14 are identical to the steps shown in S12 to S14 of FIG. 1, except that as shown in (a) to (d) of FIG. 17, the semiconductor substrate is a semiconductor device substrate 90 and the semiconductor elements are CMOS transistors 70.

That is, according to the present embodiment, as shown in (a) of FIG. 17, the semiconductor device substrate 90 is bonded onto an intermediate substrate 5 on which an adhesive material layer 6 has been stacked (applied or laminated), so that the surface of the semiconductor device substrate 90 on which the element patterns have been formed and the surface of the intermediate substrate 5 on which the adhesive material layer 6 has been stacked face each other.

Further, in the present embodiment, too, it is of course preferable that the adhesive material layer 6 on the intermediate substrate 5 be applied or laminated onto at least 80% of the area of each element pattern 33a (each island pattern) separated by the depressed portions 34.

<Element-Separating (Islanding) Step (S13)>

Next, as shown in (b) of FIG. 17, by using a grinder 7 as in Embodiment 1, back surface grinding is carried out from the back surface of the semiconductor device substrate 90 (i.e., the surface opposite to the surface of the semiconductor device substrate 90 on which the element patterns have been formed).

Thus, as shown in (c) of FIG. 17, the element patterns 33a connected together are separated (element-separated) into individual CMOS transistors 70 (semiconductor devices, semiconductor elements) constituted by the individual element patterns 33a.

<Step of Forming and Planarizing an Oxidized Film (S14)>

After that, as shown in (d) of FIG. 17, the CMOS transistors 70 thus separated from each other are each formed with an oxidized film 9 in the same manner as in Embodiment 1. Next, a surface of the oxidized film 9 is planarized in the same manner as in Embodiment 1.

Thus, the intermediate substrate 5 is fabricated on which the plurality of CMOS transistors 70 have been arranged at a predetermined pitch h via the adhesive material layer 6.

<Step of Islanding the Final Substrate (S21)>

As mentioned above, the steps shown in S21 of FIG. 14 are identical to the steps shown in S21 of FIG. 1, and the cross-sectional views showing the steps in S21 in the order in which they are executed are identical to (a) to (c) of FIG. 3.

Therefore, in the present embodiment, the final substrate 10 on which the raised portions 13 islanded in a matrix manner by the depressed portions 12 are formed at the predetermined pitch H is fabricated in the same manner as in Embodiment 1, except that the raised portions 13 function as receptor patterns to be joined to the CMOS transistors 70 and that in consideration of the margins of junction with the CMOS transistors 70, the raised portions 13 are formed to be a size larger than the CMOS transistors 70 transferred onto the intermediate substrate 5.

<Step of Bonding the Intermediate Substrate and the Final Substrate Together (S31) to the Step of Separating the Intermediate Substrate and the Final Substrate from Each Other (S33)>

Figure 18:
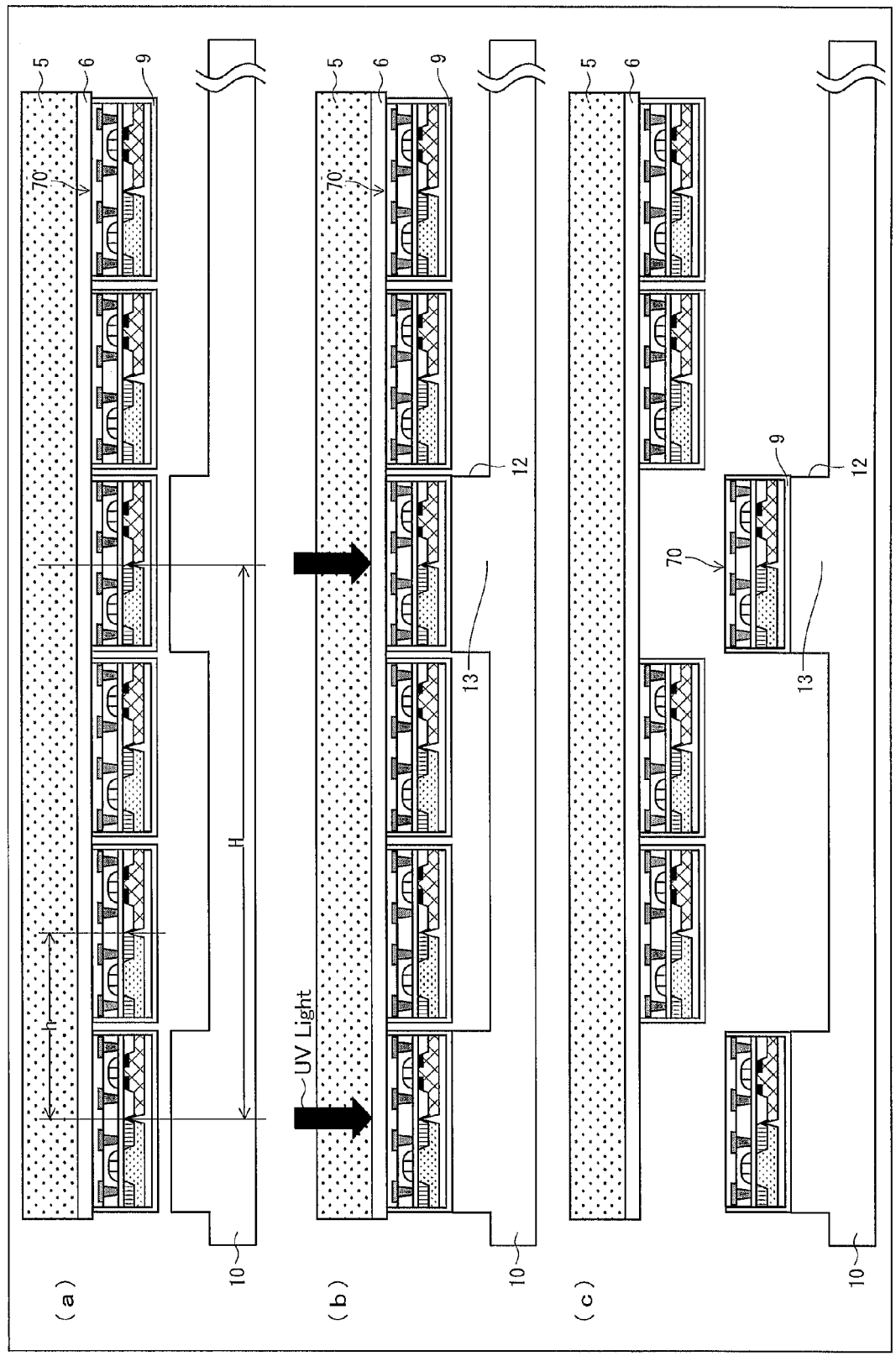
FIG. 18

As shown in (a) to (c) of FIG. 18, the steps shown in S31 to S33 of FIG. 14 are identical to the steps shown in S31 to S33 of FIG. 1, except that the CMOS transistors 70 have been transferred to the intermediate substrate 5 and that the CMOS transistors 70 are selectively transferred from the intermediate substrate 5 to the final substrate 10.

That is, according to the present embodiment, first, as shown in (a) of FIG. 18, after the intermediate substrate 5 and the final substrate 10 have been surface-treated (hydrophilically treated) in the same manner as in Embodiment 1, they are bonded to each other and subjected to preannealing in the same manner as in Embodiment 1. The preannealing causes the intermediate substrate 5 and the final substrate 10 to be tightly joined together at the bonding interface. After that, as shown in (b) of FIG. 18, only the CMOS transistors 70 to be transferred are selectively irradiated with UV light from the back surface of the intermediate substrate 5 in the same manner as in Embodiment 1. Next, and as shown in (c) of FIG. 18, the intermediate substrate 5 and the final substrate 10 are vertically pulled away from each other, whereby the CMOS transistors 70 can be selectively transferred from the intermediate substrate 5 to the final substrate 10.

Through these steps, the dispersed arrangement of the CMOS transistors 70 from the semiconductor device substrate 90 to the large-area final substrate 10 is completed. Formation of wires between the CMOS transistors 70 and pixel electrodes and the like, which are needed afterward, needs only be carried out on the final substrate 10 by using a common LCD process.

<<Effects>>

As described above, in the present embodiment, too, the semiconductor elements can be transferred from the semiconductor substrate to the final substrate with two transfers. Therefore, the present embodiment also makes it possible to reduce the number of transfers as compared with the conventional technique in transferring semiconductor elements using Si single films to a final substrate. Accordingly, the present embodiment also makes it possible to increase throughput and element-bonding accuracy, thus making it possible to improve yield and reduce cost.

Further, in the present embodiment, as described above, the transistors, which are semiconductor devices, are formed in advance on a Si substrate before the transistors are dispersedly transferred to the insulating substrate, which is a final substrate. For this reason, as compared with such a case as in Embodiment 1 where transistors are formed on an insulating substrate after the Si single films, which are semiconductor thin films, have been transferred to the insulating substrate, the present embodiment makes it possible to form submicron-level fine transistors that are hard to manufacture on an insulating substrate.

<<Configuration of a Semiconductor Apparatus>>

According to the present embodiment, the manufacturing method makes it possible to obtain a semiconductor apparatus in which as shown in (c) of FIG. 18, the raised portions 13 (island patterns) separated into an array by the depressed portions 12 have been formed on the final substrate 10 composed of an insulating substrate such as a glass substrate and the CMOS transistor 70 have been joined onto the raised portions 13 by covalent bonding or the like via the oxidized film 9 covering the side surfaces and lower surface of each of the CMOS transistors 70.

<<Modification>>

The present embodiment has been described by taking, as an example, a case where the depressed portions 34 (slits) are formed in the resist pattern 54 and each layer of the semiconductor device substrate 90 by using photolithography and etching in S11 as shown in (d) of FIG. 16.

However, the present embodiment is not to be limited to such an example. As in the descriptions in Embodiment 1, a similar matrix pattern may be formed by forming the depressed portions 34 (slits) in the resist pattern 54 and each layer of the semiconductor device substrate 90 by half-cut dicing instead of carrying out photolithography, etching, etc.

[Embodiment 5]

Another embodiment of the present invention is described below with reference to FIG. 19 through (a) to (c) of FIG. 20.

Figure 19:
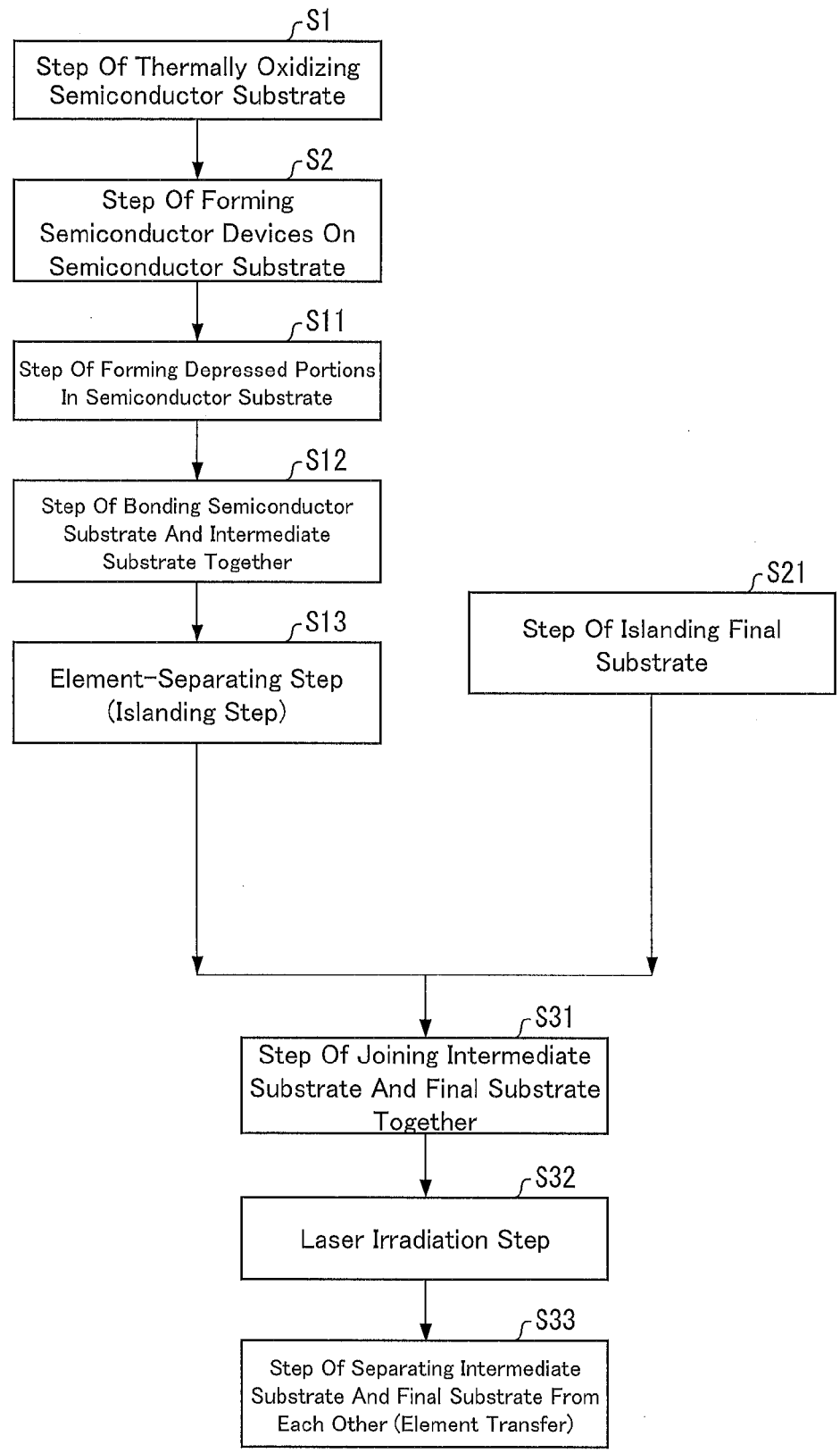
FIG. 19

FIG. 19 is a flow chart schematically showing main steps of a method for manufacturing a semiconductor apparatus according to the present embodiment. Further, FIG. 20 is a set of cross-sectional views (a) to (c) showing some steps of the method for manufacturing a semiconductor apparatus according to the present embodiment. (a) and (b) of FIG. 20 show steps in S13 of FIG. 19 in the order in which they are executed. (c) of FIG. 20 shows a step in S33 of FIG. 19.

In the present embodiment, differences between the present embodiment and Embodiment 2 are mainly described.

<<Method for Manufacturing a Semiconductor Apparatus>>

In the present embodiment, basically the same transfer process as that of Embodiment 2 is carried out. The present embodiment differs from the Embodiment 2 in that as shown in FIG. 19, the step of thermally oxidizing a semiconductor substrate (S1) and the step of forming semiconductor devices on the semiconductor substrate (S2) are executed in this order prior to the step of forming depressed portions in the semiconductor substrate (S11). The steps shown in S1 and S2 in the present embodiment are as described in Embodiment 4 but, since the semiconductor substrate used is an SOI substrate, need to be considered with the Si substrate replaced by the SOI substrate.

That is, in the present embodiment, the Si substrate 31 shown in (a) of FIG. 15 in Embodiment 4 is replaced by the SOI substrate 24 shown in (a) of FIG. 9. For this reason, according to the present embodiment, since the BOX layer 22, which is an oxidized layer, has been formed in advance as mentioned above in Embodiment 2, the present embodiment makes it unnecessary to form such an oxidized film as that shown in S14 of Embodiments 1 and 2 after the element-separating step (S13) shown in S13.

Figure 20:
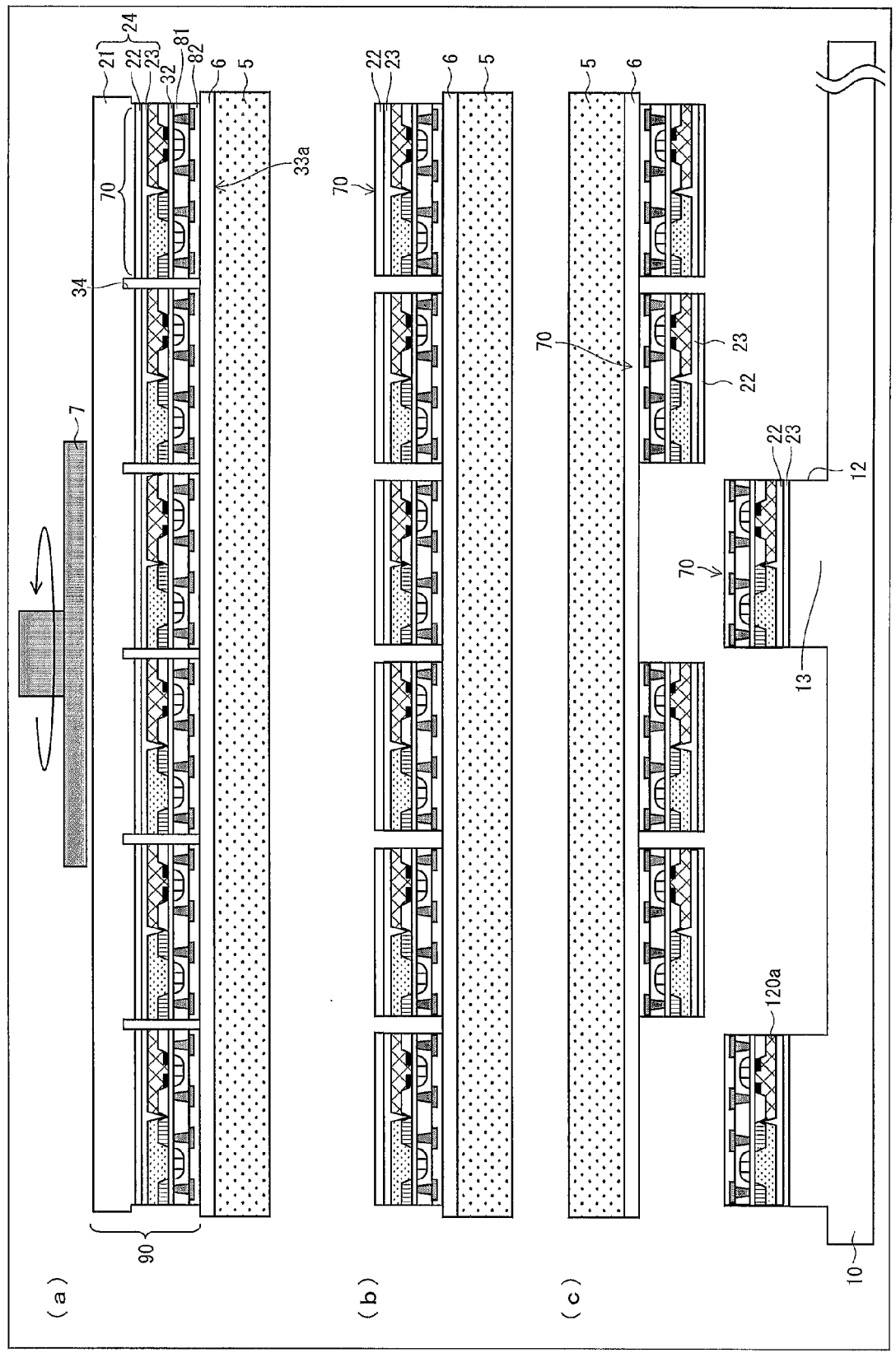
FIG. 20

Since the present embodiment uses the SOI substrate 24 instead of the Si substrate 31 as mentioned above, the semiconductor device substrate 90 fabricated in the present embodiment is configured such that as shown in (a) of FIG. 20, the CMOS transistors 70 have been formed on the Si film 23 in the SOI substrate 24 and the element patterns 33a including the CMOS transistors 70 are element-separated (islanded) by the depressed portions 34 formed in each layer (i.e., the Si film 23, the BOX layer 22, and the Si substrate 21) of the SOI substrate 24.

For this reason, according to the present embodiment, the BOX layer 22, which is an oxidized film, functions as a grinding stopper as in Embodiment 2 when back surface grinding is carried out from the back surface of the SOI substrate 24 (i.e., the surface opposite to the surface of the SOI substrate 24 on which the element patterns have been formed) by using the grinder 7 as shown in (a) of FIG. 20.

For this reason, there occur no variations in the grinding of the Si substrate 21, so that variations in the thickness of the CMOS transistors 70 after element separation shown in (b) of FIG. 20 can be eliminated.

In the present embodiment, too, in a case where the surface flatness of the BOX layer 22 exposed by the processes described in (a) and (b) of FIG. 20 is insufficient for the subsequent bonding, the surface of the BOX layer 22 may be further planarized by carrying out CMP treatment thereafter.

The step of joining the intermediate substrate and the final substrate together (S31) to the step of separating the intermediate substrate and the final substrate from each other (S33) according to the present embodiment are identical to those according to Embodiment 4, except that the intermediate substrate 5 to be bonded to the final substrate 10 is configured as described in (b) of FIG. 20 instead of being configured as described in (d) of FIG. 17. Therefore, the steps are not described here.

In the present embodiment, too, a description of S21 is omitted since the basic configuration is the same as mentioned above.

<<Configuration of a Semiconductor Apparatus>>

According to the present embodiment, by vertically pulling the intermediate substrate 5 and the final substrate 10 away from each other in the step of separating the intermediate substrate and the final substrate from each other (S33), a semiconductor apparatus can be obtained in which as shown in (c) of FIG. 20, the raised portions 13 (island patterns) separated into an array by the depressed portions 12 have been formed on the final substrate 10 composed of an insulating substrate such as a glass substrate and the CMOS transistors 70, which are semiconductor devices, have been joined onto the raised portions 13 by covalent bonding or the like in the BOX layer 22.

<<Effects>>

As described above, in the present embodiment, too, the semiconductor elements can be transferred from the semiconductor device substrate 90 to the final substrate 10 with two transfers. Therefore, the present embodiment also makes it possible to reduce the number of transfers as compared with the conventional technique in transferring semiconductor elements using Si single films to a final substrate. Accordingly, the present embodiment also makes it possible to increase throughput and element-bonding accuracy, thus making it possible to improve yield and reduce cost.

Further, according to the present embodiment, too, by executing a common semiconductor device manufacturing process such as an LCD process as needed after the semiconductor elements have been transferred from the intermediate substrate to the final substrate, a semiconductor apparatus can be manufactured in which high-performance semiconductor elements provided with high-performance semiconductor devices have been dispersedly arranged.

Further, in the present embodiment, the BOX layer 22 functions as a grinding stopper as described above. This makes it possible to eliminate variations in the thickness of the CMOS transistors 70. For this reason, the present embodiment makes it possible to fabricate a display panel in which variations in the characteristics of the TFTs are smaller.

Further, since the BOX layer 22, which is an oxidized layer, has been formed in advance as mentioned above, the present embodiment makes it unnecessary to form an oxidized film after grinding as in S14 of Embodiment 4. For this reason, the present embodiment can further reduce the number of steps as compared with Embodiment 4.

Further, in the present embodiment, as described above, the transistors, which are semiconductor devices, are formed in advance on an SOI substrate 24 before the transistors are dispersedly transferred to the insulating substrate, which is a final substrate. For this reason, as compared with such a case as in where transistors are formed on an insulating substrate after the are semiconductor thin films have been transferred to the insulating substrate, the present embodiment, as with Embodiment 4, makes it possible to form submicron-level fine transistors that are hard to manufacture on an insulating substrate.

<<Modification>>

In the present embodiment, too, as in Embodiment 4, a similar matrix pattern may be formed by forming the depressed portions 34 (slits) in the resist pattern 54 and each layer of the semiconductor device substrate 90 by half-cut dicing instead of carrying out photolithography, etching, etc.

[Embodiment 6]

Another embodiment of the present invention is described below with reference to FIG. 21 through (a) to (c) of FIG. 23.

Figure 21:
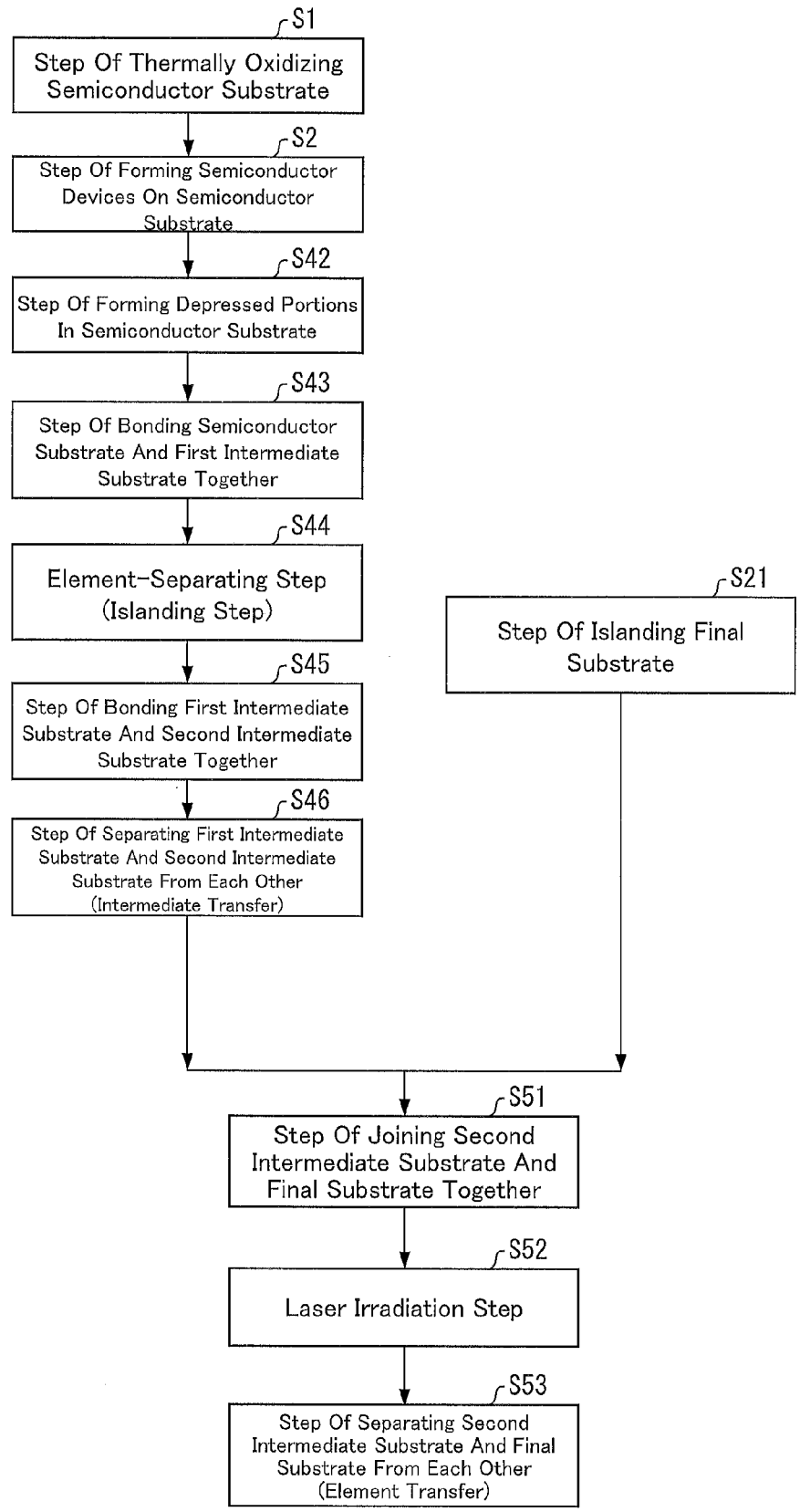
FIG. 21
Figure 22:
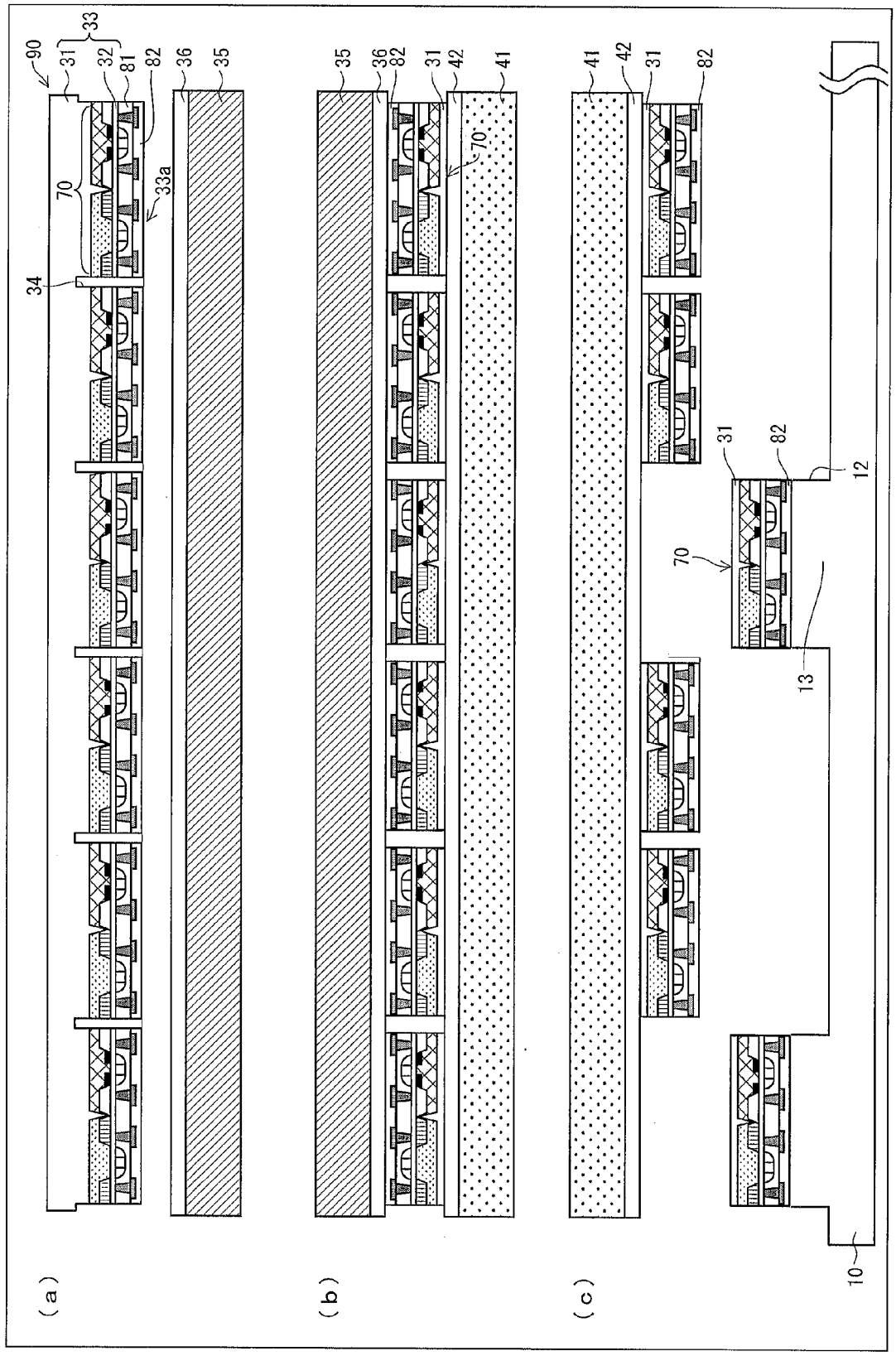
FIG. 22

FIG. 21 is a flow chart schematically showing main steps of a method for manufacturing a semiconductor apparatus according to the present embodiment. Further, FIG. 22 is a set of cross-sectional views (a) to (c) showing some steps of the method for manufacturing a semiconductor apparatus according to the present embodiment.

In the present embodiment, differences between the present embodiment and Embodiment 3 are mainly described.

<<Method for Manufacturing a Semiconductor Apparatus>>

In the present embodiment, basically the same transfer process as that of Embodiment 3 is carried out. The present embodiment is the same as Embodiment 3, except that the semiconductor substrate is a semiconductor device substrate 90 and the semiconductor elements are CMOS transistors 70. For this reason, in the present embodiment, as shown in FIG. 21, the step of thermally oxidizing a semiconductor substrate (S1) and the step of forming semiconductor devices on the semiconductor substrate (S2) are executed prior to the step of forming depressed portions in the semiconductor substrate (S42). The steps from S1 to S42 shown in FIG. 21 are identical to the steps from S1 to S11 of FIG. 14. S42 and the subsequent steps shown in FIG. 21, which constitute a transfer process, are identical to S42 and the subsequent steps of FIG. 11 in Embodiment 3.

That is, in the present embodiment, first, the Si substrate 31 shown in (a) of FIG. 15 is used, and by carrying out the process from (a) of FIG. 15 to (e) of FIG. 16, a semiconductor device substrate 90 provided with element patterns 33a each including a CMOS transistor 70 is formed. After that, by carrying out the process from (d) of FIG. 12 to (c) of FIG. 13, a semiconductor apparatus, such as that shown in (c) of FIG. 22, in which high-performance semiconductor devices have been dispersedly arranged can be manufactured.

(a) of FIG. 22 corresponds to S43 shown in (d) of FIG. 12. (b) of FIG. 22 corresponds to S45 shown in (g) of FIG. 12. (c) of FIG. 22 corresponds to S53 shown in (c) of FIG. 13.

<<Configuration of a Semiconductor Apparatus>>

According to the present embodiment, three transfers are carried out. Therefore, as shown in (c) of FIG. 22, a semiconductor apparatus is obtained in which the CMOS transistors 70 have been joined to the final substrate 10 by covalent bonding or the like in an upside-down state of Embodiment 4. According to the present embodiment, such an upside-down configuration makes it possible to reduce the film thickness of the interlayer insulating film to the extent of absence of thickness of a gate electrode, for example, at the time of formation of contact after the formation of the interlayer insulating film on a large glass board. Therefore, the distance between the transfer film and the source and drain electrodes can be shortened. This makes it unnecessary to carry out deep dry etching, makes it easy to make contact holes, and makes it possible to achieve an increase in yield.

<<Effects>>

As described above, the present embodiment makes it possible to transfer the CMOS transistors 70 to the final substrate with three transfers. Therefore, despite the addition of the step of turning the direction of the semiconductor elements fabricated into the semiconductor substrate upside down, the present embodiment makes it possible to transfer the semiconductor elements fabricated into the semiconductor substrate to the final substrate with fewer transfers than the conventional technique. Therefore, the present embodiment makes it possible to increase throughput and element-bonding accuracy as compared with the conventional technique, thus making it possible to improve yield and reduce cost.

Further, in the present embodiment, the interlayer insulating film 82 on the surface has already been planarized at the stage of (e) of FIG. 16, where the step of S42 has been finished. For this reason, it is not necessary to separately carry out the step of forming and planarizing an oxidized film (S14) prior to the final transfer step as in Embodiment 4, and it is only necessary to carry out three transfers.

<<Modification>>

Figure 23:
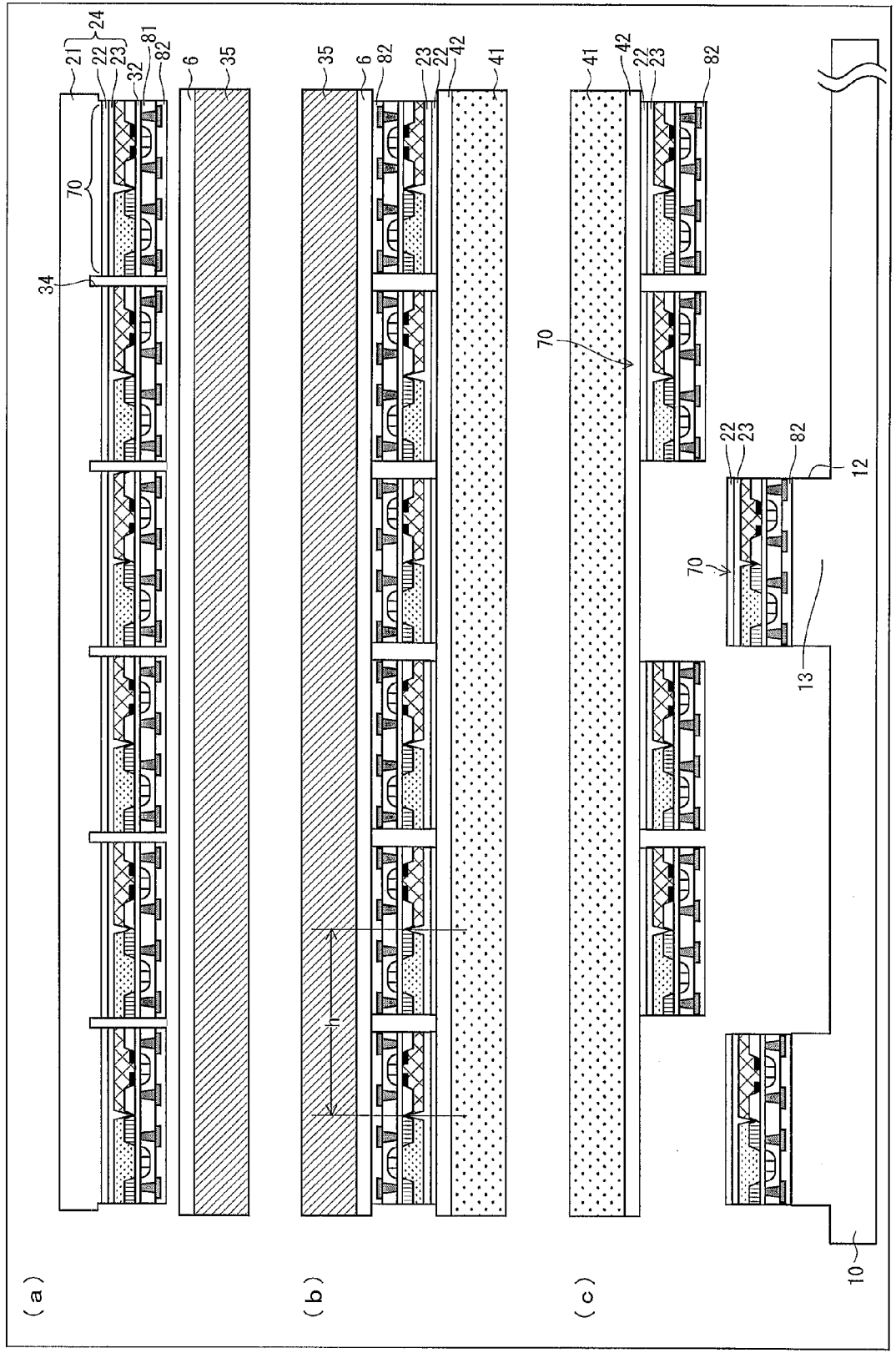
FIG. 23

FIG. 23 is a set of cross-sectional views (a) to (c) showing some steps of a method for manufacturing a semiconductor apparatus according to the present modification.

The foregoing description has been given by taking, as an example, a case where the CMOS transistors 70 formed by using the Si substrate 31 are transferred in accordance with the flow chart shown in FIG. 21. However, the present embodiment is not to be limited to such an example. As shown in (a) to (c) of FIG. 23, the CMOS transistors 70 formed by using the SOI substrate 24 may be transferred to the final substrate 10 in accordance with the flow chart shown in FIG. 21.

(a) of FIG. 23 corresponds to S43 shown in (d) of FIG. 12. (b) of FIG. 23 corresponds to S45 shown in (g) of FIG. 12. (c) of FIG. 23 corresponds to S53 shown in (c) of FIG. 13.

The present modification makes it possible to manufacture a high-performance semiconductor apparatus in which the CMOS transistors 70 including the Si film 23, which constitutes the SOI substrate 24, and the BOX layer 22, which is a Si oxidized film, have been dispersedly arranged.

[Embodiment 7]

Another embodiment of the present invention is described below with reference to FIG. 24 and (a) to (d) of FIG. 25.

Figure 24:
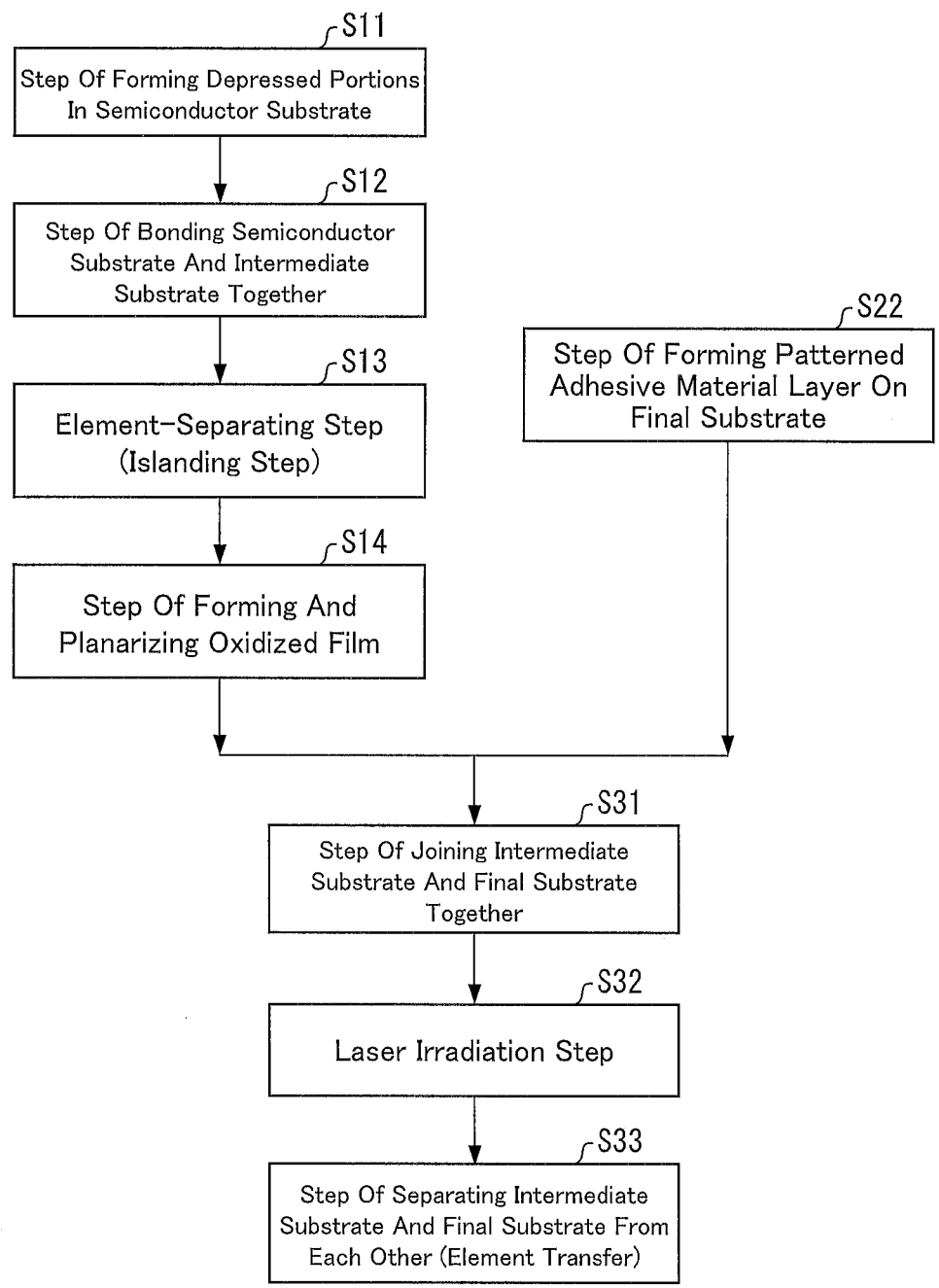
FIG. 24

FIG. 24 is a flow chart schematically showing main steps of a method for manufacturing a semiconductor apparatus according to the present embodiment. Further, FIG. 25 is a set of cross-sectional views (a) to (d) showing some steps of the method for manufacturing a semiconductor apparatus according to the present embodiment. It should be noted that (a) of FIG. 25 shows the step in S22 of FIG. 24 and (b) to (d) of FIG. 25 shows the steps in S31 to S33 of FIG. 24 in the order in which they are executed.

In the present embodiment, differences between the present embodiment and Embodiment 1 are mainly described.

<<Method for Manufacturing a Semiconductor Apparatus>>

In the present embodiment, basically the same transfer process as that of Embodiments 1 to 6 is carried out. The present embodiment differs from Embodiments 1 to 6 solely in terms of whether to prepare a stepped final substrate 10 and bond semiconductor elements to the final substrate 10 or to bond semiconductor elements to a flat final substrate 10 with an adhesive. In this section, Embodiment 1 is taken as an example to explain differences from an example of the present embodiment.

In the present embodiment, as shown in FIG. 24, the step of forming a patterned adhesive layer on the final substrate (S22) is executed instead of the step of islanding the final substrate (S21) shown in FIG. 1. The steps shown in S11 to S14 of FIG. 24 in the present embodiment are identical to the steps shown in S11 to S14 of FIG. 1. That is, the steps to be executed are shown in (a) to (g) of FIG. 2.

<Step of Forming a Patterned Adhesive Material Layer on the Final Substrate (S22)>

Figure 25:
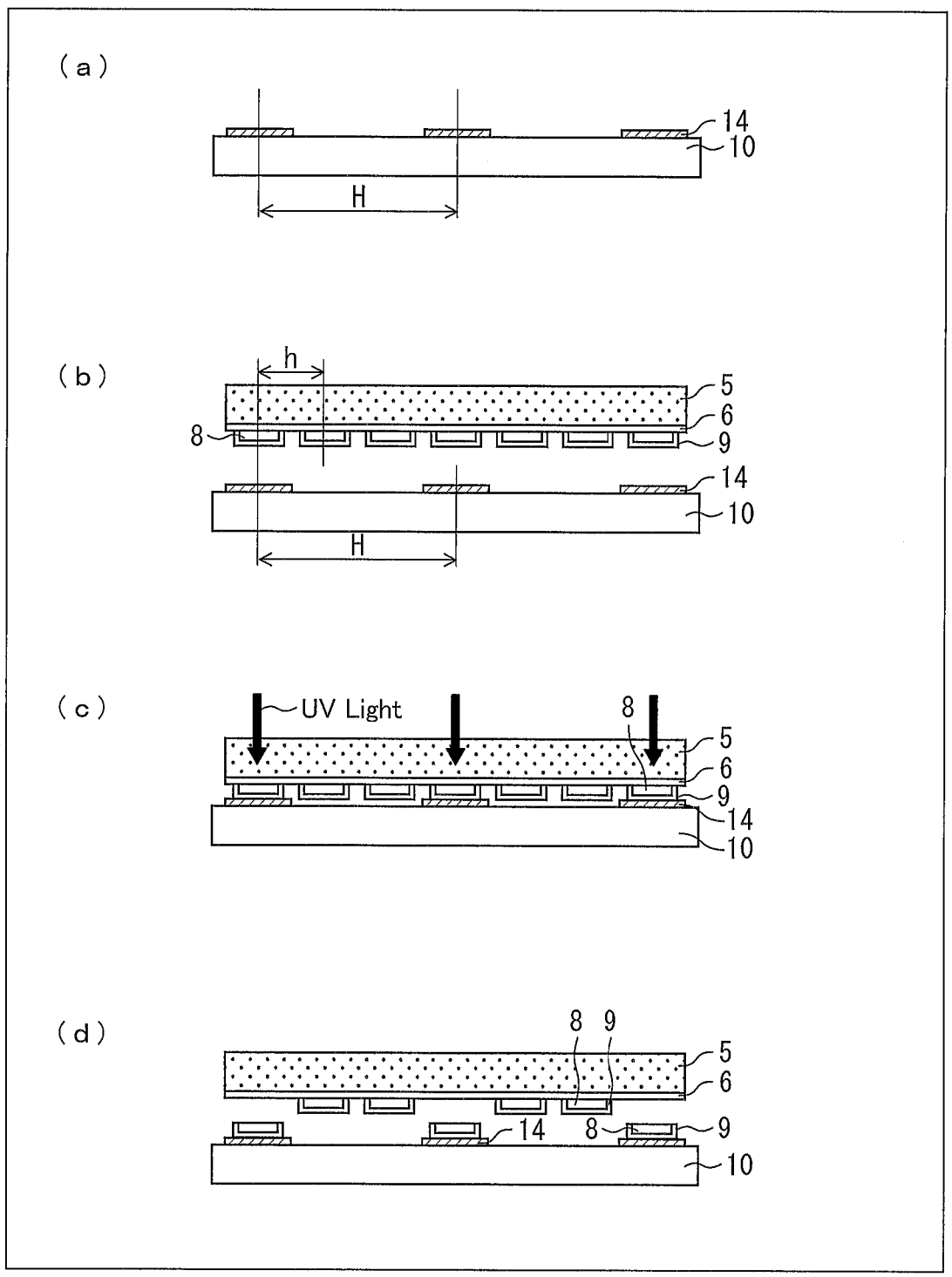
FIG. 25

In the present embodiment, as shown in (a) of FIG. 25, an adhesive material layer 14 is selectively formed in S22, instead of forming the raised portions 13 at the pitch H on the final substrate 10 in S21.

In S22, first, as the final substrate 10, an insulating substrate such as a glass substrate is prepared in the same manner as in (a) of FIG. 2 in Embodiment 1.

Next, as shown in (a) of FIG. 25, the adhesive material layer 14 is selectively formed at the pitch H on the final substrate 10 by selectively applying an adhesive to the surface of the final substrate 10 for example by an ink-jet method or the like.

The adhesive material layer 14 is not to be particularly limited in thickness. However, from the point of view of reducing the thickness of the semiconductor apparatus or, in a case where the semiconductor apparatus is used for a display panel, from the point of view of suppressing a decrease in display quality, it is preferable that the adhesive material layer 14 be formed as thin as possible. Further, the adhesive material layer 14 may be made of a sticky film (adhesive film) instead of being made of an adhesive.

The adhesive of which the adhesive material layer 14 is made of is not to be particularly limited as long as the final substrate 10 and the intermediate substrate can be bonded together.

Further, the adhesive force of the adhesive material layer 6 after the application of external energy to the adhesive material layer 6 on the intermediate substrate 5 (i.e., after a decrease in adhesive force) needs only be made lower than the adhesive force of the adhesive material layer 14. This makes it possible to transfer the Si single films 8 (semiconductor elements) from the intermediate substrate 5 to the final substrate 10.

<Step of Bonding the Intermediate Substrate and the Final Substrate Together (S31) to the Step of Separating the Intermediate Substrate and the Final Substrate from Each Other (S33)>

The steps shown in S31 to S33 in the present embodiment are identical to the steps shown in S31 to S33 in Embodiment 1, except that as shown in (b) and (c) of FIG. 25, the final substrate 10 is provided with the adhesive material layer 14 instead of the raised portions 13. (b) of FIG. 25 is illustrated by taking, as an example, the adhesive material layer 6 used is a UV removable sheet. However, as mentioned above, the adhesive material layer 6 that is used for adhesion between the intermediate substrate 5 and the Si single films 8 needs only be an adhesive material layer whose adhesive force is decreased by external energy, and is not to be limited to a UV removable sheet.

<<Effects>>

In the present embodiment, too, the transfer method makes it possible to transfer the Si single films 8 from the Si substrate 1 to the final substrate 10 with two transfers. Therefore, the present embodiment makes it possible to reduce the number of transfers as compared with the conventional technique in transferring semiconductor elements using Si single films to a final substrate. Accordingly, the present embodiment also makes it possible to increase throughput and element-bonding accuracy, thus making it possible to improve yield and reduce cost.

It should be noted that according to the present embodiment, too, by executing a common semiconductor device manufacturing process such as an LCD process as needed after S33, a semiconductor apparatus can be manufactured in which high-performance semiconductor devices including the Si single films 8 have been dispersedly arranged.

Further, as described above, the present embodiment does not use van der Waals' force as Embodiment 1 does, but uses an adhesive, a film, or the like, which is small in thickness. Therefore, there is no need to form the depressed portions 13 in advance in the final substrate 10 and carry out surface treatment (hydrophilic treatment) before the bonding together of the intermediate substrate 5 and the final substrate 10 as in Embodiment 1. This makes it possible to simplify the steps.

In the present embodiment, a case is shown where as shown in FIG. 24 and (b) to (d) of FIG. 25, an oxidized film 9 is formed on each of the Si single films 8 by executing the oxidized film forming and planarizing step (S14) after S13. However, since the present embodiment does not use van der Waals' force to join the Si single films 8 to the final substrate 10, it is not always necessary to execute S14. This makes it possible to further reduce the number of steps.

<<Configuration of a Semiconductor Apparatus>>

The present embodiment makes it possible to obtain a semiconductor apparatus in which in which as shown in (d) of FIG. 25, the adhesive material layer 14 having a pattern separated into an array has been formed on the final substrate 10 composed of an insulating substrate such as a glass substrate and the semiconductor elements have been joined onto the adhesive material layer 14 by the adhesive force of the adhesive material layer 14.

[Embodiment 8]

Another embodiment of the present invention is described below with reference to FIG. 26 and (a) to (d) of FIG. 29.

Figure 26:
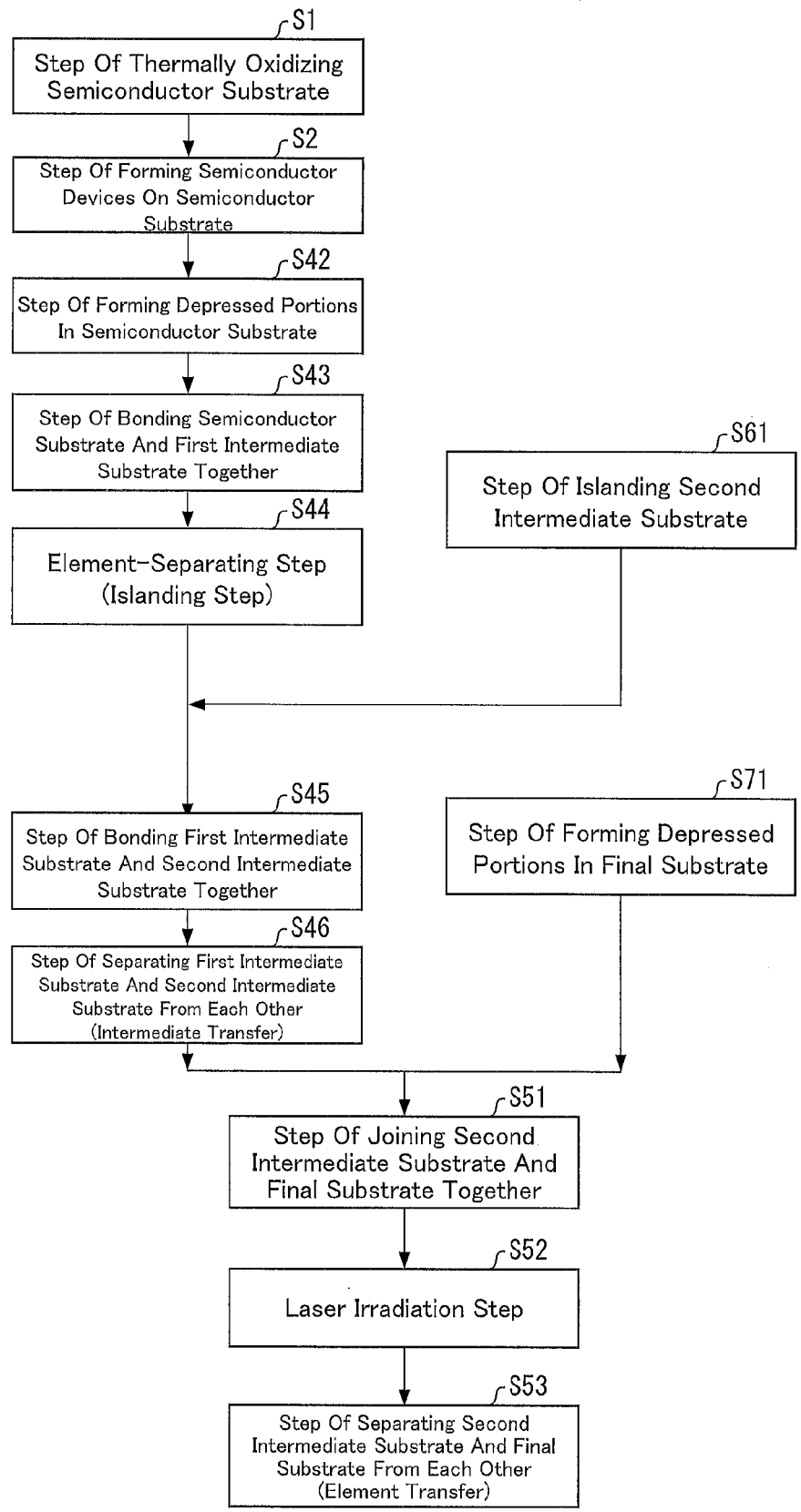
FIG. 26
Figure 27:
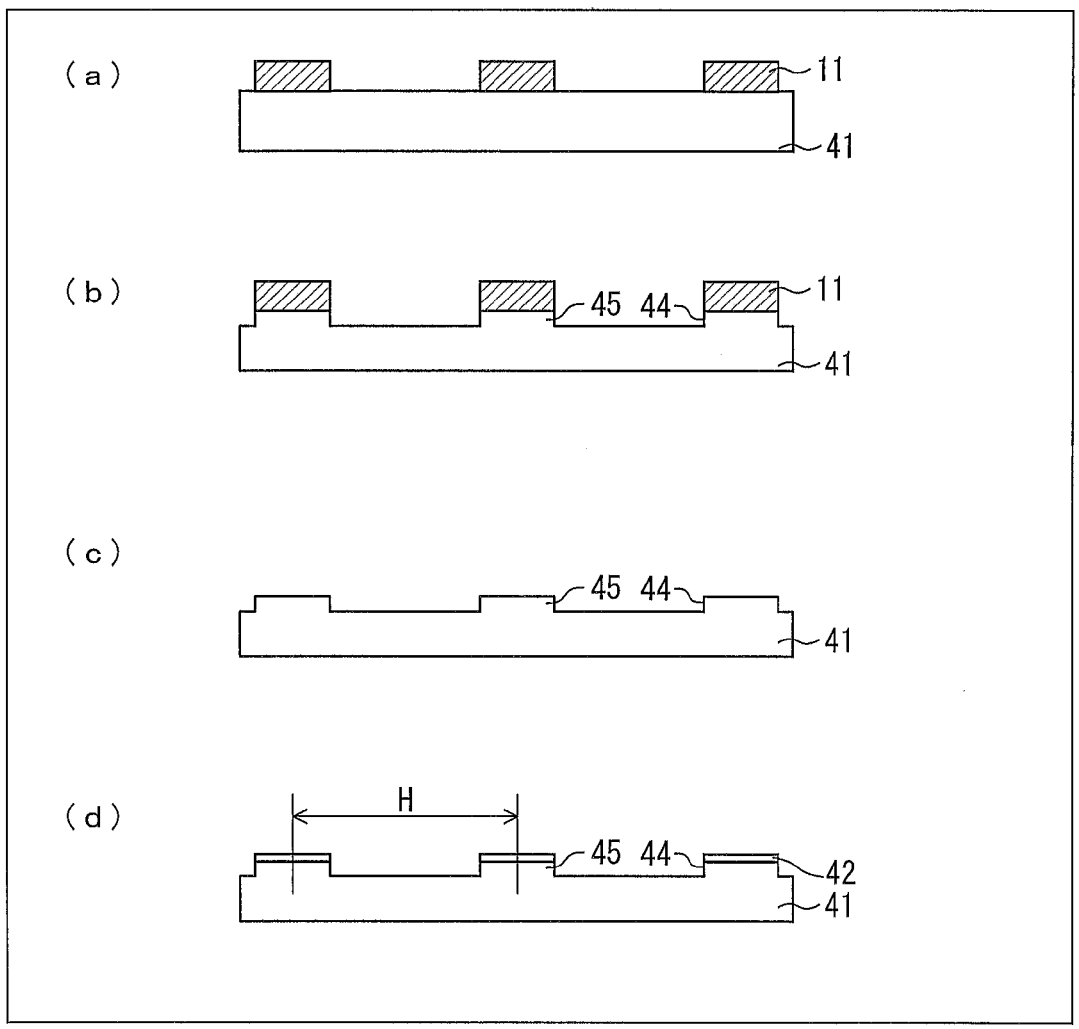
FIG. 27
Figure 28:
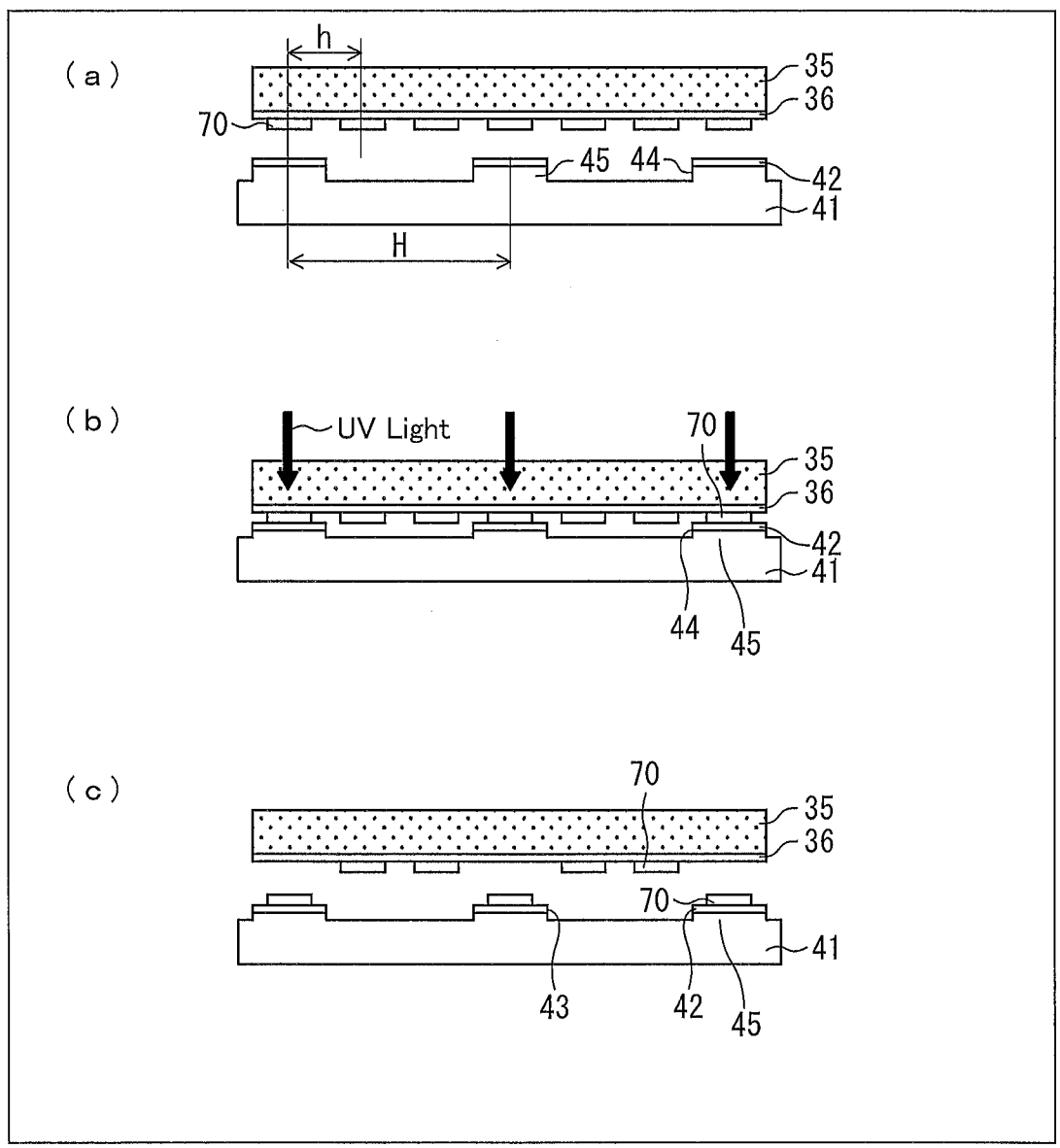
FIG. 28

FIG. 26 is a flow chart schematically showing main steps of a method for manufacturing a semiconductor apparatus according to the present embodiment. FIG. 27 is a set of cross-sectional views (a) to (d) showing steps in S61 of FIG. 26 in the order in which they are executed. FIG. 28 is a set of cross-sectional views (a) to (c) showing steps in S45 and S46 of FIG. 26 in the order in which they are executed. FIG. 29 is a set of cross-sectional views (a) to (d) showing S51 and the subsequent steps in FIG. 26 in the order in which they are executed.

In the present embodiment, differences between the present embodiment and Embodiment 6 are mainly described.

<<Method for Manufacturing a Semiconductor Apparatus>>

Embodiment 6 was described by taking, as an example, a case where the semiconductor elements are transferred from the second intermediate substrate to the final substrate at the pitch H by using a UV removable sheet in transferring the semiconductor elements from the second intermediate substrate to the final substrate and selectively irradiating the UV removable sheet with UV light (laser light) from the back surface of each of the semiconductor elements to be transferred to the final substrate.

Meanwhile, the present embodiment uses a UV removable sheet in transferring the semiconductor elements from the first intermediate substrate to the second intermediate substrate and selectively irradiating the UV removable sheet with UV light (laser light) from the back surface of each of the semiconductor elements to be transferred to the final substrate. This allows the present embodiment to selectively transfer the semiconductor elements at the pitch H from the first intermediate substrate to the second intermediate substrate. After that, by transferring the semiconductor elements from the second intermediate substrate to the final substrate, the semiconductor elements are transferred at the pitch H on the final substrate.

In the present embodiment, as shown in FIG. 26, in the step of bonding the first intermediate substrate and the second intermediate substrate together (S45), the first intermediate substrate to which the semiconductor elements have been transferred is bonded to the second intermediate substrate separately fabricated in the step of islanding the second intermediate substrate (S61).

In the present embodiment, the steps from S1 to S44 of FIG. 26 are identical to the steps from S1 to S44 of FIG. 21. That is, in the present embodiment, as in Embodiment 6, first, the process from (a) of FIG. 15 to (e) of FIG. 16 is carried out with use of the Si substrate 31 shown in (a) of FIG. 15, whereby a semiconductor device substrate 90 provided with element patterns 33a each including a CMOS transistor 70 as shown in (a) of FIG. 22 is formed.

In the present embodiment, the steps from S1 to S44 of FIG. 26 are identical to the steps from S1 to S44 of FIG. 21. That is, in the present embodiment, the same process as in Embodiment 6 is carried out to form a semiconductor device substrate 90 provided with element patterns 33a each including a CMOS transistor 70 as shown in (a) of FIG. 22.

After that, the same process as in (a) to (c) of FIG. 17 is carried out with use, as the intermediate substrate, of the first intermediate substrate 35 on which the adhesive material layer 36 has been stacked. Thus, as shown in (a) of FIG. 28, the CMOS transistors 70 are transferred and element-separated on the first intermediate substrate 35 via the adhesive material layer 36. For simplicity of illustration, a detailed structure of a CMOS transistor 70 is omitted from (a) to (c) of FIG. 28 and (a) to (d) of FIG. 29. The adhesive material layer 36 used is for example a UV removable sheet.

<Step of Islanding the Second Intermediate Substrate (S61)>

In the present embodiment, the second intermediate substrate used is a substrate in which an adhesive material layer has been selectively formed on raised portions separated from each other in a matrix manner.

For this reason, in the present embodiment, as shown in (a) to (c) of FIG. 27, raised portions 45 (island patterns, elevated portions) separated from each other in a matrix manner by depressed portions 44 are formed at the predetermined pitch H by using the same method as in (a) to (c) of FIG. 3. After that, an adhesive material layer 42 is stacked on the raised portions 45 by applying an adhesive for example by an ink-jet method or the like. Thus, the second intermediate substrate 41 shown in (d) of FIG. 27 can be fabricated.

It should be noted that the second intermediate substrate 41 is a temporary support substrate and is not used for a final product. For this reason, the raised portions 45 that are formed on the second intermediate substrate 41 are not particularly limited in height when bonded to the final substrate 10 provided with the adhesive material layer 14 as shown in (a) of FIG. 25 for example as a modification. Further, the raised portions 45 that are formed on the second intermediate substrate 41 are not particularly limited in height in a case where the semiconductor elements are transferred onto the raised portions 13 on the final substrate 10 having the raised portions 13 as shown in (c) of FIG. 4.

Figure 29:
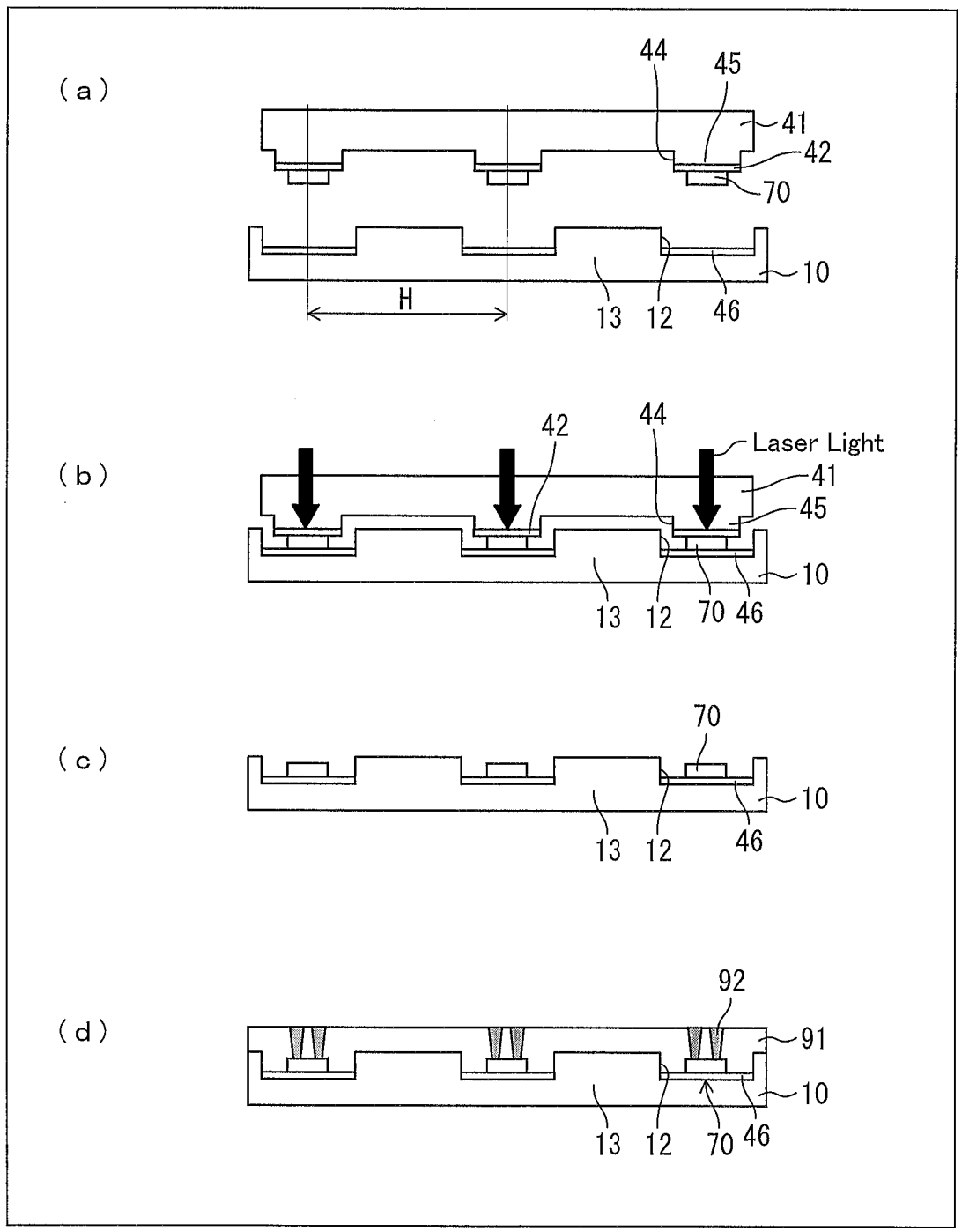
FIG. 29

However, in such a case as that shown in (a) to (d) of FIG. 29 where the final substrate 10 used is a final substrate 10, fabricated in S71, in which depressed portions 12 have been formed at the pitch H and semiconductor elements are transferred to the depressed portions 12, the raised portions 45 formed to such a height that the joining surfaces of the semiconductor elements, which adhere to the raised portions 45 via the adhesive material layer 42, to the final substrate 10 adhere to the depressed portions 12 in the final substrate 10.

<Step of Bonding the First Intermediate Substrate and the Second Intermediate Substrate Together (S45)>

Next, as shown in (a) of FIG. 28, the first intermediate substrate 35 onto which the CMOS transistors 70 have been transferred is bonded onto the second intermediate substrate 41 fabricated in S61, so that the CMOS transistors 70 and the surface on which the adhesive material layer 42 has been stacked face each other.

<Step of Separating the First Intermediate Substrate and the Second Intermediate Substrate from Each Other (S46)>

After that, as shown in (b) of FIG. 28, the adhesive material layer 36 between the CMOS transistors 70 and the first intermediate substrate 35 is selectively irradiated with UV light. Thus, as shown in (c) of FIG. 28, the CMOS transistors 70 are selectively transferred at the pitch H from the first intermediate substrate 35 to the second intermediate substrate 41.

According to the present embodiment, since the depressed portions 45 have been formed in the second intermediate substrate 41, only those ones of the semiconductor elements which face the raised portions 45 can be transferred from the first intermediate substrate 35 to the second intermediate substrate 41.

As with Embodiment 6, the present embodiment uses, as the semiconductor substrate, the Si substrate 33 provided with the CMOS transistors 70. Therefore, there is no need for such a step as S14 in Embodiment 1 for forming an oxidized film. Further, also in the case of using, as the semiconductor substrate, the SOI substrate 24 provided with the CMOS transistors 70 as shown in Embodiment 5, there is no need for a step as S14 for forming an oxidized film. That is, in the case of using, as the semiconductor substrate, a substrate provided with semiconductor devices (device elements) as described above, there is no need for a step such as S14 for forming an oxidized film.

However, in such a case as in Embodiment 1 where the Si single films 8 are transferred by using a Si substrate as the semiconductor substrate, for example, the oxidized film forming and planarizing step (S14), which is necessary for a joint via a covalent bond by hydrophilic treatment, may be executed after S46.

<Step of Forming Depressed Portions in the Final Substrate (S71)>

In S71, the depressed portions 12 are formed in the final substrate 10 in the same manner as in the step shown in S21 of FIG. 1. That is, the step shown in S71 is identical to S21, except that whereas the depressed portions 12 are formed in the final substrate 10 in S21 so that the raised portions 13 are placed at the pitch H as shown in (c) of FIG. 3, the depressed portions 12 are formed in the final substrate 10 so that the depressed portions 12 are placed at the pitch H as shown in (a) of FIG. 29. Therefore, a method for forming the depressed portions 12 in the final substrate 10 is to simply change the pitch between the depressed portions 12 in (a) to (c) of FIG. 3, so a detailed description of the method is omitted here.

Further, in consideration of the margins of junction with the CMOS transistors 70, it is preferable that the depressed portions 12 be formed to be a size larger than the CMOS transistors 70. By thus forming the depressed portions 12, the contact between the depressed portions 12 and the CMOS transistors 70 is secured even if there is a slight displacement when the depressed portions 12 and the CMOS transistors 70 are joined to each other in S51, so that the depressed portions 12 and the CMOS transistors 70 can be surely attached to each other so that they are surely contact with each other.

Next, on each of the depressed portions 12 thus formed, an adhesive material layer 46 is stacked. For example, in the step shown in (a) of FIG. 3 the adhesive material layer 46 can be selectively stacked into the depressed portion 12 by applying or blowing a material for the adhesive material layer 46 with the resist pattern 11 as a mask and then removing or lifting off the resist pattern 11. Alternatively, an adhesive may be directly applied exclusively into the depressed portion 12 by using an ink-jet process. The present embodiment is not to be limited to these methods, but needs only be able to stack the adhesive material layer 46 in the depressed portion 12.

It is of course possible to surface-treat (hydrophilize) the final substrate 10 and the second intermediate substrate and join the CMOS transistors 70 to the depressed portions 12 by covalent bonding, instead of stacking the adhesive material layer 46 in the depressed portion 12.

As mentioned above, it is preferable that the adhesive material layer 36 on the first intermediate substrate 35 and the adhesive material layer 42 on the second intermediate substrate 41 be adhesive material layer different in removing means from each other. For this reason, the present embodiment is described by taking, as an example, a case where the adhesive material layer 42 used is a thermally removable sheet. However, the present embodiment is not to be limited to such an example, and it is possible to use a UV removable sheet as the adhesive material layer 46, too.

<Step of Joining the Second Intermediate Substrate and the Final Substrate (S51)>

Next, as shown in (a) of FIG. 29, the CMOS transistors 70 adhering to the second intermediate substrate 41 at the pitch H from each other are made to adhere (joined) via the adhesive material layer 46 to the depressed portions 12 formed at the pitch H in the final substrate 10.

<Laser Irradiation Step (S52)>

After that, as shown in (b) of FIG. 29, the adhesive material layer 42 between the second intermediate substrate 41 and the final substrate 10 is heat-treated by irradiating the back surface of the intermediate substrate 41 (i.e., the surface opposite to the transfer surfaces (holding surfaces) of the CMOS transistors 70) with laser light or the like, so that the adhesive force of the adhesive material layer 42 is decreased. Alternatively, the adhesive force of the adhesive material layer 42 (thermally removable sheet) may be decreased by carrying out heat treatment with an oven, a hot plate, a heat-treatment furnace, or the like with the second intermediate substrate 41 and the final substrate 10 bonded together.

In the case of selective irradiation with laser light, the semiconductor elements (CMOS transistors 70 in the present embodiment) selectively transferred to the second intermediate substrate 41 in S46 can be further selectively transferred to the final substrate 10 in a narrow-down manner. That is, the dispersion pitch between the semiconductor elements can be further increased.

Meanwhile, in the case of full irradiation with laser light or in the case of full heat treatment with an oven, a hot plate, a heat-treatment furnace, or the like, the semiconductor elements selectively transferred to the second intermediate substrate 41 in S46 can be transferred to the final substrate 10 at the same pitch.

<Step of Separating the Intermediate Substrate and the Final Substrate from Each Other (S53)>

Next, as shown in (c) of FIG. 29, the second intermediate substrate 41 and the final substrate 10 are vertically pulled away from each other. This causes the CMOS transistors 70 to be removed from the adhesive material layer 42 whose adhesive force has been decreased, so that the CMOS transistors 70 can be transferred from the second intermediate substrate 41 to the final substrate 10.

Further, in a case where such a final substrate 10 to which the CMOS transistors 70 have been transferred is used as an active-matrix substrate or in a driving device or the like of a display device such as a liquid crystal display device, for example, the step of turning the final substrate 10 into a panel needs only be carried on by further forming an insulating film 91 such as an interlayer insulating film, electrodes 92 that are used for connection with various wires, and the like.

<<Configuration of a Semiconductor Apparatus>>

According to the present embodiment, the manufacturing method makes it possible to obtain a semiconductor apparatus in which the depressed portions 12 have been formed in the final substrate 10 composed of an insulating substrate such as a glass substrate and the CMOS transistors 70, which are semiconductor devices, have been joined into the depressed portions 12 via the adhesive material layer 46.

Figure 30:
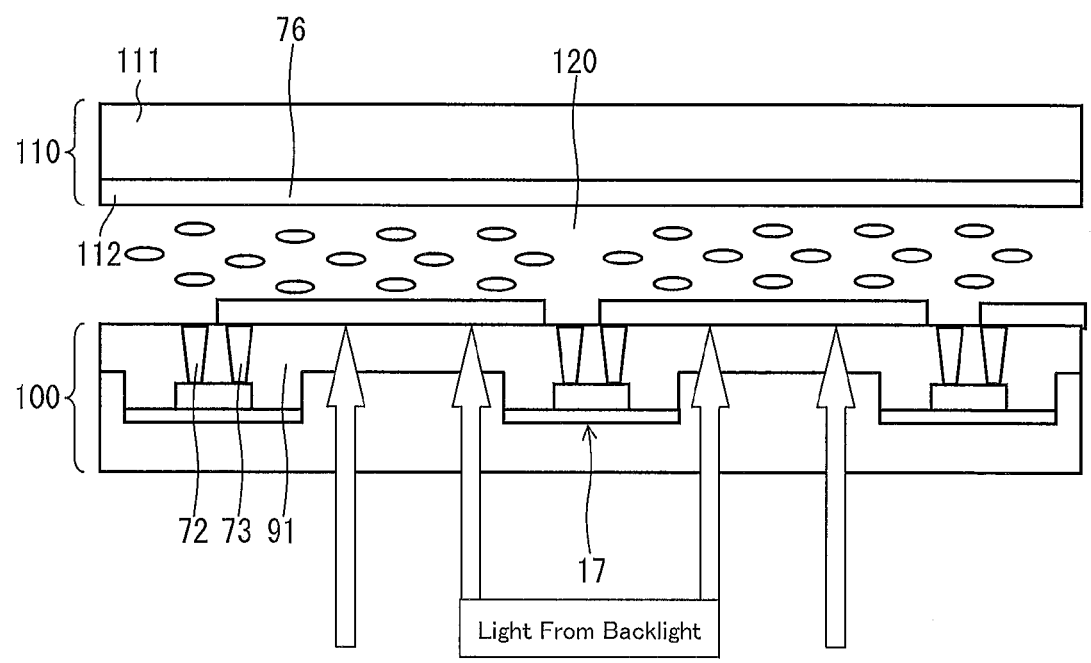
FIG. 30

Further, FIG. 30 is a cross-sectional view schematically showing a configuration of a liquid crystal panel using the final substrate 10 according to the present embodiment. In FIG. 30, only one MOS transistor of the CMOS transistors 70 is shown as a TFT element 17.

As shown in FIG. 30, according to the present embodiment, the height of each of the raised portions 13 on the final substrate 10 and the height of the back surface of each of the CMOS transistors 70 transferred into the depressed portions 12 can be uniformed, so that a flat TFT-side substrate free of bumps can be obtained. Therefore, there does not occur a prominence of the thermoplastic resin film due to the burial of semiconductor elements as would occur when the technique described in Patent Literature 3 shown in (b) of FIG. 7 is used. This makes it possible to obtain a liquid crystal panel which hardly suffers from a disturbance in the alignment of liquid crystals due to bumps or irregularities, which is free from light leakage, which has high contrast, and which is therefore high in display quality.

Further, the present embodiment makes it possible to form a liquid crystal panel that is thinner than the liquid crystal panel described in (b) of FIG. 16 in Embodiment 1. Therefore, the present embodiment makes it possible to manufacture a liquid crystal panel more suitable to a display device or the like in a portable terminal or the like.

<<Effects>>

As described above, the present embodiment also makes it possible to transfer the semiconductor elements from the semiconductor device substrate 90 to the final substrate 10 with three transfers. Therefore, the present embodiment also makes it possible to reduce the number of transfers as compared with the conventional technique in transferring semiconductor elements using Si single films to a final substrate. Accordingly, the present embodiment also makes it possible to increase throughput and element-bonding accuracy, thus making it possible to improve yield and reduce cost.

Further, in the present embodiment, too, the semiconductor elements are transferred from the semiconductor device substrate 90 to the final substrate 10 with three transfers as mentioned above. Therefore, the semiconductor elements formed on the semiconductor substrate can be transferred to the final substrate 10 in an upside-down state of the state in which the semiconductor elements are formed on the semiconductor substrate.

Moreover, according to the present embodiment, as described above, the selective transfer of the semiconductor elements in transferring the semiconductor elements from the first intermediate substrate to the second intermediate substrate makes it unnecessary to form raised portions that are needed for selectively joining the semiconductor layer to the final substrate without an adhesive material layer and, as described above, makes it possible to provide depressed portions in the final substrate and join the semiconductor elements into the depressed portions. Therefore, the height of each of the raised portions 13 on the final substrate 10 and the height of the back surface of each of the CMOS transistors 70 transferred into the depressed portions 12 can be uniformed, so that a flat TFT-side substrate can be obtained without any bump. This makes it possible to obtain a liquid crystal panel which hardly suffers from a disturbance in the alignment of liquid crystals due to bumps or irregularities, which is free from light leakage, which has high contrast, and which is therefore high in display quality. Alternatively, it is possible to use a flat final substrate instead of providing raised portions on or depressed portions in the final substrate. This makes it possible to increase the degree of freedom of selection of the final substrate and the degree of freedom of wiring layout or the like.

Further, according to the present embodiment, as described above, the selective transfer of the semiconductor elements can be carried out twice. Therefore, the pitch at which the semiconductor elements are dispersed can be further increased. This makes it possible to transfer the semiconductor elements from a small semiconductor substrate to a larger final substrate so that the semiconductor elements are dispersedly arranged. Alternatively, this makes it possible to transfer the semiconductor elements from a smaller semiconductor substrate to a large final substrate.

Further, according to the present embodiment, too, by executing a common semiconductor device manufacturing process such as an LCD process as needed after the semiconductor elements have been transferred to the final substrate, a semiconductor apparatus can be manufactured in which semiconductor elements provided with high-performance semiconductor devices have been dispersedly arranged. In particular, the use of the final substrate in a liquid crystal panel makes it possible to obtain a high-quality liquid crystal panel which has no bumps, which is flat, and which has no disturbance in the alignment of liquid crystals.

Further, in the present embodiment, too, by forming transistors, i.e., semiconductor apparatuses in advance on a semiconductor substrate and then transferring the transistors to a final substrate, submicron-level fine transistors can be formed which are hard to manufacture on an insulating substrate.

In each of the embodiments described above, the adhesive material layers 36 and 42 can both be made of the same adhesive material (adhesive) as the adhesive material (adhesive) of which the adhesive material layer 6. It should be noted that a combination (adhesive material to be used) of the adhesive material layers 36 and 42 may be made so that the adhesive strength varies according to the embodiments (roles), e.g., depending on whether a full transfer or a dispersed transfer (selective transfer) is carried out, etc.

[Preferred Embodiments]

As described above, the aforementioned method for transferring semiconductor elements is for example a method including: a depressed portion forming step of forming depressed portions in that surface of a semiconductor substrate on which the semiconductor elements are to be formed, and forming, on the semiconductor substrate, a plurality of island-shaped element sections, separated by the depressed portions, each of which includes at least one of the semiconductor elements; an intermediate transfer substrate bonding step of bonding together that surface of the semiconductor substrate on which the semiconductor elements are to be formed and an intermediate transfer substrate via an adhesive material layer whose adhesive force is decreased by external energy; an element-separating step of, by grinding the semiconductor substrate from a bottom wall side of the depressed portions, separating the element sections from each other, the element sections having been connected together by bottom walls of the depressed portions; a final transfer substrate joining step of joining, to a final transfer substrate, only some of the plurality of element sections adhering to the intermediate transfer substrate; and a final transfer step of, by decreasing the adhesive force of the adhesive material layer by selectively applying external energy to the adhesive material layer between the some of the element sections which have been joined to the final transfer substrate and the intermediate transfer substrate, selectively transferring the some of the element sections from the intermediate transfer substrate to the final transfer substrate.

Further, the aforementioned method for transferring semiconductor elements is for example a method including: a depressed portion forming step of forming depressed portions in that surface of a semiconductor substrate on which the semiconductor elements are to be formed, and forming, on the semiconductor substrate, a plurality of element sections, separated by the depressed portions, each of which includes at least one of the semiconductor elements; a first intermediate transfer substrate bonding step of bonding together that surface of the semiconductor substrate on which the semiconductor elements are to be formed and a first intermediate transfer substrate via an adhesive material layer whose adhesive force is decreased by external energy; an element-separating step of, by grinding the semiconductor substrate from a bottom wall side of the depressed portions, separating the element sections from each other, the element sections having been connected together by bottom walls of the depressed portions; a second intermediate transfer substrate bonding step of bonding the plurality of element sections adhering to the first intermediate transfer substrate to a second intermediate transfer substrate via an adhesive material layer whose adhesive force is decreased by external energy; an intermediate transfer step of, by decreasing the adhesive force of the adhesive material layer by applying external energy to the adhesive material layer between the plurality of element sections and the first intermediate transfer substrate, transferring the plurality of element sections from the first intermediate transfer substrate to the second intermediate transfer substrate; a final transfer substrate joining step of joining, to a final transfer substrate, only some of the plurality of element sections adhering to the second intermediate transfer substrate; and a final transfer step of, by decreasing the adhesive force of the adhesive material layer by selectively applying external energy to the adhesive material layer between the some of the element sections which have been joined to the final transfer substrate and the second intermediate transfer substrate, selectively transferring the some of the element sections from the second intermediate transfer substrate to the final transfer substrate.

Further, in the method for transferring semiconductor elements, it is preferable that: the final transfer substrate have a joining surface to the element sections, the joining surface having island patterns separated by depressed portions and formed to face only the some of the element sections; and in the final transfer substrate joining step, only the some of the element sections which are in contact with the island patterns formed on the final transfer substrate be joined to the final transfer substrate.

According to the foregoing method, the positioning of the element sections with respect to the final transfer substrate can be easily done, and only the some of the element sections which are in contact with the island patterns formed on the final transfer substrate can be selectively joined to the final transfer substrate. Therefore, according to the foregoing method, only the semiconductor elements that need to be transferred to the final transfer substrate can be easily transferred to the final transfer substrate, and can be easily transferred at a desired pitch.

Further, it is preferable that the island patterns be arranged at a pitch that is an integral multiple of a pitch between the element sections formed on the semiconductor substrate.

According to the foregoing method, some of the plurality of element sections formed on the semiconductor substrate can be selectively transferred.

Further, since the island patterns are arranged at a pitch that is an integral multiple of a pitch between the element sections formed on the semiconductor substrate, even in a case where there is a change in the pitch between the island patterns (e.g., even in a case where the pitch changes from being twice as great to being four times as great), it is only necessary to change only the pitch (layout of the final transfer substrate) between the island patterns while keeping intact the pitch (layout) between the element sections to be formed on the semiconductor substrate. Thus, the targets to be transferred can be efficiently arranged dispersedly in correspondence with the positions on the final transfer substrate to which they are transferred.

Further, in a case where the pitch between the island patterns corresponds to the pixel pitch, the final transfer substrate can be easily manufactured on which semiconductor elements have been formed at the pixel pitch.

Further, the aforementioned method for transferring semiconductor elements is for example a method including: a depressed portion forming step of forming depressed portions in that surface of a semiconductor substrate on which the semiconductor elements are to be formed, and forming, on the semiconductor substrate, a plurality of element sections, separated by the depressed portions, each of which includes at least one of the semiconductor elements; a first intermediate transfer substrate bonding step of bonding together that surface of the semiconductor substrate on which the semiconductor elements are to be formed and a first intermediate transfer substrate via an adhesive material layer whose adhesive force is decreased by external energy; an element-separating step of, by grinding the semiconductor substrate from a bottom wall side of the depressed portions, separating the element sections from each other, the element sections having been connected together by bottom walls of the depressed portions; a second intermediate transfer substrate bonding step of bonding only some of the plurality of element sections adhering to the first intermediate transfer substrate to a second intermediate transfer substrate via an adhesive material layer whose adhesive force is decreased by external energy; an intermediate transfer step of, by decreasing the adhesive force of the adhesive material layer by selectively applying external energy to the adhesive material layer between the some of the element sections and the first intermediate transfer substrate, selectively transferring the some of the element sections from the first intermediate transfer substrate to the second intermediate transfer substrate; a final transfer substrate joining step of joining, to a final transfer substrate, the some of the element sections adhering to the second intermediate transfer substrate; and a final transfer step of, by decreasing the adhesive force of the adhesive material layer by applying external energy to the adhesive material layer between the some of the element sections which have been joined to the final transfer substrate and the second intermediate transfer substrate, transferring the some of the element sections from the second intermediate transfer substrate to the final transfer substrate.

Further, it is preferable that: the final transfer substrate have a joining surface to the element sections, the joining surface having depressed portions formed to face only the some of the element sections; and in the final transfer substrate joining step, only the some of the element sections which are adhering to the second intermediate transfer substrate be joined to the depressed portions formed in the final transfer substrate.

According to the foregoing method, the positioning of the element sections with respect to the final transfer substrate can be easily done, and a smoother transition between the junction of the element sections on the final transfer substrate and the surrounding region can be made.

Thus, the final transfer substrate is free of bumps and therefore flat. Therefore, use of the final transfer substrate in a liquid crystal panel makes it possible to obtain a liquid crystal panel which is free from a disturbance in the alignment of liquid crystals and which is high in contrast and display quality with little light leakage.

Further, use of the foregoing method makes it possible to manufacture a thinner semiconductor apparatus. For this reason, a display panel more suitable to a display device or the like for example in a portable terminal or the like can be manufactured.

Further, it is preferable that: the second intermediate transfer substrate have a joining surface to the element sections, the joining surface having island patterns separated by depressed portions and formed to face only the some of the element sections; and in the second intermediate transfer substrate bonding step, only the some of the element sections which are in contact with the island patterns be joined to the second intermediate transfer substrate.

According to the foregoing method, only the some of the element sections which are in contact with the island patterns formed on the second intermediate substrate can be selectively joined to the second intermediate transfer substrate. Therefore, according to the foregoing method, only the semiconductor elements that need to be finally transferred to the final transfer substrate can be transferred to the second intermediate substrate. Therefore, only the semiconductor elements that need to be finally transferred to the final transfer substrate can be easily transferred to the final transfer substrate at a desired pitch.

Further, in this case, too, it is preferable that the island patterns be arranged at a pitch that is an integral multiple of a pitch between the element sections formed on the semiconductor substrate. This makes it possible to bring about the aforementioned effects.

Further, it is preferable that in the final transfer substrate joining step, the some of the element sections and the final transfer substrate are joined via a covalent bond by carrying out hydrophilic treatment on the some of the element sections and the surface of the final transfer substrate, joining the some of the element sections and the surface of the final transfer substrate to each other, and then carrying out preannealing.

The some of the element sections and the final transfer substrate, whose surfaces have been hydrophilically treated, spontaneously join each other with van der Waals' force by bringing them into contact with each other and pressing them with a slight force. Moreover, by carrying out preannealing after that, the dehydration reaction proceeds and a covalent bond is formed. This makes it possible to tightly join the some of the element sections and the final transfer substrate by covalent bonding without an adhesive.

Further, because of the junction being made by covalent bonding, the foregoing method hardly suffers from displacements. Further, since no adhesive is used for adhesion between the some of the element sections and the final transfer substrate, resistance to high temperatures is achieved, so that high-temperature processing can be done.

The hydrophilic treatment can be carried out by using at least one of argon plasma, atmospheric pressure plasma, ozone aqueous cleaning, and SC1 cleaning.

Thus, the some of the element sections and the final transfer substrate can be hydrophilically surface-treated, and the some of the element sections and the final transfer substrate can be made to join each other with van der Waals' force.

Further, it is preferable that in the final transfer substrate joining step, the some of the element sections and the final transfer substrate be joined via an adhesive material layer provided in correspondence to the some of the element sections.

According to the foregoing method, the adhesive material layer is provided in correspondence to the some of the element sections. Therefore, in the final transfer substrate joining step, the some of the element sections which are in contact with the adhesive material layer can be selectively joined to the final transfer substrate. Therefore, according to the foregoing method, only the semiconductor elements that need to be transferred to the final transfer substrate can be easily transferred to the final transfer substrate, and can be easily transferred at a desired pitch.

An example of the semiconductor element included in each of the element sections is a semiconductor thin film or at least part of a semiconductor device including a semiconductor thin film.

Further, an example of the semiconductor apparatus is at least one selected from the group consisting of a light-emitting element, a liquid crystal control element, a photoelectric conversion element, a piezoelectric element, a thin-film transistor element, a thin-film diode element, a resistor element, a switching element, a micro-magnetic element, and a micro-optical element.

More specifically, however, the semiconductor substrate is composed of a single-crystal silicon substrate, and the semiconductor element included in each of the element sections is a single-crystal silicon thin film or at least part of a semiconductor device including a single-crystal silicon thin film.

Alternatively, for example, the semiconductor substrate is composed of an SOI substrate; and the semiconductor element included in each of the element sections is a single-crystal silicon thin film and a silicon oxidized film constituting the SOI substrate or at least part of a semiconductor device including the single-crystal silicon thin film and the silicon oxidized film.

Conventionally, in a case where semiconductor elements are transferred without turning them into chips, semiconductor elements such as single-crystal silicon thin films or semiconductor devices made of single-crystal silicon fabricated into a single-crystal silicon substrate cannot be transferred, as in the cases of Patent Literatures 4 to 8, or four transfers have been required for transferring semiconductor elements fabricated into a semiconductor substrate, as in the case of Patent Literature 3.

However, according the aforementioned method, as described above, semiconductor elements such as single-crystal silicon thin films or semiconductor devices made of single-crystal silicon fabricated into a single-crystal silicon substrate can be transferred to the final transfer substrate with two or three transfers as described above.

Further, the semiconductor substrate may be composed of a GaAs substrate, a GaN substrate, or a substrate obtained by forming a GaAs film or a GaN film on a sapphire substrate, and the semiconductor element included in each of the element sections may be a single-crystal film constituting the semiconductor substrate or at least part of a semiconductor device including the single-crystal film.

According to the foregoing method, light-emitting elements such as light-emitting diodes can be dispersedly arranged.

The final transfer substrate may be composed of an insulating substrate.

Further, the final transfer substrate may be a type of flexible substrate selected from the group consisting of a film bonded to a support substrate, a plastic substrate, a glass substrate coated with resin, and an SUS substrate.

According to the foregoing method, by transferring the element sections onto various final transfer substrates, such as those described above, which correspond semiconductor apparatuses, various semiconductor apparatuses having such final transfer substrates as mounting substrates can be manufactured.

Further, it is preferable that with respect to the area of a bonding surface of each of the element sections, the area of the adhesive material layer whose adhesive force is decreased by the external energy be at least 80%.

The foregoing configuration can give sufficient adhesion to prevent the element sections from being removed and falling off before the transfer. In particular, according to the foregoing method, in a case where some of the projections are subjected to cleaning or the like by surface treatment before they are joined to the final transfer substrate, the element sections can be prevented from being removed and falling off due to the cleaning or the like. This makes it possible to suppress a decrease in yield.

Further, it is preferable that the adhesive material layer via which the element sections and the first intermediate transfer substrate are bonded and the adhesive material layer via which the element sections and the second intermediate transfer substrate are bonded be adhesive material layers whose adhesive forces are decreased by different means.

According to the foregoing method, the adhesive material layer via which the element sections and the first intermediate transfer substrate are bonded and the adhesive material layer via which the element sections and the second intermediate transfer substrate are bonded are different. Therefore, in the intermediate transfer step, the adhesive material layer via which the element sections and the first intermediate transfer substrate are bonded can be removed without decreasing the adhesive force of the adhesive material layer via which the element sections and the second intermediate transfer substrate are bonded. Thus, the element sections can be stably transferred from the first intermediate transfer substrate to the second intermediate transfer substrate.

Further, it is preferable that the external energy be light energy or heat energy. That is, it is preferable each of the adhesive material layers used be an adhesive material layer whose adhesive force is decreased by irradiation with light such as ultraviolet radiation or by heat treatment. Such an adhesive material is easily available, and in a case where light energy or heat energy is used as the external energy, the external energy has the advantage of being easily controlled and not requiring expensive facilities or the like.

Further, the aforementioned method for transferring semiconductor elements is for example a method including: a depressed portion forming step of forming depressed portions in that surface of a first substrate on which the semiconductor elements are to be formed, and forming, on the first substrate, a plurality of island-shaped element sections, separated by the depressed portions, each of which includes at least one of the semiconductor elements, the first substrate being a semiconductor substrate; a substrate bonding step of bonding together that surface of the first substrate on which the semiconductor elements are to be formed and a second substrate; and an element-separating step of, by grinding the first substrate from a bottom wall side of the depressed portions, separating the element sections from each other, the element sections having been connected together by bottom walls of the depressed portions.

Further, in the aforementioned method for manufacturing the semiconductor, a semiconductor apparatus is manufactured by using any one of the aforementioned methods for transferring semiconductor elements.

Further, the aforementioned semiconductor apparatus is for example configured to include: an insulating substrate; depressed portions; and island patterns formed on the insulating substrate and separated by the depressed portions, the island patterns each having a semiconductor device or a single-crystal silicon thin film joined thereonto by chemical bonding, the semiconductor device including a single-crystal silicon thin film.

Further, the aforementioned semiconductor apparatus is for example configured to include: an insulating substrate; and depressed portions formed in the insulating substrate, the depressed portions each having a semiconductor device or a single-crystal silicon thin film joined thereto by chemical bonding, the semiconductor device including a single-crystal silicon thin film.

The present invention is not limited to the description of the embodiments above, but may be altered by a skilled person within the scope of the claims. An embodiment based on a proper combination of technical means disclosed in different embodiments is encompassed in the technical scope of the present invention.

Industrial Applicability

The present invention can be suitably applied to a transfer method for transferring a semiconductor element such as single-crystal silicon from a semiconductor substrate onto a final substrate on which the semiconductor element is finally mounted and to a method for manufacturing a semiconductor apparatus by using such a transfer method.

Reference Signs List

1 Si substrate (semiconductor substrate, first substrate)
1a Single-film pattern (element section)
4 Depressed portion
5 Intermediate substrate (first intermediate transfer substrate, second substrate)
6 Adhesive material layer
8 Si single film (semiconductor element, single-crystal silicon thin film)
9 Oxidized film
10 Final substrate
12 Depressed portion
13 Raised portion (island pattern)
14 Adhesive material layer
17 TFT element (semiconductor element)
21 Si substrate
22 BOX layer
23 Si film
24 SOI substrate (semiconductor substrate, first substrate)
24a Element pattern (element section)
25 Depressed portion
26 Semiconductor element
31 Si substrate
32 Thermally oxidized film
33 Si substrate with oxidized film (semiconductor substrate, first substrate)
33a Element pattern (element section)
34 Depressed portion
35 First intermediate substrate (second substrate)
36 Adhesive material layer
37 Semiconductor element
41 Second intermediate substrate
42 Adhesive material layer
44 Depressed portion
45 Raised portion
46 Adhesive material layer
70 CMOS transistor (semiconductor element)
90 Semiconductor device substrate (semiconductor substrate, first substrate)
100 TFT substrate
H Pitch
h Pitch

The invention claimed is:

1. A method for transferring semiconductor elements, comprising:
   a depressed portion forming step of forming depressed portions in a surface of a semiconductor substrate on which semiconductor elements are to be formed, and forming, on the semiconductor substrate, a plurality of island-shaped element sections which are integrally provided together with the semiconductor substrate as a single monolithic member and which are separated by the depressed portions, each of the plurality of island-shaped element sections includes at least one of the semiconductor elements;
   an intermediate transfer substrate bonding step of bonding together the surface of the semiconductor substrate on which the semiconductor elements are to be formed and an intermediate transfer substrate via an adhesive material layer whose adhesive force is capable of being decreased by external energy;
   an element-separating step of, by grinding the semiconductor substrate from a bottom wall side of the depressed portions, causing the element sections, which were connected together by bottom walls of the depressed portions, to be separated from each other;
   a final transfer substrate joining step of joining, to a final transfer substrate, only some of the plurality of element sections adhering to the intermediate transfer substrate; and
   a final transfer step of, by decreasing the adhesive force of the adhesive material layer by locally applying external energy to the adhesive material layer between said some of the element sections which have been joined to the final transfer substrate and the intermediate transfer substrate, selectively transferring said some of the element sections from the intermediate transfer substrate to the final transfer substrate; wherein
   the final transfer substrate joining step joins the final transfer substrate with the only some of the plurality of element sections adhering to the intermediate transfer substrate without the use of any adhesive material.

2. The method as set forth in claim 1, wherein:
   the final transfer substrate includes a joining surface of the element sections, the joining surface including island patterns integrally provided with the final transfer substrate as a single monolithic member and separated by depressed portions and formed to face only said some of the element sections; and
   in the final transfer substrate joining step, only said some of the element sections which are in contact with the island patterns formed on the final transfer substrate are joined to the final transfer substrate.

3. The method as set forth in claim 2, wherein the island patterns are arranged at a pitch that is an integral multiple of a pitch between the element sections formed on the semiconductor substrate.

4. The method as set forth in claim 1, wherein in the final transfer substrate joining step, said some of the element sections and the final transfer substrate are joined via a covalent bond by carrying out hydrophilic treatment on said some of the element sections and the surface of the final transfer substrate, joining said some of the element sections and the surface of the final transfer substrate to each other, and then carrying out preannealing.

5. The method as set forth in claim 4, wherein the hydrophilic treatment is carried out by using at least one of argon plasma, atmospheric pressure plasma, ozone aqueous cleaning, and SC1 cleaning.

6. The method as set forth in claim 1, wherein in the final transfer substrate joining step, said some of the element sections and the final transfer substrate are joined via an adhesive material layer provided in correspondence to said some of the element sections.

7. The method as set forth in claim 1, the semiconductor element included in each of the element sections is a semiconductor thin film or at least a portion of a semiconductor device including a semiconductor thin film.

8. The method as set forth in claim 7, wherein the semiconductor device is at least one selected from the group consisting of a light-emitting element, a liquid crystal control element, a photoelectric conversion element, a piezoelectric element, a thin-film transistor element, a thin-film diode element, a resistor element, a switching element, a micro-magnetic element, and a micro-optical element.

9. The method as set forth in claim 1, wherein:
the semiconductor substrate is a single-crystal silicon substrate; and
the semiconductor element included in each of the element sections is a single-crystal silicon thin film or at least a portion of a semiconductor device including a single-crystal silicon thin film.

10. The method as set forth in claim 1, wherein:
the semiconductor substrate is an SOl substrate; and
the semiconductor element included in each of the element sections is a single-crystal silicon thin film and a silicon oxidized film defining the SOl substrate or at least a portion of a semiconductor device including the single-crystal silicon thin film and the silicon oxidized film.

11. The method as set forth in claim 1, wherein:
the semiconductor substrate is a GaAs substrate, a GaN substrate, or a substrate obtained by forming a GaAs film or a GaN film on a sapphire substrate; and
the semiconductor element included in each of the element sections is a single-crystal film defining the semiconductor substrate or at least a portion of a semiconductor device including the single-crystal film.

12. The method as set forth in claim 1, wherein the final transfer substrate is an insulating substrate.

13. The method as set forth in claim 1, wherein the final transfer substrate is a flexible substrate selected from the group consisting of a film bonded to a support substrate, a plastic substrate, a glass substrate coated with resin, and an SUS substrate.

14. The method as set forth in claim 1, wherein with respect to the area of a bonding surface of each of the element sections, the area of the adhesive material layer whose adhesive force is decreased by the external energy is at least 80%.

15. The method as set forth in claim 1, wherein the external energy is light energy or heat energy.

16. A method for manufacturing a semiconductor apparatus by using a method for transferring semiconductor elements as set forth in claim 1.

17. The method as set forth in claim 1, further comprising a step of forming oxidized films on surfaces of the element sections which is performed between the element-separating step and the final transfer substrate joining step.

18. The method as set forth in claim 1, wherein the some of the plurality of element sections are joined to the final transfer substrate by covalent bonding.

* * * * *